(12) United States Patent
Iwai et al.

(10) Patent No.: US 9,067,400 B2
(45) Date of Patent: *Jun. 30, 2015

(54) LITHOGRAPHIC PRINTING PLATE PRECURSOR AND METHOD OF PREPARING LITHOGRAPHIC PRINTING PLATE

(71) Applicant: FUJIFILM Corporation, Minato-Ku, Tokyo (JP)

(72) Inventors: Yu Iwai, Shizuoka (JP); Junya Abe, Shizuoka (JP); Yuriko Ishiguro, Shizuoka (JP); Hidekazu Oohashi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/024,010

(22) Filed: Sep. 11, 2013

(65) Prior Publication Data

US 2014/0011138 A1 Jan. 9, 2014

Related U.S. Application Data

(63) Continuation of application No. 12/715,605, filed on Mar. 2, 2010.

(30) Foreign Application Priority Data

Mar. 2, 2009 (JP) ................................. 2009-048532

(51) Int. Cl.
*G03F 7/00* (2006.01)
*G03F 7/26* (2006.01)
(Continued)

(52) U.S. Cl.
CPC ... *B41C 1/10* (2013.01); *G03F 7/09* (2013.01); *G03F 7/11* (2013.01)

(58) Field of Classification Search
CPC .... B41C 1/10; B41C 1/1016; B41C 2201/04; G03F 7/09; G03F 7/111; G03F 7/3035
USPC ............ 430/270.1–300, 302; 101/450.1, 453, 101/463.1
See application file for complete search history.

(56) References Cited

U.S. PATENT DOCUMENTS

| | | |
|---|---|---|
| 2005/0074692 A1 | 4/2005 | Makino et al. |
| 2005/0266349 A1 | 12/2005 | Van Damme et al. |

(Continued)

FOREIGN PATENT DOCUMENTS

| | | |
|---|---|---|
| EP | 1 520 694 A | 4/2005 |
| EP | 1520694 A2 * | 4/2005 |

(Continued)

OTHER PUBLICATIONS

Extended European Search Report dated Jul. 1, 2010, issued in counterpart European Application No. 10155165.3-2222.

(Continued)

*Primary Examiner* — Chanceity Robinson
(74) *Attorney, Agent, or Firm* — Sughrue Mion, PLLC

(57) ABSTRACT

A lithographic printing plate precursor includes a support and one or more layers, one of the one or more layers is a photosensitive layer containing an initiator compound, a polymerizable compound and a binder polymer, and a layer being in contact with the support of the one or more layers contains a copolymer containing a repeating unit having a zwitterionic structure and a repeating unit having a structure capable of interacting with a surface of the support.

10 Claims, 1 Drawing Sheet

(51) Int. Cl.
   *B41C 1/10*   (2006.01)
   *G03F 7/09*   (2006.01)
   *G03F 7/11*   (2006.01)

(56) References Cited

U.S. PATENT DOCUMENTS

2008/0318155 A1* 12/2008 Suzuki et al. .............. 430/270.1
2010/0316850 A1* 12/2010 Tao et al. ................... 428/195.1

FOREIGN PATENT DOCUMENTS

| EP | 1 751 625 A | 2/2007 |
| EP | 1 868 036 A1 | 12/2007 |
| JP | 1090886 A | 4/1998 |
| JP | 2001175006 A | 6/2001 |
| JP | 2005-125749 A | 5/2005 |
| JP | 2006-239860 A | 9/2006 |
| JP | 2007-316445 A | 12/2007 |
| JP | 2008185729 A | 8/2008 |
| JP | 2008-213177 A | 9/2008 |
| JP | 2008213177 A * | 9/2008 |

OTHER PUBLICATIONS

Office Action dated Sep. 3, 2013 issued by the Japanese Patent Office in counterpart Japanese Application No. 2010043129.

* cited by examiner

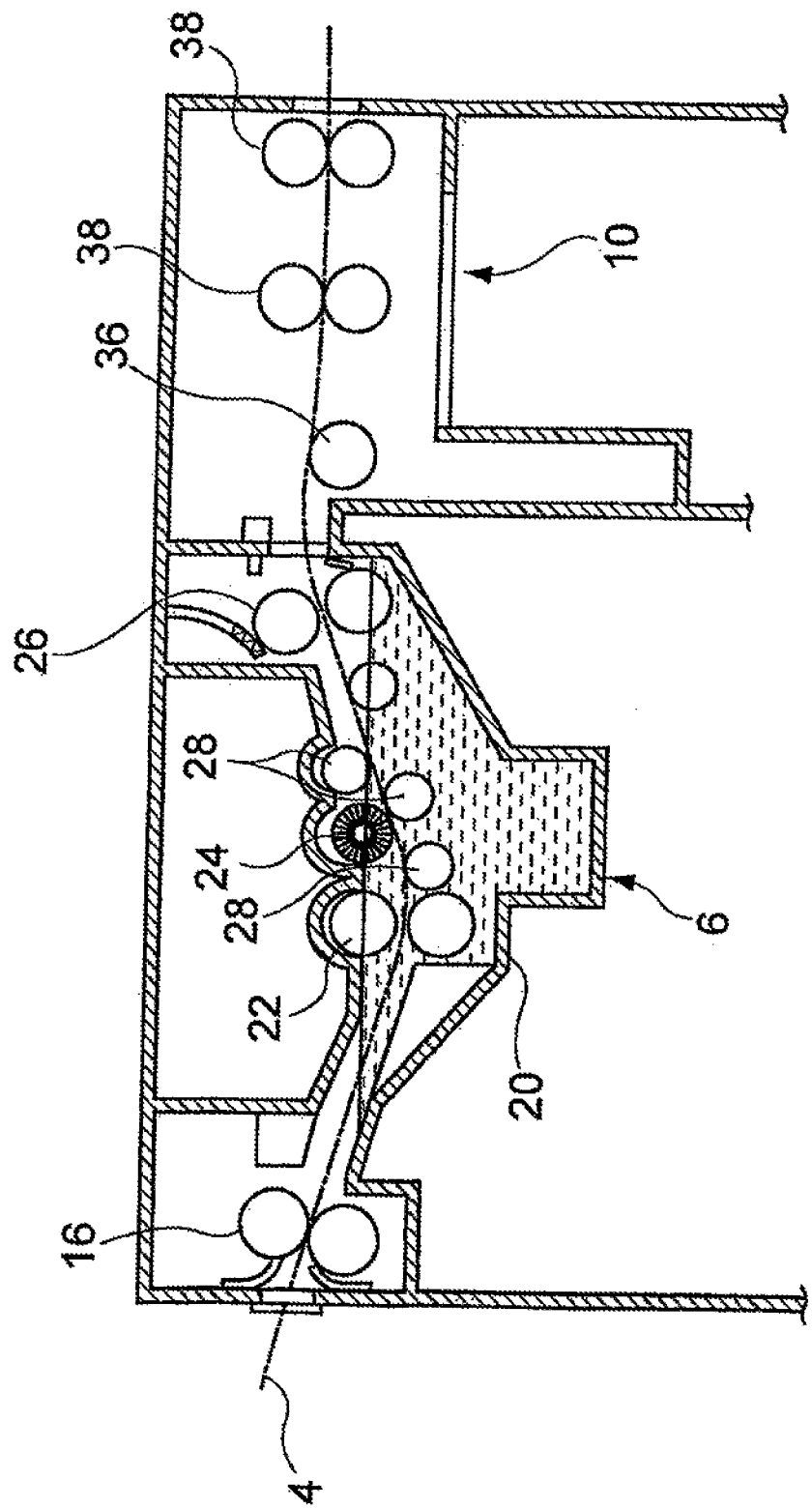

LITHOGRAPHIC PRINTING PLATE PRECURSOR AND METHOD OF PREPARING LITHOGRAPHIC PRINTING PLATE

This is a Continuation Application of U.S. application Ser. No. 12/715,605 filed Mar. 2, 2010, which claims priority under 35 U.S.C. §119 from Japanese Application No. 2009-048532 filed Mar. 2, 2009, the disclosures of which are incorporated herein by reference.

FIELD OF THE INVENTION

The present invention relates to a lithographic printing plate precursor and a method of preparing a lithographic printing plate, particularly, to a lithographic printing plate precursor suitable for simple processing and a method of preparing a lithographic printing plate using the same.

BACKGROUND OF THE INVENTION

With respect to hitherto known lithographic printing plate precursors (hereinafter, also referred to as PS plates), since a step of removing the non-image area by dissolution (development processing) with strong alkali after imagewise exposure is performed, a post-processing step, for example, washing of the printing plate after the development processing with water, treatment of the printing plate after the development processing with a rinse solution containing a surfactant or treatment of the printing plate after the development processing with an oil-desensitizing solution containing gum arabic or a starch derivative, is necessary. The point that such additional wet treatments are indispensable is a large subject of investigation in hitherto known PS plates. Particularly, the consideration for global environment has become a great concern throughout the field of industry in recent years. In view of the consideration for global environment, a treatment with a developer closer to a neutral range and a reduced amount of waste liquid are subjects of further investigations. Further, it is desirable that the wet type post-processing is simplified.

From this viewpoint, as one method for eliminating the processing step, a method referred to as on-press development wherein an exposed lithographic printing plate precursor is mounted on a cylinder of a printing machine and the non-image area of the lithographic printing plate precursor is removed by supplying dampening water and ink while rotating the cylinder is known. Specifically, according to the method, the lithographic printing plate precursor is exposed and mounted on a printing machine as it is to complete development processing in a conventional process of printing (see, for example, JP-A-2005-125749 (the term "JP-A" as used herein means an "unexamined published Japanese patent application")). Also, a method is known wherein development is performed using a developer having a pH range lower than a developer used in hitherto known alkali development and after the development step, a post-water washing step and an oil-desensitizing treatment step (gum solution treatment step) are not conducted (see, for example, EP-A-1751625 and EP-A-1868036).

In such a lithographic printing plate precursor of a simple processing type, a support having a surface of high hydrophilicity is used in order to make possible development with a developer having pH lower than a hitherto known developer or dampening water (ordinarily nearly neutral) on a printing machine and as a result, the image area is apt to be removed from the support by dampening water during printing so that sufficient printing durability can not be obtained. On the contrary, when the surface of support renders hydrophobic, ink also adheres on the non-image area during printing to cause printing stain. Thus, it is extremely difficult to achieve a good compatibility between the printing durability and the stain resistance and further improvements are desired.

In view of the above problems, in JP-A-2006-239860, a lithographic printing plate precursor capable of forming an image without conducting alkali development and comprising a hydrophilic support having thereon a photopolymerizable layer sensitive to laser, wherein a copolymer which contains (a1) a repeating unit having at least one ethylenically unsaturated bond and (a2) a repeating unit having at least one functional group capable of interacting with a surface of the support and which is obtained by addition of isocyanate compound having a carbon-carbon unsaturated bond is contained in the photopolymerizable layer or other layer is proposed and it is described that a lithographic printing plate which is excellent in not only stain resistance but also printing durability is obtained.

Also, in JP-A-2008-213177, a lithographic printing plate precursor comprising a support having thereon a hydrophilic layer composed of a hydrophilic polymer which contains at least one of a reactive group capable of directly chemically bonding with a surface of the support and a reactive group capable of chemically bonding with a surface of the support through a crosslinked structure and a partial structure having a positive charge and a negative charge and which is chemically boned to the surface of the support and an image-forming layer in this order is proposed and it is described that a lithographic printing plate which is excellent in hydrophilicity of the non-image area and its sustention and also excellent in adhesion property between the image area and the support is obtained.

However, with respect to the lithographic printing plate precursor proposed in JP-A-2006-239860, the stain resistance of the lithographic printing plate prepared is insufficient and further a problem arises in that stain occurs when printing is carried out after the passage of time from the preparation of lithographic printing plate, that is, the stain resistance after storage is insufficient.

Also, with respect to the lithographic printing plate precursor proposed in JP-A-2008-213177, sufficient results in both the stain resistance without storage and the stain resistance after storage are not obtained. Further, as for the hydrophilic polymer described in JP-A-2008-213177, there is a restriction in the producing condition, for example, it is necessary to use a nonaqueous solvent at the polymerization reaction in order to introduce the reactive group capable of chemically bonding with a surface of the support through a crosslinked structure into the polymer and environmental load is large.

SUMMARY OF THE INVENTION

Therefore, an object of the present invention is to provide a lithographic printing plate precursor which is capable of conducting direct plate making based on digital data, for example, from a computer, by image-recording using various kinds of lasers, for example, a solid laser or semiconductor laser emitting an ultraviolet ray, visible light or an infrared ray, particularly, a lithographic printing plate precursor which can be developed with an aqueous solution having pH of 11 or less or on a printing machine, is excellent in developing property, has high sensitivity and can provide a lithographic printing plate exhibiting high printing durability and good stain resistance (including stain resistance after storage).

As a result of the intensive investigations, the inventors have found that the above-described object can be achieved by using a lithographic printing plate precursor described below.

Specifically, the present invention includes the following items.

(1) A lithographic printing plate precursor comprising a support and one or more layers, wherein one of the one or more layers is a photosensitive layer containing (A) an initiator compound, (B) a polymerizable compound and (C) a binder polymer, and a layer being in contact with the support of the one or more layers contains (D) a copolymer containing (a1) a repeating unit having a zwitterionic structure and (a2) a repeating unit having a structure capable of interacting with a surface of the support.

(2) The lithographic printing plate precursor as described in (1) above, wherein the photosensitive layer is the layer being in contact with the support.

(3) The lithographic printing plate precursor as described in (1) above, wherein the photosensitive layer is a layer different from the layer being in contact with the support.

(4) The lithographic printing plate precursor as described in any one of (1) to (3) above, wherein the zwitterionic structure is a structure represented by formula (i), (ii) or (iii) shown below:

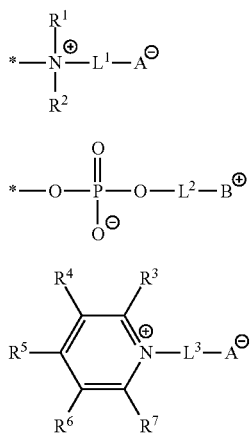

in formulae (i), (ii) and (iii), $R^1$ and $R^2$ each independently represents a hydrogen atom, an alkyl group, an alkenyl group, an alkynyl group, an aryl group or a heterocyclic group, or $R^1$ and $R^2$ may be combined with each other to form a ring structure, $R^3$ to $R^7$ each independently represents a hydrogen atom or a substituent, provided that at least one of $R^3$ to $R^7$ represents a site connecting to a main chain or side chain of the polymer, $L^1$, $L^2$ and $L^3$ each independently represents a connecting group, A represents a structure having an anion, B represents a structure having a cation, and * represents a site connecting to a main chain or side chain of the polymer.

(5) The lithographic printing plate precursor as described in (4) above, wherein in formulae (i), (ii) or (iii) A represents a carboxylate, a sulfonate, a phosphonate or a phosphinate, and B represents an ammonium, a phosphonium, an iodonium or a sulfonium.

(6) The lithographic printing plate precursor as described in any one of (1) to (5) above, wherein the copolymer (D) further contains (a3) a repeating unit having a radical polymerizable reactive group.

(7) The lithographic printing plate precursor as described in any one of (1) to (6) above, wherein the structure capable of interacting with a surface of the support is a carboxylic acid structure, a carboxylate structure, a sulfonic acid structure, a sulfonate structure, a phosphonic acid structure, a phosphonate structure, a phosphoric acid ester structure or a phosphoric acid ester salt structure.

(8) The lithographic printing plate precursor as described in any one of (1) to (7) above, wherein the structure capable of interacting with a surface of the support is a phosphonic acid structure, a phosphonate structure, a phosphoric acid ester structure or a phosphoric acid ester salt structure.

(9) The lithographic printing plate precursor as described in any one of (1) to (8) above, which further comprises a protective layer provided on the side of the photosensitive layer opposite the support.

(10) The lithographic printing plate precursor as described in any one of (1) to (9) above, wherein an unexposed area of the photosensitive layer is capable of being removed with a developer having pH of 2 to 11 after image exposure.

(11) The lithographic printing plate precursor as described in any one of (1) to (9) above, wherein an unexposed area of the photosensitive layer is capable of being removed with at least one of printing ink and dampening water on a printing machine after image exposure.

(12) A method of preparing a lithographic printing plate comprising exposing imagewise the lithographic printing plate precursor as described in any one of (1) to (9) above and then removing an unexposed area of the photosensitive layer with a developer having pH of 2 to 11.

(13) A method of preparing a lithographic printing plate comprising exposing imagewise the lithographic printing plate precursor as described in any one of (1) to (9) above and then removing an unexposed area of the photosensitive layer with at least one of printing ink and dampening water on a printing machine.

The function of the invention is presumed as follows. Specifically, by incorporating a copolymer containing (a1) a repeating unit having a zwitterionic structure and (a2) a repeating unit having a structure capable of interacting with a surface of the support into a layer being in contact with the support, the hydrophilicity of the support is extremely high even after the development and as a result, printing materials excellent in the stain resistance are obtained. In particular, since both the unit (a1) and the unit (a2) have high hydrophilicity, it is believed that the stain resistance is excellent even after storage where the stain resistance is apt to degrade. Moreover, since the unit (a1) having a zwitterionic structure electrostatically interacts with the components of the photosensitive layer, the image area adheres to the support to achieve the excellent printing durability.

According to the present invention, a lithographic printing plate precursor which is capable of conducting a so-called direct plate making, in which the plate making is directly conducted based on digital signals, for example, from a computer using various kinds of lasers and exhibits high productivity, particularly, a lithographic printing plate precursor which can be developed with an aqueous solution having pH of 11 or less or on a printing machine, is excellent in developing property, has high sensitivity and can provide a lithographic printing plate exhibiting high printing durability and good stain resistance (including stain resistance after storage) can be provided.

Also, it is an advantage of the invention that water which is inexpensive and good for the environment can be used as a solvent at the polymerization reaction.

BRIEF DESCRIPTION OF THE DRAWINGS

FIG. 1 is a view schematically showing a configuration of an automatic development processor.

DESCRIPTION OF REFERENCE NUMERALS AND SIGNS

4: Lithographic printing plate precursor
6: Developing unit
10: Drying unit
16: Transport roller
20: Developing tank
22: Transport roller
24: Brush roller
26: Squeeze roller
28: Backup roller
36: Guide roller
38: Skewer roller

DETAILED DESCRIPTION OF THE INVENTION

In the specification, with respect to the description of a group in a compound represented by a formula, when the group is not indicated whether substituted or unsubstituted, unless otherwise indicated specifically, the group includes not only the unsubstituted group but also the substituted group, if the group is able to have a substituent. For example, the description "R represents an alkyl group, an aryl group or a heterocyclic group" in a formula means that "R represents an unsubstituted alkyl group, a substituted alkyl group, an unsubstituted aryl group, a substituted aryl group, an unsubstituted heterocyclic group or a substituted heterocyclic group".

The lithographic printing plate precursor according to the invention will be described in detail below.

The lithographic printing plate precursor for use in the invention is a lithographic printing plate precursor comprising a support having thereon one or more layers, wherein the one or more layers includes a photosensitive layer containing (A) an initiator compound, (B) a polymerizable compound and (C) a binder polymer, and a layer being in contact with the support of the one or more layers contains (D) a copolymer (hereinafter, also referred to as a specific polymer compound) containing (a1) a repeating unit having a zwitterionic structure and (a2) a repeating unit having a structure capable of interacting with a surface of the support.

The components of respective layers are described in more detail below.

<Specific Polymer Compound>

The specific polymer compound for use in the lithographic printing plate precursor according to the invention is a copolymer containing (a1) a repeating unit having a zwitterionic structure and (a2) a repeating unit having a structure capable of interacting with a surface of the support. The specific polymer compound is described in detail below.

First, the repeating unit having a zwitterionic structure is described below. The zwitterionic structure according to the invention is a structure which has at least one cation and at least one anion. Although usually, a number of the cation and a number of the anion are equivalent and the structure is neutral on the whole, in the invention a case where the number of the cation and the number of the anion are not equivalent and a counter ion necessary for compensating the excess charge is present is also included in the zwitterionic structure.

The zwitterionic structure according to the invention is preferably any one of the structures represented by formula (1), (2) and (3) shown below.

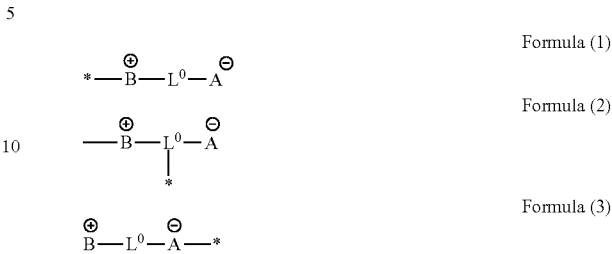

In formulae (1), (2) and (3), A represents a structure having an anion, B represents a structure having a cation, $L^0$ represents a connecting chain, and * represents a site connecting to a main chain or side chain of the polymer.

Preferably, A represents a structure having an anion, for example, a carboxylate, a sulfonate, a phosphonate or a phosphinate, and B represents a structure having a cation, for example, an ammonium, a phosphonium, an iodonium or a sulfonium.

$L^0$ represents a connecting chain and is preferably a connecting group selected from the group consisting of —CO—, —O—, —NH—, a divalent aliphatic group, a divalent aromatic group and a combination thereof. A number of carbon atoms of the connecting group which includes a number of carbon atoms contained in substituents described hereinafter which may be present is preferably 30 or less. Specific examples of the connecting chain include an alkylene group (preferably having from 1 to 20 carbon atoms, more preferably having from 1 to 10 carbon atoms) and an arylene group (preferably having from 5 to 15 carbon atoms, more preferably having from 6 to 10 carbon atoms), for example, a phenylene group or a xylylene group. Form the standpoint of stain resistance, $L^0$ is preferably a straight-chain alkylene group having from 3 to 5 carbon atoms, more preferably a straight-chain alkylene group having 4 to 5 carbon atoms, and most preferably a straight-chain alkylene group having 4 carbon atoms.

Specific examples of $L^0$ include the connecting groups set forth below.

—CH$_2$—  —CH$_2$CH$_2$—  —CH$_2$CH$_2$CH$_2$—

—CH$_2$CH$_2$CH$_2$CH$_2$—  —CH$_2$CH$_2$CH$_2$CH$_2$CH$_2$—

—CH$_2$CH$_2$CH$_2$CH$_2$CH$_2$CH$_2$—

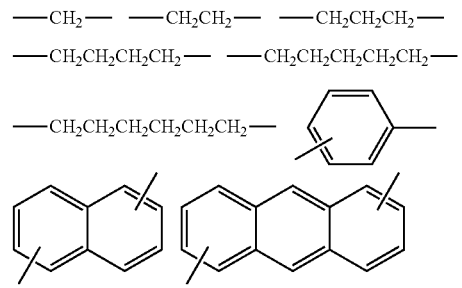

The connecting group may have a substituent or the like.

Examples of the substituent include a halogen atom (e.g., F, Cl, Br or I), a hydroxy group, a carboxyl group, an amino group, a cyano group, an aryl group, an alkoxy group, an aryloxy group, an acyl group, an alkoxycarbonyl group, an aryloxycarbonyl group, an acyloxy group, a monoalkylamino group, a dialkylamino group, a monoarylamino group and a diarylamino group.

Form the standpoint of stain resistance, the zwitterionic structure is preferably a structure represented by formula (1), and more preferably a structure represented by formula (1) wherein A represents a sulfonate.

The zwitterionic structure is preferably a structure represented by formula (i), (ii) or (iii) shown below. From the standpoint of printing durability, the zwitterionic structure is more preferably a structure represented by formula (i).

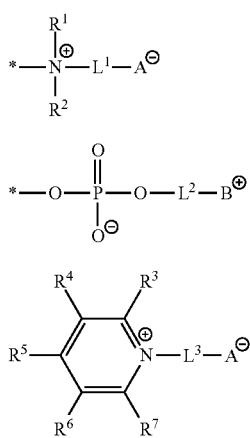

In formulae (i), (ii) and (iii), $R^1$ and $R^2$ each independently represents a hydrogen atom, an alkyl group, an alkenyl group, an alkynyl group, an aryl group or a heterocyclic group, or $R^1$ and $R^2$ may be combined with each other to form a ring structure.

$R^3$ to $R^7$ each independently represents a hydrogen atom or a substituent (preferably having from 1 to 30 carbon atoms), provided that at least one of $R^3$ to $R^7$ represents a site connecting to a main chain or side chain of the polymer. The site connecting to a main chain or side chain of the polymer represented by any one of $R^3$ to $R^7$ may be connected to the main chain or side chain of the polymer through the substituent represented by any one of $R^3$ to $R^7$ or directly by a single bond.

$L^1$, $L^2$ and $L^3$ each independently represents a connecting group.

A represents a structure having an anion (for example, a carboxylate, a sulfonate, a phosphonate or a phosphinate), and B represents a structure having a cation (for example, an ammonium, a phosphonium, an iodonium or a sulfonium).

\* represents a site connecting to a main chain or side chain of the polymer.

In formula (i), $R^1$ and $R^2$ each independently represents a hydrogen atom, an alkyl group, an alkenyl group, an alkynyl group, an aryl group or a heterocyclic group, or $R^1$ and $R^2$ may be combined with each other to form a ring structure. The ring structure may contain a hetero atom, for example, an oxygen atom and is preferably a 5-membered to 10-membered ring and more preferably a 5-membered or 6-membered ring. A number of carbon atoms of the group represented by $R^1$ or $R^2$ which includes a number of carbon atoms contained in substituents described hereinafter which may be present is preferably from 1 to 30, more preferably from 1 to 20, particularly preferably from 1 to 15, and most preferably from 1 to 8.

Examples of the alkyl group include a methyl group, an ethyl group, a propyl group, an octyl group, an isopropyl group, a tert-butyl group, an isopentyl group, a 2-ethylhexyl group, a 2-methylhexyl group and a cyclopentyl group.

Examples of the alkenyl group include a vinyl group, an allyl group, a prenyl group, geranyl group and an oleyl group.

Examples of the alkynyl group include an ethynyl group, a propargyl group and a trimethylsilylethynyl group.

Examples of the aryl group include a phenyl group, a 1-naphtyl group and a 2-naphtyl group.

Examples of the heterocyclic group include a furanyl group, a thiophenyl group and a pyridinyl group.

These groups may have a substituent. Examples of the substituent include a halogen atom (e.g., F, Cl, Br or I), a hydroxy group, a carboxyl group, an amino group, a cyano group, an aryl group, an alkoxy group, an aryloxy group, an acyl group, an alkoxycarbonyl group, an aryloxycarbonyl group, an acyloxy group, a monoalkylamino group, a dialkylamino group, a monoarylamino group and a diarylamino group.

$R^1$ and $R^2$ each particularly preferably represents a hydrogen atom, a methyl group or an ethyl group in view of the effect and ready availability.

$L^1$ represents a connecting group and is preferably a connecting group selected from the group consisting of —CO—, —O—, —NH—, a divalent aliphatic group, a divalent aromatic group and a combination thereof. The preferable examples and specific examples thereof are same as those described for the connecting group represented by $L^0$, respectively.

In formula (i), A preferably represents a carboxylate a sulfonate, a phosphonate or a phosphinate.

Specifically, the anions shown below are exemplified.

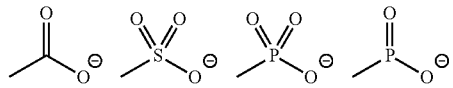

From the standpoint of satin resistance. A is most preferably a sulfonate. Further, in formula (i), a combination where $L^1$ represents a straight-chain alkyl group having 4 or 5 carbon atoms and A represents a sulfonate is preferable, and a combination where $L^1$ represents a straight-chain alkyl group having 4 carbon atoms and A represents a sulfonate is most preferable.

In formula (ii), $L^2$ represents a connecting group and is preferably a connecting group selected from the group consisting of —CO—, —O—, —NH—, a divalent aliphatic group, a divalent aromatic group and a combination thereof. The preferable examples and specific examples thereof are same as those described for the connecting group represented by $L^0$, respectively.

B represents a structure having a cation and preferably a structure having an ammonium, a phosphonium, an iodonium or a sulfonium. The structure having an ammonium or phosphonium is more preferable and the structure having an ammonium is particularly preferable. Examples of the structure having a cation include a trimethylammonio group, a triethylammonio group, a tributylammonio group, a benzyldimethylammonio group, a diethylhexylammonio group, a (2-hydroxyethyl)dimethylammonio group, a pyridinio group, an N-methylimidazolio group, an N-acridinio group, a trimethylphosphonio group, a triethylphosphonio group and a triphenylphosphonio group.

In formula (iii), $L^3$ represents a connecting group and the preferable examples and specific examples thereof are same as those described for $L^1$ in formula (i), respectively. A preferably represents a carboxylate, a sulfonate, a phosphonate or a phosphinate and the detail and preferable examples thereof are same as those described for A in formula (i), respectively.

$R^3$ to $R^7$ each independently represents a hydrogen atom or a substituent. The substituent represented by any one of $R^3$ to $R^7$ includes, for example, a halogen atom, an alkyl group (including a cycloalkyl group and a bicycloalkyl group), an alkenyl group (including a cycloalkenyl group and a bicycloalkenyl group), an alkynyl group, an aryl group, a heterocyclic group, a cyano group, a hydroxy group, a nitro group, a carboxyl group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (including an aniline group), an acylamino group, an aminocarbonylamino group, an alkoxycarbonylamino group, an aryloxycarbonylamino group, a sulfamoylamino group, an alkyl or aryl sulfonylamino group, a mercapto group, an alkylthio group, an arylthio group, a heterocyclic thio group, a sulfamoyl group, a sulfo group, an alkyl or aryl sulfinyl group, an alkyl or aryl sulfonyl group, an acyl group, an aryloxycarbonyl group, an alkoxycarbonyl group, a carbamoyl group, an aryl or heterocyclic azo group, an imido group, a phosphino group, a phosphinyl group, a phosphinyloxy group, a phosphinylamino group and a silyl group.

More specifically, the substituent includes a halogen atom (for example, a chlorine atom, a bromine atom or an iodine atom), an alkyl group [representing a straight-chain, branched or cyclic, substituted or unsubstituted alkyl group and including an alkyl group (preferably a substituted or unsubstituted alkyl group having from 1 to 30 carbon atoms, for example, methyl, ethyl, n-propyl, isopropyl, tert-butyl, n-octyl, eucosyl, 2-chloroethyl, 2-cyanoethyl or 2-ethylhexyl), a cycloalkyl group (preferably a substituted or unsubstituted cycloalkyl group having from 3 to 30 carbon atoms, for example, cyclohexyl, cyclopentyl or 4-n-dodecylcyclohexyl), a bicycloalkyl group (preferably a substituted or unsubstituted bicycloalkyl group having from 5 to 30 carbon atoms, that is, a monovalent group formed by eliminating one hydrogen atom from a bicycloalkane having from 5 to 30 carbon atoms, for example, bicyclo[1,2,2]heptan-2-yl or bicyclo[2,2,2]octan-3-yl) and a cycloalkyl group having more cyclic structures, for example, a tricycloalkyl group; the alkyl group included in the substituent described hereinafter (for example, the alkyl group in the alkylthio group) also having the same meaning as described above], an alkenyl group [representing a straight-chain, branched or cyclic, substituted or unsubstituted alkenyl group and including an alkenyl group (preferably a substituted or unsubstituted alkenyl group having from 2 to 30 carbon atoms, for example, vinyl, allyl, prenyl, geranyl or oleyl), a cycloalkenyl group (preferably a substituted or unsubstituted cycloalkenyl group having from 3 to 30 carbon atoms, that is, a monovalent group formed by eliminating one hydrogen atom from a cycloalkene having from 3 to 30 carbon atoms, for example, 2-cyclopenten-1-yl or 2-cyclohexen-1-yl), and a bicycloalkenyl group (preferably a substituted or unsubstituted bicycloalkenyl group having from 5 to 30 carbon atoms, that is, a monovalent group formed by eliminating one hydrogen atom from a bicycloalkene having one double bond, for example, bicyclo[2,2,1]hept-2-en-1-yl or bicyclo[2,2,2]oct-2-en-4-yl)], an alkynyl group (preferably a substituted or unsubstituted alkynyl group having from 2 to 30 carbon atoms, for example, ethynyl, propargyl or trimethylsilylethynyl), an aryl group (preferably a substituted or unsubstituted aryl group having from 6 to 30 carbon atoms, for example, phenyl, p-tolyl, naphthyl, m-chlorophenyl or o-hexadecanoylaminophenyl), a heterocyclic group (preferably a monovalent group formed by eliminating one hydrogen atom from a 5-membered or 6-membered, substituted or unsubstituted, aromatic or non-aromatic heterocyclic compound, more preferably a 5-membered or 6-membered aromatic heterocyclic group having from 5 to 30 carbon atoms, for example, 2-furyl, 2-thienyl, 2-pyrimidinyl or 2-benzothiazolyl), a cyano group, a hydroxy group, a nitro group, a carboxyl group, an alkoxy group (preferably a substituted or unsubstituted alkoxy group having from 1 to 30 carbon atoms, for example, methoxy, ethoxy, isopropoxy, tert-butoxy, n-octyloxy or 2-methoxyethoxy), an aryloxy group (preferably a substituted or unsubstituted aryloxy group having from 6 to 30 carbon atoms, for example, phenoxy, 2-methylphenoxy, 4-tert-butylphenoxy, 3-nitrophenoxy or 2-tetradecanoylaminophenoxy), a silyloxy group (preferably a silyloxy group having from 3 to 20 carbon atoms, for example, trimethylsilyloxy or tert-butyldimethylsilyloxy), a heterocyclic oxy group (preferably a substituted or unsubstituted heterocyclic oxy group having from 2 to 30 carbon atoms, for example, 1-phenyltetrazol-5-oxy or 2-tetrahydropyranyloxy), an acyloxy group (preferably a formyloxy group, a substituted or unsubstituted alkylcarbonyloxy group having from 2 to 30 carbon atoms or a substituted or unsubstituted arylcarbonyloxy group having from 6 to 30 carbon atoms, for example, formyloxy, acetyloxy, pivaloyloxy, stearoyloxy, benzoyloxy or p-methoxyphenylcarbonyloxy), a carbamoyloxy group (preferably a substituted or unsubstituted carbamoyloxy group having from 1 to 30 carbon atoms, for example, N,N-dimethylcarbamoyloxy, N,N-diethylcarbamoyloxy, morpholinocarbonyloxy, N,N-di-n-octylaminocarbonyloxy or N-n-octylcarbamoyloxy), an alkoxycarbonyloxy group (preferably a substituted or unsubstituted alkoxycarbonyloxy group having from 2 to 30 carbon atoms, for example, methoxycarbonyloxy, ethoxycarbonyloxy, tert-butoxycarbonyloxy or n-octyloxycarbonyloxy), an aryloxycarbonyloxy group (preferably a substituted or unsubstituted aryloxycarbonyloxy group having from 7 to 30 carbon atoms, for example, phenoxycarbonyloxy, p-methoxyphenoxycarbonyloxy or p-n-hexadecyloxyphenoxycarbonyloxy), an amino group (preferably an amino group, a substituted or unsubstituted alkylamino group having from 1 to 30 carbon atoms or a substituted or unsubstituted anilino group having from 6 to 30 carbon atoms, for example, amino, methylamino, dimethylamino, anilino, N-methylanilino or diphenylamino), an acylamino group (preferably a formylamino group, a substituted or unsubstituted alkylcarbonylamino group having from 1 to 30 carbon atoms or a substituted or unsubstituted arylcarbonylamino group having from 6 to 30 carbon atoms, for example, formylamino, acetylamino, pivaloylamino, lauroylamino, benzoylamino or 3,4,5-tri-n-octyloxyphenylcarbonylamino), an aminocarbonylamino group (preferably a substituted or unsubstituted aminocarbonylamino group having from 1 to 30 carbon atoms, for example, carbamoylamino, N,N-dimethylaminocarbonylamino, N,N-diethylaminocarbonylamino or morpholinocarbonylamino), an alkoxycarbonylamino group (preferably a substituted or unsubstituted alkoxycarbonylamino group having from 2 to 30 carbon atoms, for example, methoxycarbonylamino, ethoxycarbonylamino, tert-butoxycarbonylamino, n-octadecyloxycarbonylamino or N-methylmethoxycarbonylamino), an aryloxycarbonylamino group (preferably a substituted or unsubstituted aryloxycarbonylamino group having from 7 to 30 carbon atoms, for example, phenoxycarbonylamino, p-chlorophenoxycarbonylamino or m-n-octyloxyphenoxycarbonylamino), a sulfamoylamino group (preferably a substituted or unsubstituted sulfamoylamino group having from 0 to 30 carbon atoms, for example, sulfamoylamino, N,N-dimethylaminosulfonylamino or N-n- octylaminosulfonylamino), an alkyl or aryl sulfonylamino group (preferably a substituted or unsubstituted alkylsulfonylamino group having from 1 to 30 carbon atoms or a substituted or unsubstituted arylsulfonylamino group having from 6 to 30 carbon atoms, for example, methylsulfonylamino, butylsulfonylamino, phenylsulfonylamino, 2,3,5-trichlorophenylsulfonylamino or p-methylphenylsulfonylamino), a mercapto group, an alkylthio group (preferably a substituted or unsubstituted alkylthio group having from 1 to 30 carbon atoms, for example, methylthio, ethylthio or n-hexadecylthio), an arylthio group (preferably a substituted or unsubstituted arylthio group having from 6 to 30 carbon atoms, for example, phenylthio, p-chlorophenylthio or m-methoxyphenylthio), a heterocyclic thio group (preferably a substituted or unsubstituted heterocyclic thio group having from 2 to 30 carbon atoms, for example, 2-benzothiazolylthio or 1-phenyltetrazol-5-ylthio), a sulfamoyl group (preferably a substituted or unsubstituted sulfamoyl group having from 0 to 30 carbon atoms, for example, N-ethylsulfamoyl, N-(3-dodecyloxypropyl)sulfamoyl, N,N-dimethylsulfamoyl, N-acetylsulfamoyl, N-benzoylsulfamoyl or N—(N'-phenylcarbamoyl)sulfamoyl), a sulfo group, an alkyl or aryl sulfinyl group (preferably a substituted or unsubstituted alkylsulfinyl group having from 1 to 30 carbon atoms or a substituted or unsubstituted arylsulfinyl group having from 6 to 30 carbon atoms, for example, methylsulfinyl, ethylsulfinyl, phenylsulfinyl or p-methylphenylsulfinyl), an alkyl or aryl sulfonyl group (preferably a substituted or unsubstituted alkylsulfonyl group having from 1 to 30 carbon atoms or a substituted or unsubstituted arylsulfonyl group having from 6 to 30 carbon atoms, for example, methylsulfonyl, ethylsulfonyl, phenylsulfonyl or p-methylphenylsulfonyl), an acyl group (preferably a formyl group, a substituted or unsubstituted alkylcarbonyl group having from 2 to 30 carbon atoms, a substituted or unsubstituted arylcarbonyl, group having from 7 to 30 carbon atoms or a substituted or unsubstituted heterocyclic carbonyl group having from 4 to 30 carbon atoms wherein the hetero ring is connected to the carbonyl group via a carbon atom, for example, acetyl, pivaloyl, 2-chloroacetyl, stearoyl, benzoyl, p-n-octyloxyphenylcarbonyl, 2-pyridylcarbonyl or 2-furylcarbonyl), an aryloxycarbonyl group (preferably a substituted or unsubstituted aryloxycarbonyl group having from 7 to 30 carbon atoms, for example, phenoxycarbonyl, o-chlorophenoxycarbonyl, m-nitrophenoxycarbonyl or p-tert-butylphenoxycarbonyl), an alkoxycarbonyl group (preferably a substituted or unsubstituted alkoxycarbonyl group having from 2 to 30 carbon atoms, for example, methoxycarbonyl, ethoxycarbonyl, tert-butoxycarbonyl or n-octadecyloxycarbonyl), a carbamoyl group (preferably a substituted or unsubstituted carbamoyl group having from 1 to 30 carbon atoms, for example, carbamoyl, N-methylcarbamoyl, N,N-dimethylcarbamoyl, N,N-di-n-octylcarbamoyl or N-(methylsulfonyl)carbamoyl), an aryl or heterocyclic azo group (preferably a substituted or unsubstituted aryl azo group having from 6 to 30 carbon atoms or a substituted or unsubstituted heterocyclic azo group having from 3 to 30 carbon atoms, for example, phenylazo, p-chlorophenylazo or 5-ethylthio-1,3,4-triadiazol-2-ylazo), an imido group (preferably N-succinimide or N-phthalimido), a phosphino group (preferably a substituted or unsubstituted phosphino group having from 2 to 30 carbon atoms, for example, dimethylphosphino, diphenylphosphino or methylphenoxyphosphino), a phosphinyl group (preferably a substituted or unsubstituted phosphinyl group having from 2 to 30 carbon atoms, for example, phosphinyl, dioctyloxyphosphinyl or diethoxyphosphinyl), a phosphinyloxy group (preferably a substituted or unsubstituted phosphinyloxy group having from 2 to 30 carbon atoms, for example, diphenyloxyphosphinyloxy or dioctyloxyphosphinyloxy), a phosphinylamino group (preferably a substituted or unsubstituted phosphinylamino group having from 2 to 30 carbon atoms, for example, dimethoxyphosphinylamino or dimethylaminophosphinylamino), and a silyl group (preferably a substituted or unsubstituted silyl group having from 3 to 30 carbon atoms, for example, trimethylsilyl, tert-butyldimethylsilyl or phenyldimethylsilyl).

Of the substituents described above, in those having a hydrogen atom, the hydrogen atom may be substituted with the substituent described above. Examples of such a substituent include an alkylcarbonylaminosulfonyl group, an arylcarbonylaminosulfonyl group, an alkylsulfonylaminocarbonyl group and an arylsulfonylaminocarbonyl group. Specific examples thereof include methylsulfonylaminocarbonyl, p-methylphenylsulfonylaminocarbonyl, acetylaminosulfonyl and benzoylaminosulfonyl.

It is particularly preferred that the specific polymer compound has a cation and an anion of the zwitterionic structure in the position corresponding to a side chain of polymer in the repeating unit.

In the invention, specifically, the repeating unit having a zwitterionic structure is preferably represented by formula (A1) shown below.

(A1)

In formula (A1), $R^{101}$ to $R^{103}$ each independently represents a hydrogen atom, an alkyl group having from 1 to 6 carbon atoms or a halogen atom. L represents a single bond or a divalent connecting group selected from the group consisting of —CO—, —O—, —NH—, a divalent aliphatic group, a divalent aromatic group and a combination thereof.

Specific examples of the combination of groups represented by L are set forth below. In each of the specific examples shown below, the left side connects to the main chain and the right side connects to X.

L1: —CO—O-divalent aliphatic group-
L2: —CO—O-divalent aromatic group-
L3: —CO—NH-divalent aliphatic group-
L4: —CO—NH-divalent aromatic group-
L5: —CO-divalent aliphatic group-
L6: —CO-divalent aromatic group-
L7: —CO-divalent aliphatic group-CO—O-divalent aliphatic group-
L8: —CO-divalent aliphatic group-O—CO-divalent aliphatic group-
L9: —CO-divalent aromatic group-CO—O-divalent aliphatic group-
L10: —CO-divalent aromatic group-O—CO-divalent aliphatic group-
L11: —CO-divalent aliphatic group-CO—O-divalent aromatic group-
L12: —CO-divalent aliphatic group-O—CO-divalent aromatic group-
L13: —CO-divalent aromatic group-CO—O-divalent aromatic group-
L14: —CO-divalent aromatic group-O—CO-divalent aromatic group- L15: —CO—O-divalent aromatic group-O—CO—NH-divalent aliphatic group- L16: —CO—O-divalent aliphatic group-O—CO—NH-divalent aliphatic group- The divalent aliphatic group includes an alkylene group, a substituted alkylene group, an alkenylene group, a substituted alkenylene group, an alkinylene group, a substituted alkinylene group and a polyalkyleneoxy group. Among them, an alkylene group, a substituted alkylene group, an alkenylene group and a substituted alkenylene group are preferable, and an alkylene group and a substituted alkylene group are more preferable.

Of the divalent aliphatic groups, a chain structure is preferable than a cyclic structure, and further a straight-chain structure is more preferable than a bunched structure. A number of carbon atoms included in the divalent aliphatic group is preferably from 1 to 20, more preferably from 1 to 15, still more preferably from 1 to 12, yet still more preferably from 1 to 10, and most preferably from 1 to 8.

Examples of the substituent for the divalent aliphatic group include a halogen atom (e.g., F, Cl, Br or I), a hydroxy group, a carboxyl group, an amino group, a cyano group, an aryl group, an alkoxy group, an aryloxy group, an acyl group, an alkoxycarbonyl group, an aryloxycarbonyl group, an acyloxy group, a monoalkylamino group, a dialkylamino group, a monoarylamino group and a diarylamino group.

The divalent aromatic group includes an arylene group and a substituted arylene group. It preferably includes a phenylene group, a substituted phenylene group, a naphthylene group and a substituted naphthylene group.

Examples of the substituent for the divalent aromatic group include an alkyl group in addition to the substituents described for the divalent aliphatic group described above.

Of L1 to L16 described above, L1 to L4 are preferable.

L is preferably a single bond, —CO—, a divalent aliphatic group, a divalent aromatic group or any one of L1 to L4. Moreover, from the standpoint of the stain resistance, L is preferably L1 or L3, and more preferably L3. Further, the divalent aliphatic group in L3 is preferably a straight-chain alkylene group having from 2 to 4 carbon atoms, and from the standpoint of the synthesis, most preferably a straight-chain alkylene group having 3 carbon atoms.

In formula (A1), X represents a zwitterionic structure. X is preferably the structure represented by formula (i), formula (ii) or formula (iii) and preferable embodiments are also same as those described in formula (i), formula (ii) and formula (iii).

In particular, in the repeating units represented by formula (A1), a combination where L is L1 or L3, X is the structure represented by formula (i) and in formula (i) A is a sulfonate group is preferable, a combination where L is L1 or L3, X is the structure represented by formula (i) and in formula (i) $L^1$ is a straight-chain alkylene group having 4 or 5 carbon atoms and A is a sulfonate group is more preferable, and a combination where L is L3, in L3 the divalent aliphatic group is a straight-chain alkylene group having 3 carbon atoms, X is the structure represented by formula (i) and in formula (i) $L^1$ is a straight-chain alkylene group having 4 carbon atoms and A is a sulfonate group is most preferable.

The content of the repeating unit (a1) having a zwitterionic structure in the specific polymer compound according to the invention is preferably from 1 to 99% by mole, more preferably from 3 to 80% by mole, still more preferably from 5 to 70% by mole in view of the stain resistance, and further considering the printing durability, yet more preferably from 5 to 60% by mole, most preferably from 5 to 50% by mole, based on the total repeating unit constituting the specific polymer compound.

Now, the repeating unit having a structure capable of interacting with a surface of the support is described below.

The structure capable of interacting with a surface of the support includes, for example, a structure capable of undergoing interaction, for example, forming an ionic bond or a hydrogen bond or undergoing polar interaction, with metal, a metal oxide, a hydroxy group or the like present on the support subjected to anodizing treatment or hydrophilizing treatment.

The structure capable of interacting with a surface of the support includes, for example, a carboxylic acid structure, a carboxylate structure, a sulfonic acid structure, a sulfonate structure, a phosphonic acid structure, a phosphonate structure, a phosphoric acid ester structure, a phosphoric acid ester salt structure, a β-diketone structure and a phenolic hydroxy group and specifically includes, for example, structures represented by the formulae shown below.

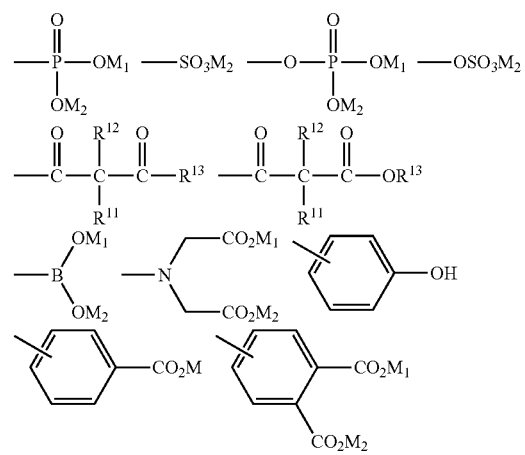

In the above-formulae, $R^{11}$ to $R^{13}$ each independently represents a hydrogen atom, an alkyl group, an aryl group, an alkynyl group or an alkenyl group, M, $M_1$ and $M_2$ each independently represents a hydrogen atom, a metal atom (for example, an alkali metal atom, e.g., Na or Li) or an ammonium group, and B represents a born atom.

From the standpoint of the stain resistance and printing durability, the structure capable of interacting with a surface of the support is preferably a carboxylic acid structure, a carboxylate structure, a sulfinic acid structure, a sulfonate structure, a phosphonic acid structure, a phosphonate structure, a phosphoric acid ester structure or a phosphoric acid ester salt structure. In view of further improvement in the stain resistance, a phosphonic acid structure, a phosphonate structure, a phosphoric acid ester structure or a phosphoric acid ester salt structure is more preferable, and a phosphonic acid structure or a phosphonate structure is most preferable.

In the invention, when the repeating unit (a1) having a zwitterionic structure has the structure capable of interacting with a surface of the support, the repeating unit is not considered the repeating unit (a2).

In the invention, specifically, the repeating unit having a structure capable of interacting with a surface of the support is preferably represented by formula (A2) shown below.

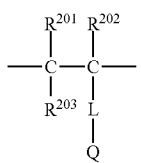

(A2)

In formula (A2), $R^{201}$ to $R^{203}$ each independently represents a hydrogen atom, an alkyl group (preferably having from 1 to 6 carbon atoms) or a halogen atom.

L represents a single bond or a divalent connecting group selected from the group consisting of —CO—, —O—, —NH—, a divalent aliphatic group, a divalent aromatic group and a combination thereof.

Specific examples of the combination of groups represented by L include L17 and L18 shown below in addition to the specific examples set forth for L in formula (A1).
L17: —CO—NH—
L18: —CO—O—
Of L1 to L18 described above, L1 to L4, L17 and L118 are preferable.

L is preferably a single bond, —CO—, —O—, —NH—, a divalent aliphatic group, a divalent aromatic group, any one of L1 to L4, L17 or L18, more preferably a single bond or any one of L1 to L4, and most preferably a single bond.

Q represents a structure capable of interacting with a surface of the support and preferable embodiments are same as those described above.

The content of the repeating unit (a2) having a structure capable of interacting with a surface of the support in the specific polymer compound according to the invention is preferably from 1 to 99% by mole, more preferably from 10 to 90% by mole, still more preferably from 20 to 90% by mole, most preferably from 30 to 90% by mole, based on the total repeating unit constituting the specific polymer compound in view of the stain resistance and printing durability.

In view of the stain resistance and printing durability, as for the specific polymer compound according to the invention, a combination where the zwitterionic structure is the structure represented by formula (i), (ii) or (iii) and the structure capable of interacting with a surface of the support is a phosphonic acid structure, a phosphonate structure, a phosphoric acid ester structure or a phosphoric acid ester salt structure is preferable, and a combination where the zwitterionic structure is the structure represented by formula (i), (ii) or (iii) and the structure capable of interacting with a surface of the support is a phosphonic acid structure or a phosphonate structure is most preferable. In particular, a structure in which a phosphonic acid structure or a phosphonate structure is directly connected to the polymer main chain is more preferable.

Although the specific polymer compound according to the invention is able to synthesize by any hitherto known method, a radical polymerization method is preferably used for the synthesis thereof. Ordinary radical polymerization methods are described, for example, in *Shin Kobunshi Jikkeneaku 3, Kobunshi no Gosei. Hanno 1,* (*New Polymer Experimentation 3, Synthesis and Reaction of Polymer* 1), edited by The Society of Polymer Science, Japan, (Kyoritsu Shuppan Co., Ltd.), *Shin Jikken Kagaku Koza* 19, *Kobunshi Kagaku (I),* (*New Experimental Chemistry Course* 19, *Polymer Chemistry (I),* edited by The Chemical Society of Japan, (Maruzen Co., Ltd.) and *Busshitsu Kogaku Koza, Kobunshi Gosei Kagaku,* (*Material Engineering Course, Polymer Synthesis Chemistry),* (Tokyo Denki University Press) and these methods can be applied.

Further, the specific polymer compound may be a copolymer containing other repeating unit (hereinafter, also simply referred to as other repeating unit) as well as (a1) the repeating unit having a zwitterionic structure, (a2) the repeating unit having a structure capable of interacting with a surface of the support and (a3) a repeating unit having a radical polymerizable reactive group described hereinafter which is preferably contained in the specific polymer compound.

The other repeating unit constituting the specific polymer compound according to the invention is preferably a repeating unit represented by formula (A3) shown below.

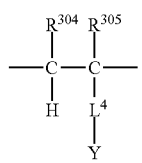

(A3)

In formula (3A), $R^{304}$ and $R^{305}$ each independently represents a hydrogen atom or a substituent having from 1 to 30 carbon atoms, $L^4$ represents a single bond or an organic connecting group (including, for example, the connecting group defined for $L^0$), and Y represents a substituent having from 1 to 30 carbon atoms.

In particular, $L^4$ is preferably an ester group or an amido group. Y is preferably a straight-chain alkyl group, and most preferably a methyl group or an ethyl group.

$R^{304}$ and $R^{305}$ each particularly preferably represents a hydrogen atom, a methyl group or an ethyl group in view of the effect and ready availability.

The other repeating unit is contained in the specific polymer compound preferably in an amount of 60% by mole or less, more preferably in an amount of 50% by mole or less, particularly preferably in an amount of 40% by mole or less, based on the total repeating unit constituting the specific polymer compound as the copolymerization component for (a1) the repeating unit having a zwitterionic structure and (a2) the repeating unit having a structure capable of interacting with a surface of the support. When the specific polymer compound contains the repeating unit represented by formula (A3), the amount thereof is preferably 5% by mole or more based on the total repeating unit constituting the specific polymer compound from the standpoint of film strength and hydrophilicity/hydrophobicity.

The weight average molecular weight of the specific polymer compound according to the invention can be appropriately set according to performance design of the lithographic printing plate precursor. It is preferably from 2,000 to 1,0000,000, more preferably from 2,000 to 500,000, and most preferably from 2,000 to 300,000 in view of the printing durability and stain resistance.

Specific examples of the specific polymer compound are set forth below together with the weight average molecular weight thereof, but the invention should not be construed as being limited thereto. The composition ratio in the polymer structure is indicated by a molar percentage.

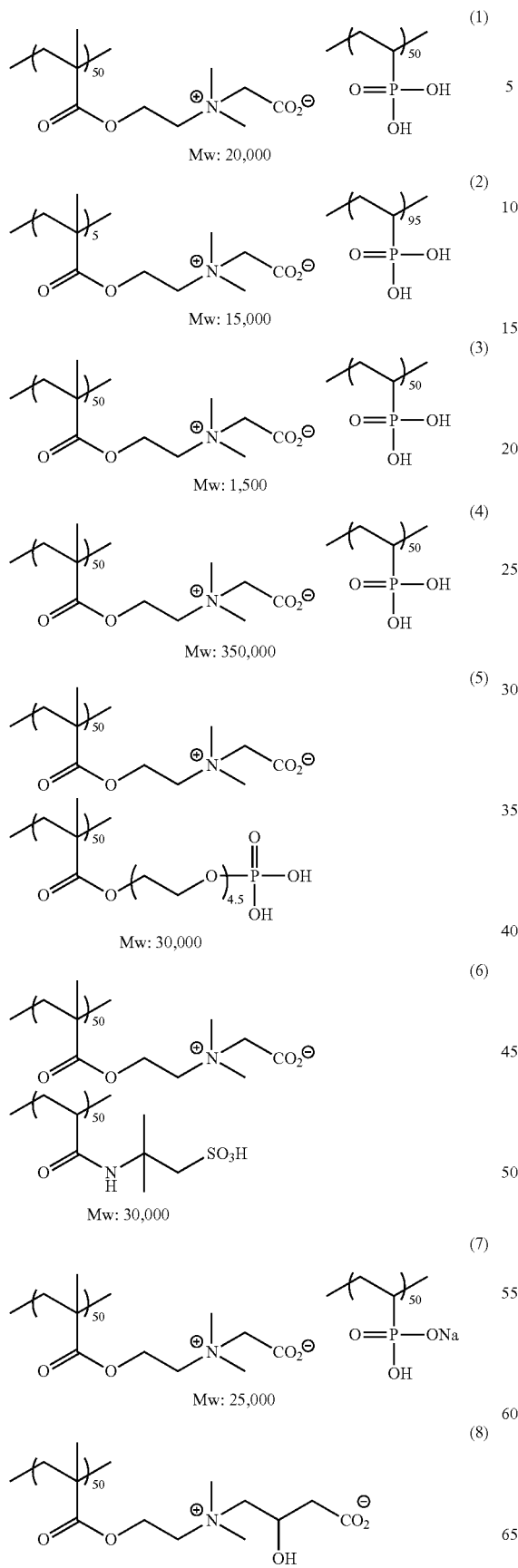
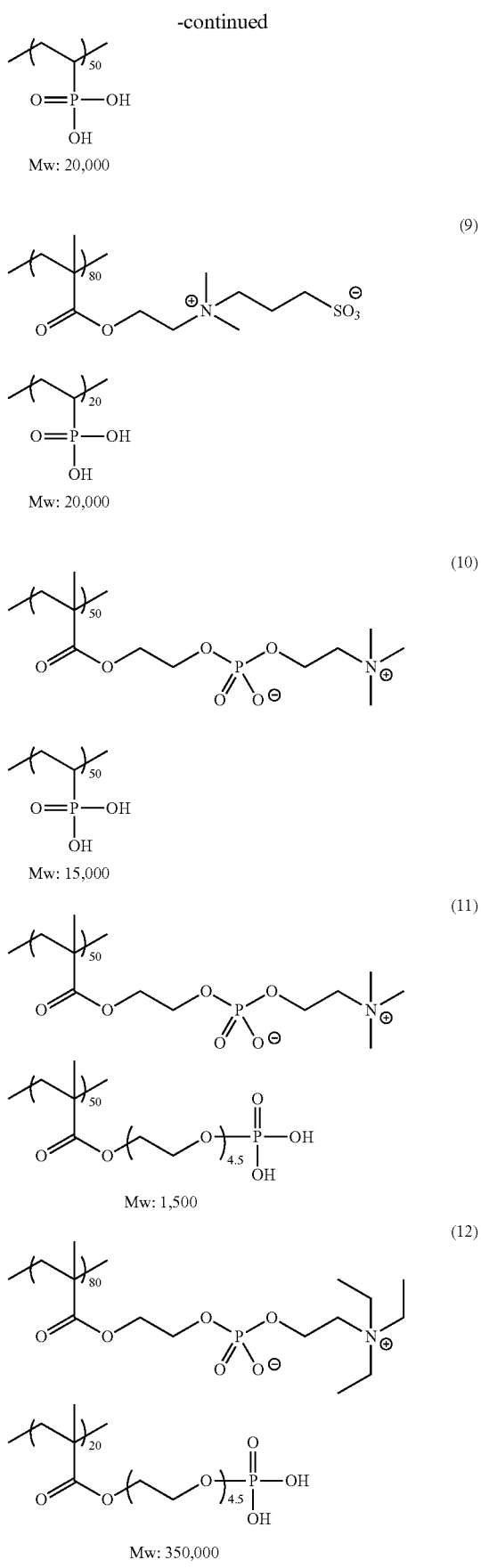

(13) 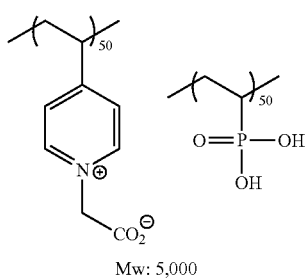
Mw: 5,000
(14) 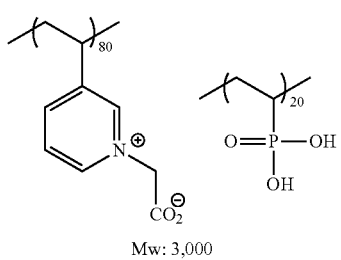
Mw: 3,000
(15) 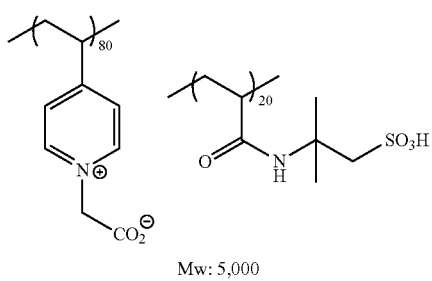
Mw: 5,000
(16) 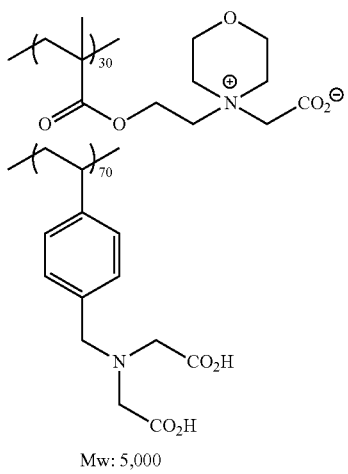
Mw: 5,000
(17) 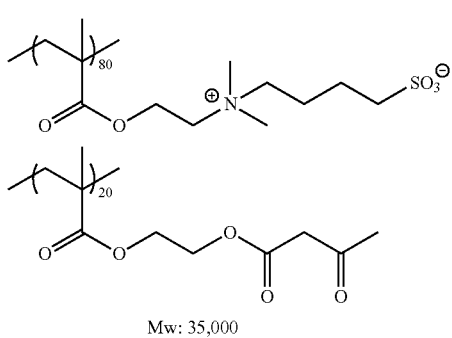
Mw: 35,000
(18) 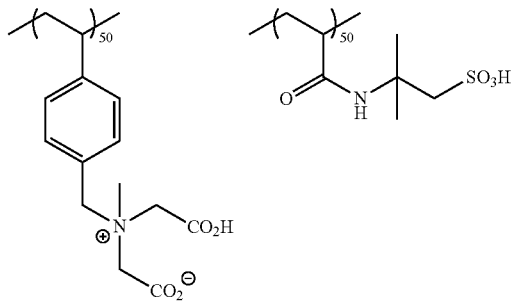
Mw: 6,000
(19) 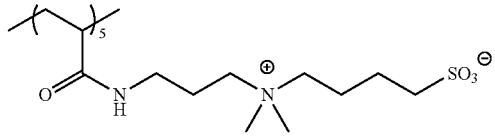
Mw: 15,500
(20) 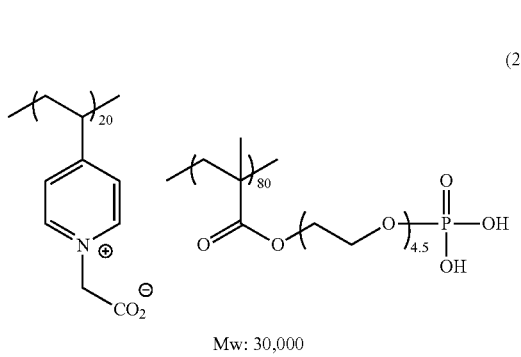
Mw: 30,000
(21) 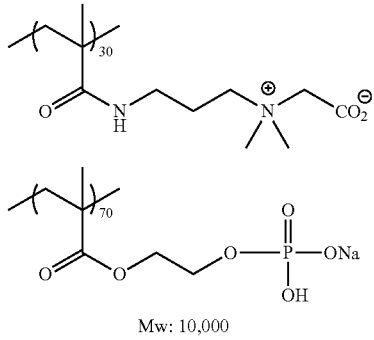
Mw: 10,000

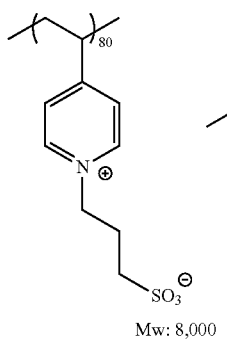

(32)
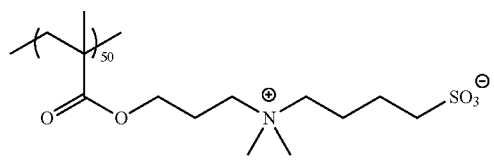
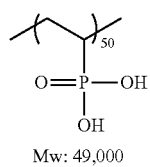
Mw: 49,000
(33)
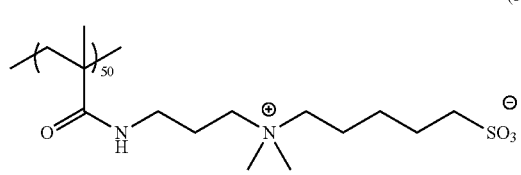
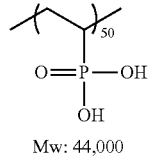
Mw: 44,000
(34)
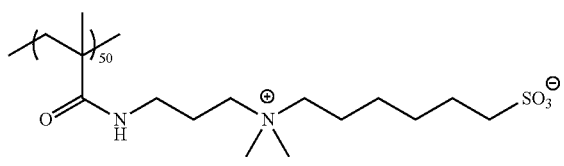
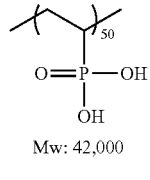
Mw: 42,000
(35)
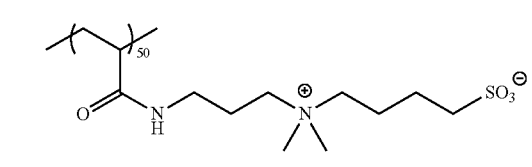
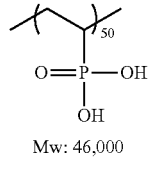
Mw: 46,000
(36)
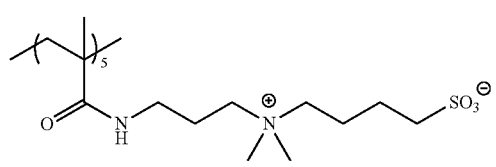
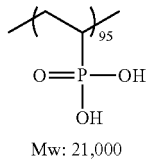
Mw: 21,000
(37)
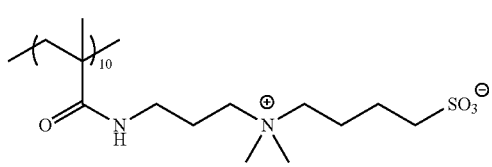
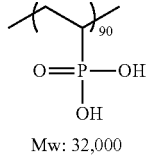
Mw: 32,000
(38)
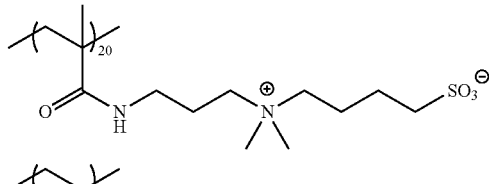
Mw: 35,000
(39)
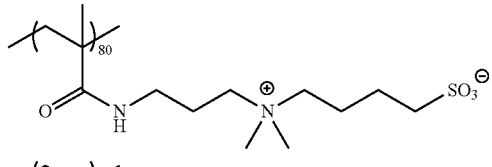
Mw: 54,000
(40)
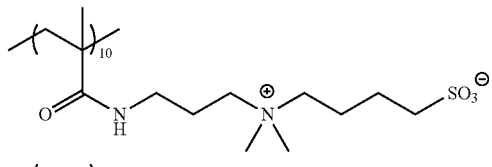
Mw: 2,000

(41)
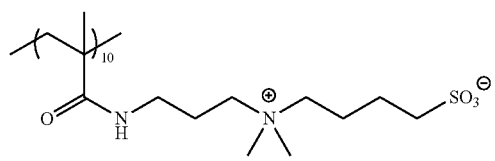
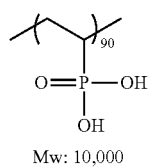
Mw: 10,000
(42)
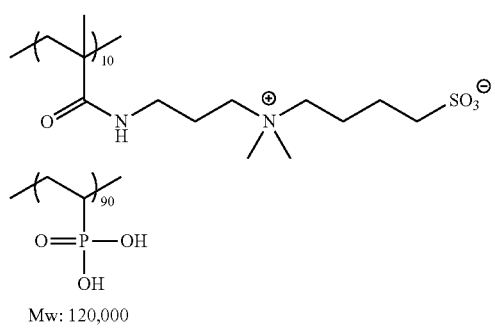
Mw: 120,000
(43)
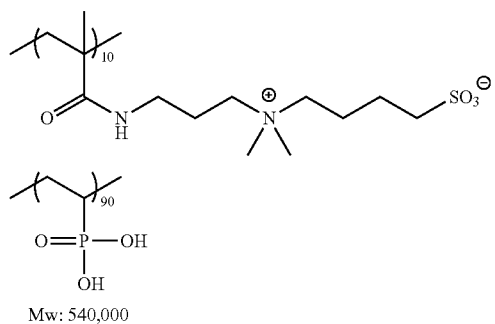
Mw: 540,000
(44)
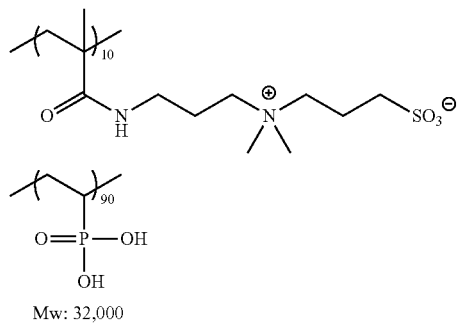
Mw: 32,000
(45)
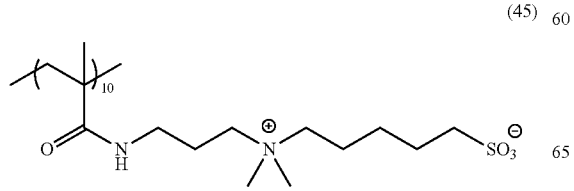
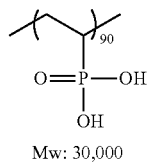
Mw: 30,000
(46)
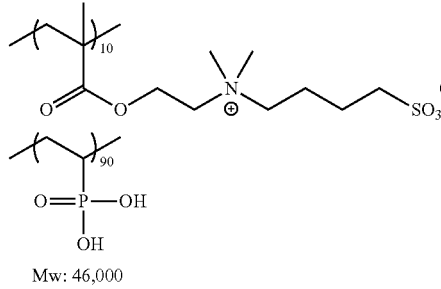
Mw: 46,000
(47)
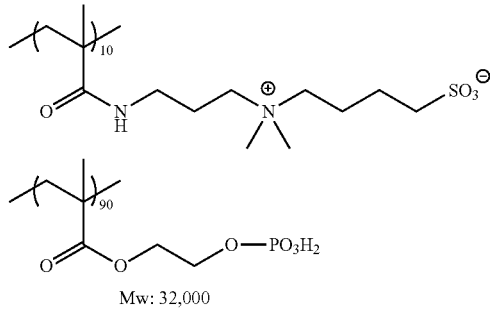
Mw: 32,000
(48)
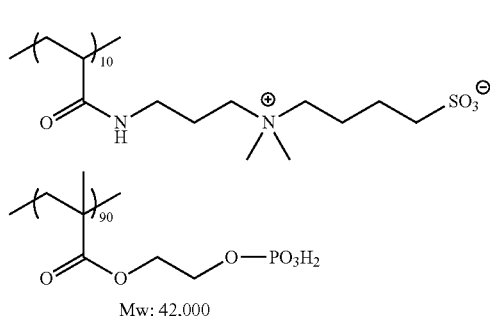
Mw: 42,000
(49)
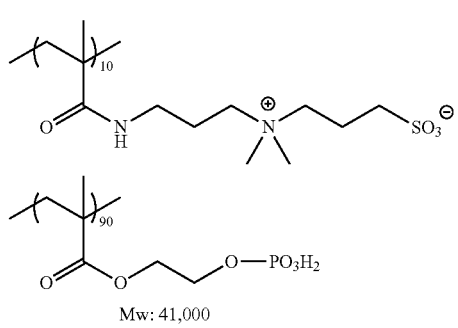
Mw: 41,000
(50)

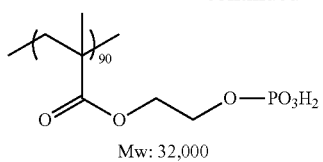
Mw: 32,000

(51)

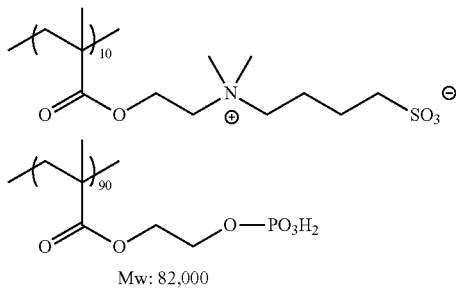
Mw: 82,000

(52)

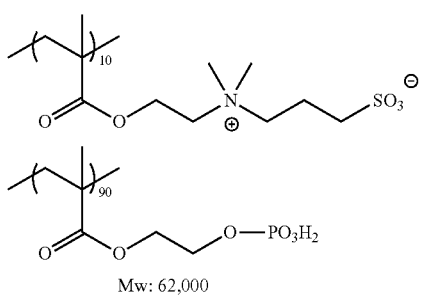
Mw: 62,000

(53)

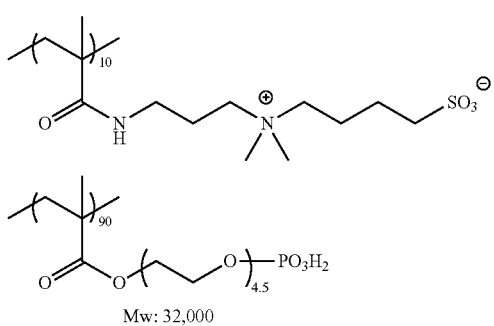
Mw: 32,000

(54)

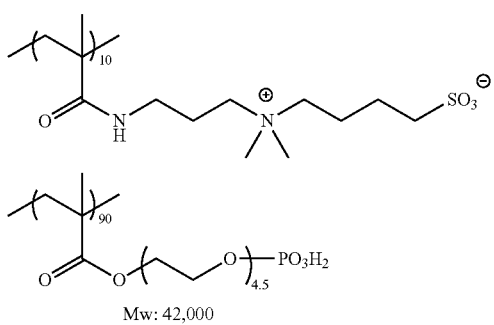
Mw: 42,000

(55)

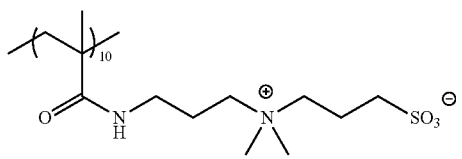

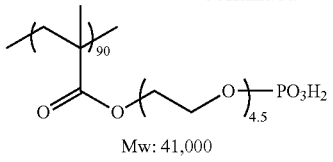
Mw: 41,000

(56)

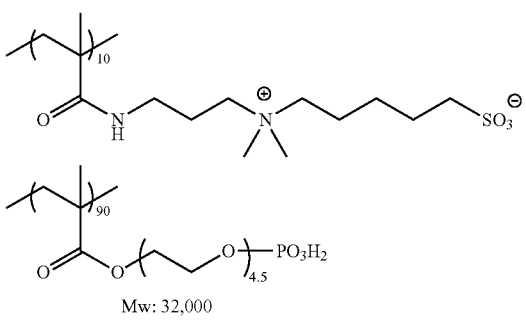
Mw: 32,000

(57)

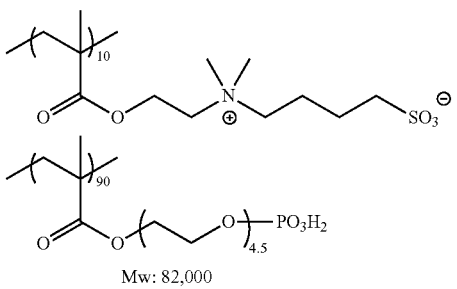
Mw: 82,000

(58)

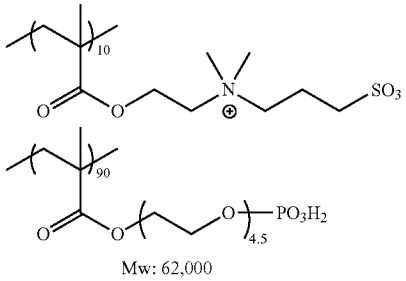
Mw: 62,000

From the standpoint of improvement in the printing durability, the specific polymer compound according to the invention preferably includes (a3) a repeating unit having a radical polymerizable reactive group. Preferable examples of the radical polymerizable reactive group include an addition polymerizable unsaturated bond group (for example, a (meth)acryloyl group, a (meth)acrylamido group, a (meth)acrylonitrile group, an allyl group, a vinyl group, a vinyloxy group or an alkynyl group), and a functional group capable of undergoing chain transfer (for example, a mercapto group). Among them, in view of the printing durability, an addition polymerizable unsaturated bond group is preferable, and from the standpoint of production, an allyl group is most preferable. The (meth)acryloyl group represents an acryloyl group or a methacryloyl group.

The specific polymer compound having a radical polymerizable reactive group according to the invention can be obtained by introducing the radical polymerizable reactive group by a method described in JP-A-2001-312068. By using the specific polymer compound having a radical polymerizable reactive group, the excellent developing property is expressed in the unexposed area and in the exposed area due to the polymerization the permeability of developer is restrained so that the adhesion property between the support and the photosensitive layer can be further improved.

The repeating unit (a3) having a radical polymerizable reactive group is contained in the specific polymer compound preferably in an amount of 1 to 50% by mole, more preferably in an amount of 2 to 30% by mole, and most preferably in an amount of 5 to 20% by mole, based on the total repeating unit constituting the specific polymer compound as the copolymerization component for (a1) the repeating unit having a zwitterionic structure and (a2) the repeating unit having a structure capable of interacting with a surface of the support. It is not preferable in view of the production that the repeating unit having a radical polymerizable reactive group is contained more than 50% by mole, since gelation is apt to occur in the synthesis. Further, the increase in the amount of the repeating unit having a radical polymerizable reactive group results in deterioration of the hydrophilicity so that it is not preferable in view of the stain resistance. On the other hand, as the amount of the repeating unit having a radical polymerizable reactive group decreases, it becomes difficult to obtain the effect of improvement in printing durability. Considering these factors, the amount thereof is most preferably from 5 to 20% by mole.

Specific examples of the specific polymer compound containing (a1) the repeating unit having a zwitterionic structure, (a2) the repeating unit having a structure capable of interacting with a surface of the support and (a3) the repeating unit having a radical polymerizable reactive group are set forth below, but the invention should not be construed as being limited thereto.

(59)

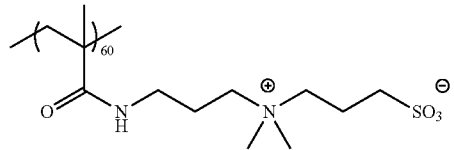

Mw: 40,000

(60)

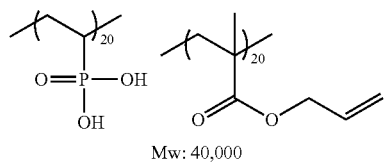

Mw: 35,000

-continued (61)

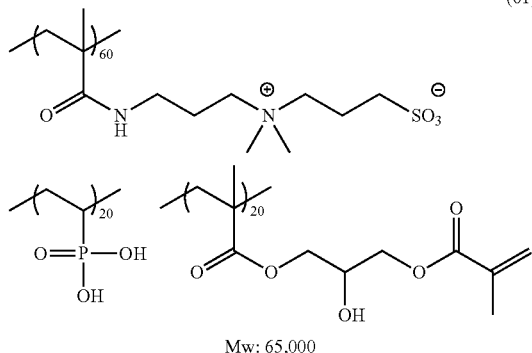

Mw: 65,000

(62)

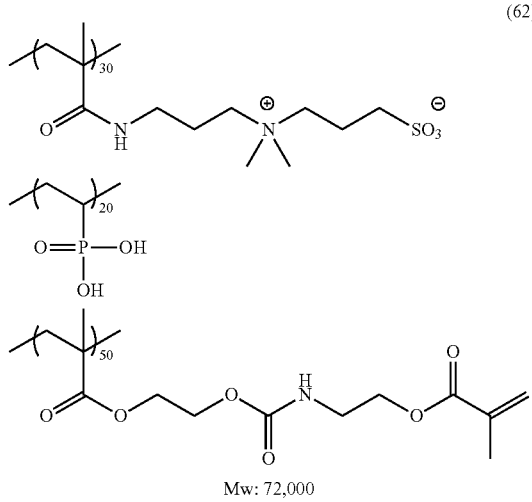

Mw: 72,000

(63)

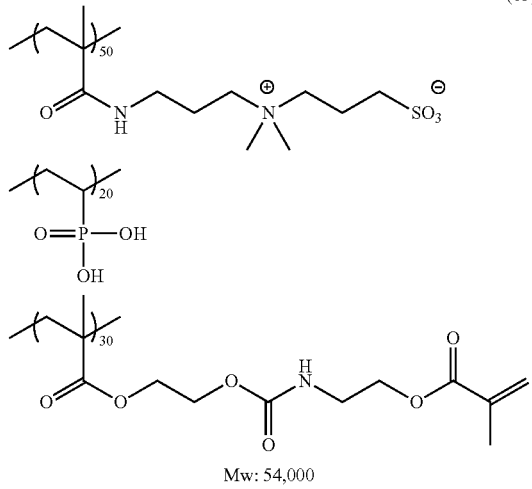

Mw: 54,000

(64)

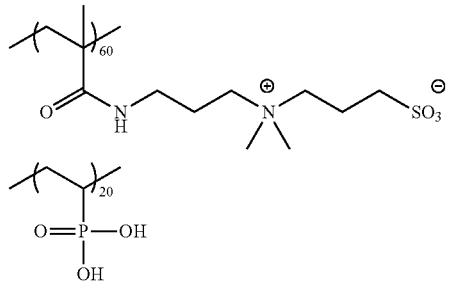

31
-continued
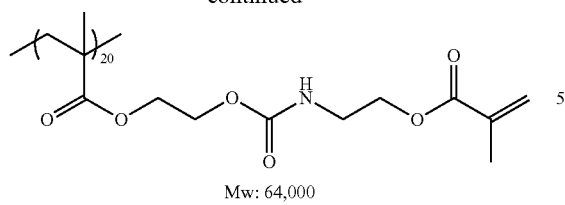
Mw: 64,000
(65)
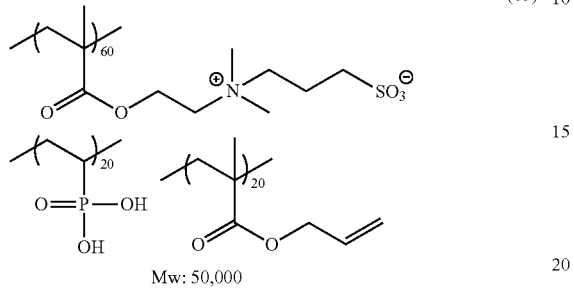
Mw: 50,000
(66)
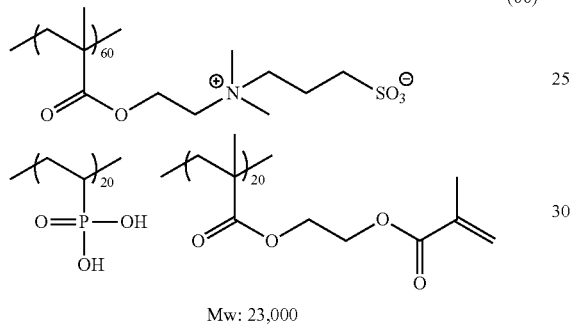
Mw: 23,000
(67)
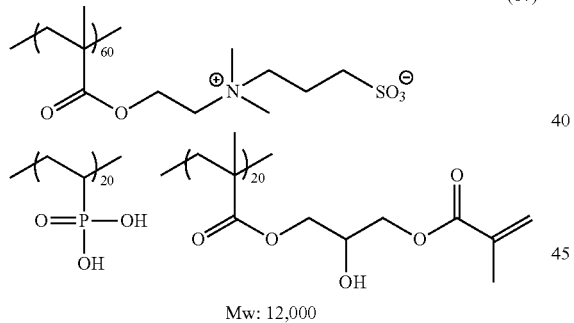
Mw: 12,000
(68)
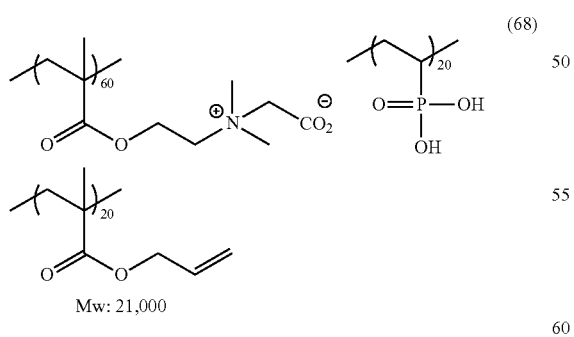
Mw: 21,000
(69)
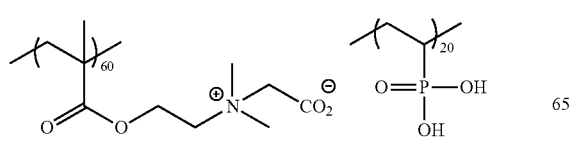
32
-continued
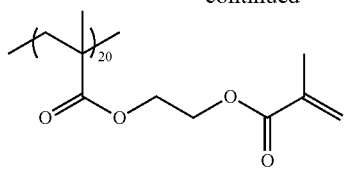
Mw: 15,000
(70)
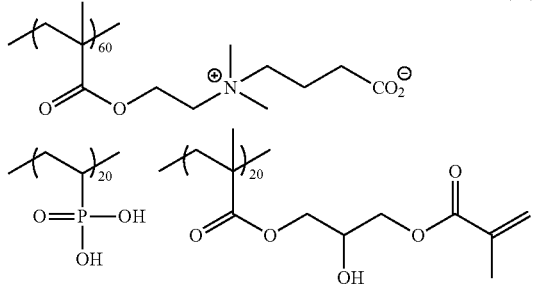
Mw: 11,000
(71)
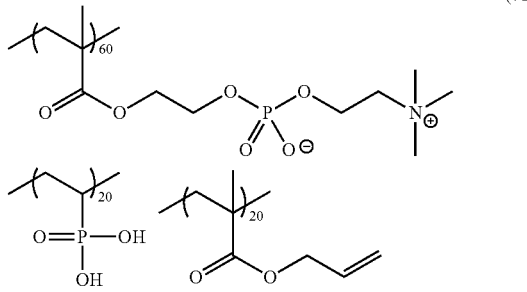
Mw: 36,000
(72)
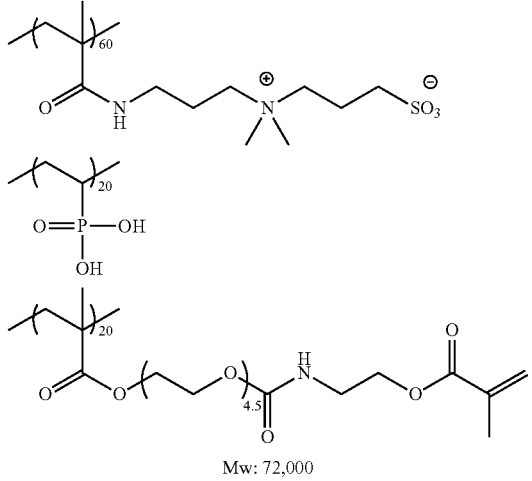
Mw: 72,000
(73)
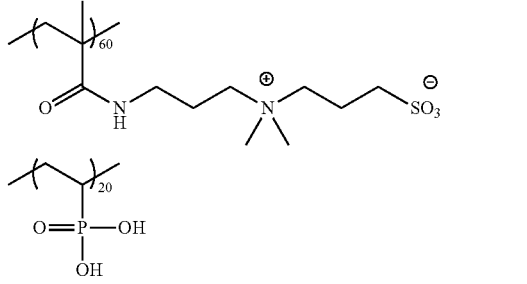

-continued
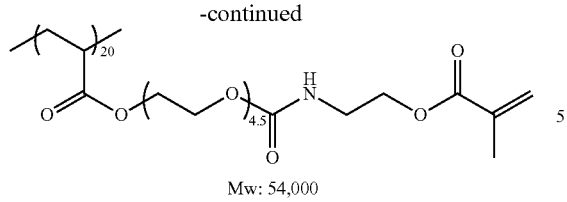
Mw: 54,000
(74)
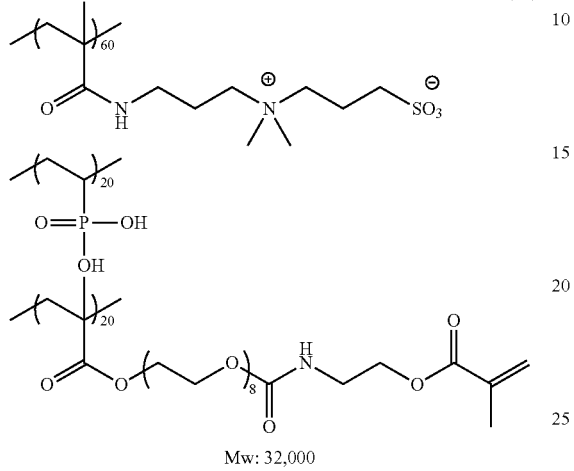
Mw: 32,000
(75)
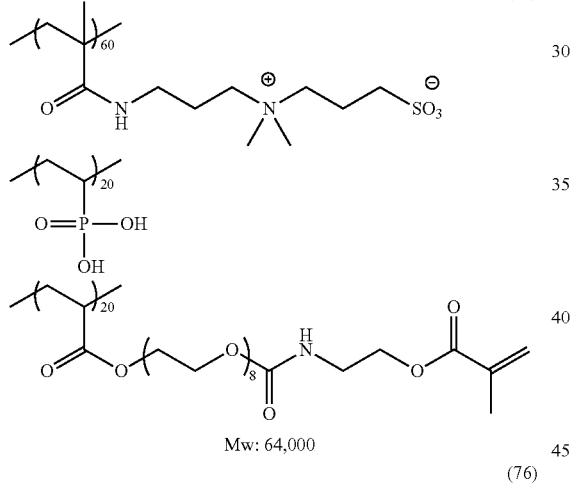
Mw: 64,000
(76)
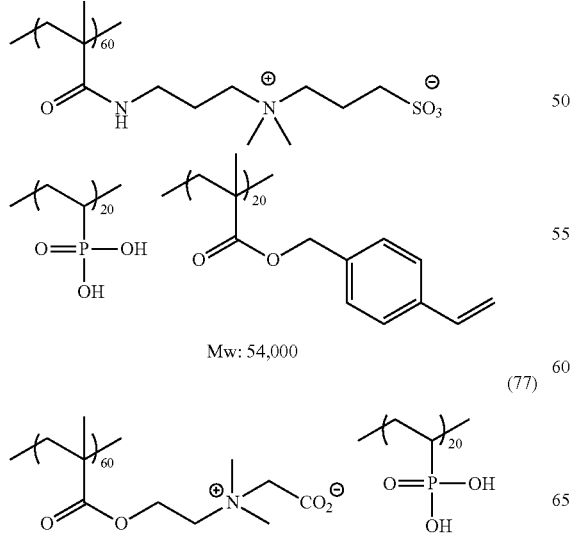
Mw: 54,000
(77)
-continued
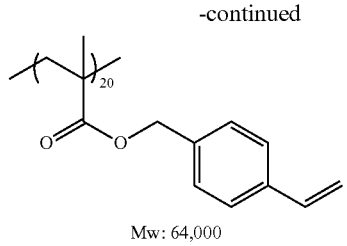
Mw: 64,000
(78)
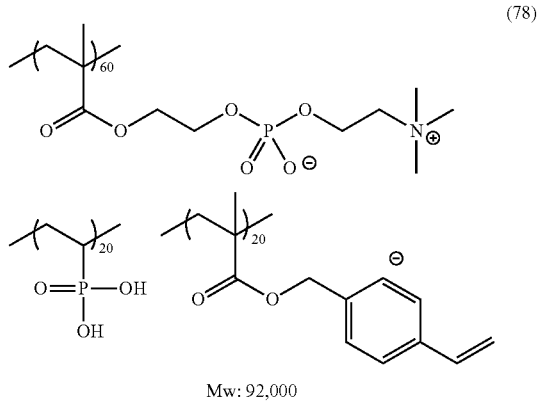
Mw: 92,000
(79)
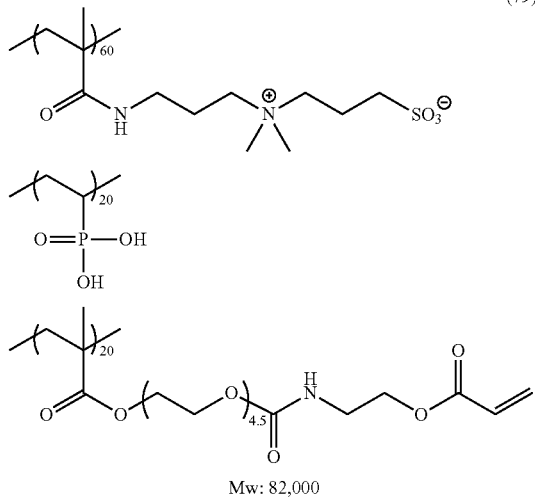
Mw: 82,000
(80)
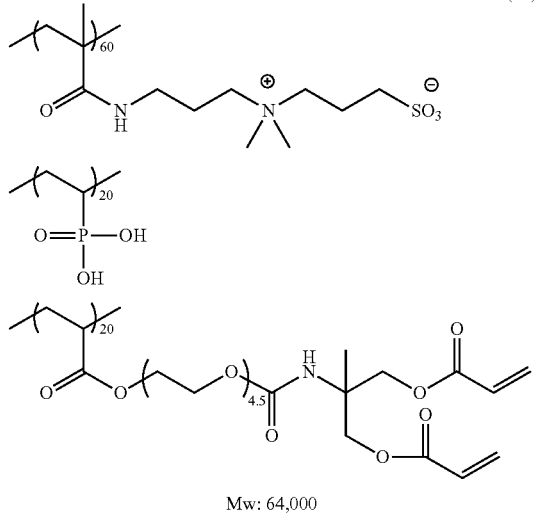
Mw: 64,000

(81)
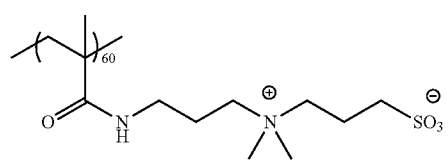
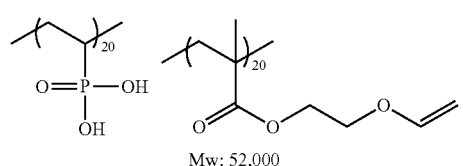
Mw: 52,000
(82)
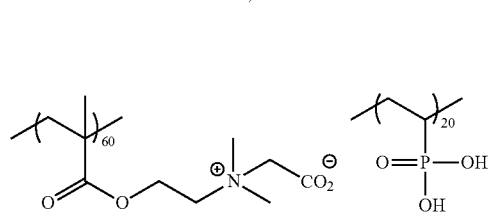
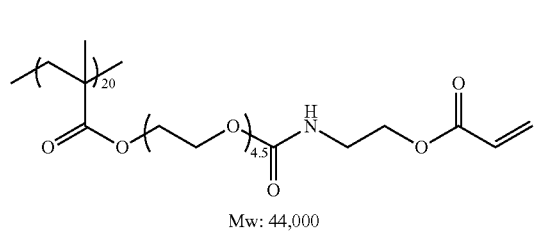
Mw: 44,000
(83)
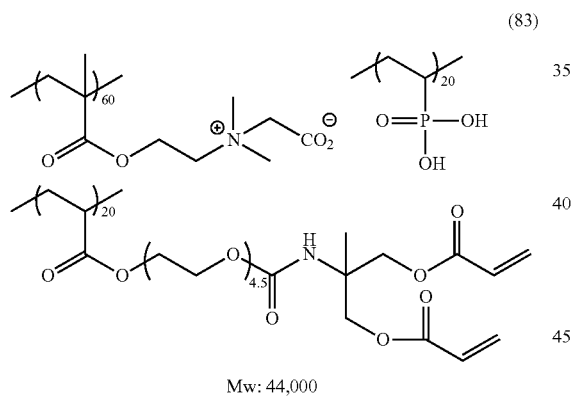
Mw: 44,000
(84)
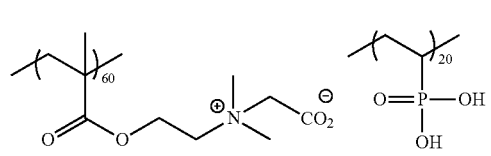
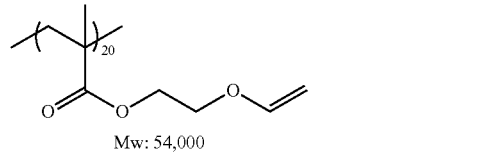
Mw: 54,000
(85)
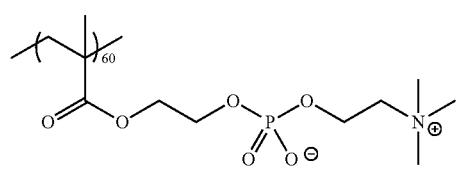
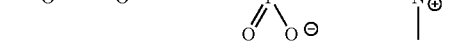
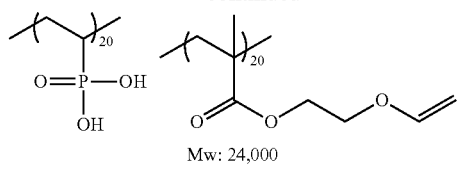
Mw: 24,000
(86)
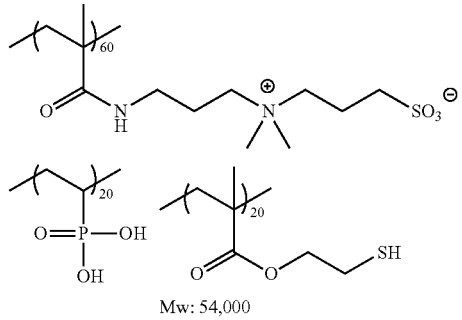
(87)
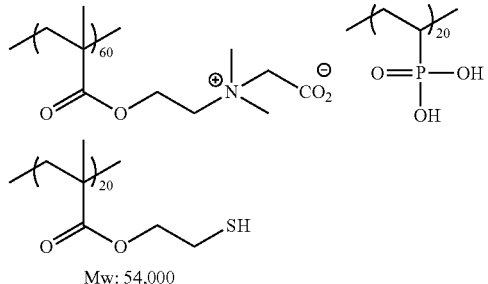
Mw: 54,000
(88)
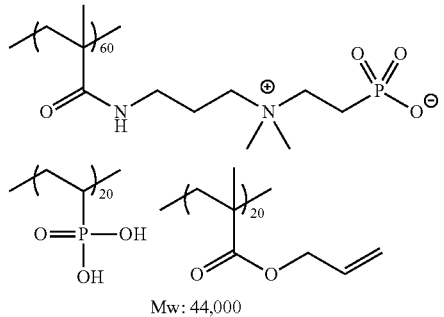
Mw: 44,000
(89)
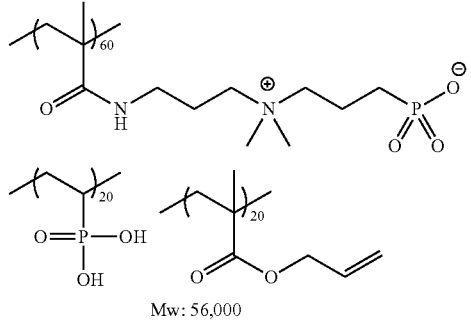
Mw: 56,000
(90)
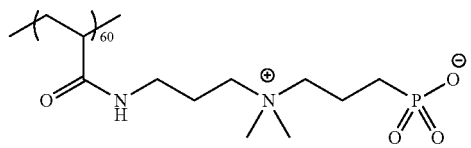

-continued

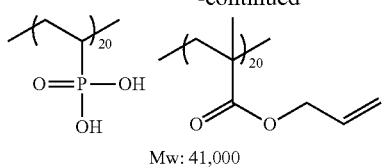

Mw: 41,000

(91)
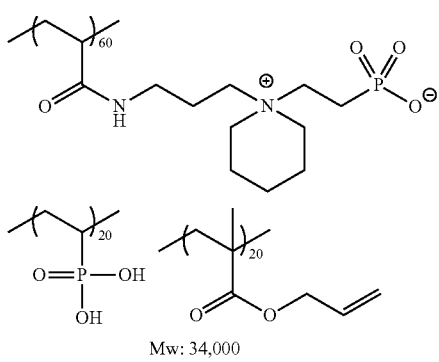

Mw: 34,000

(92)
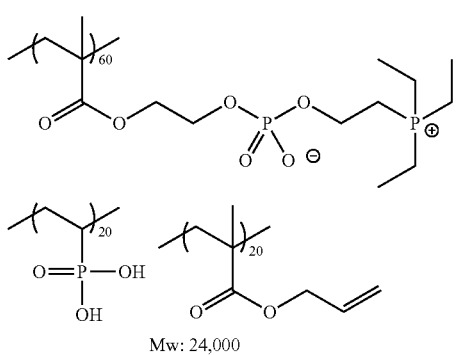

Mw: 24,000

(93)
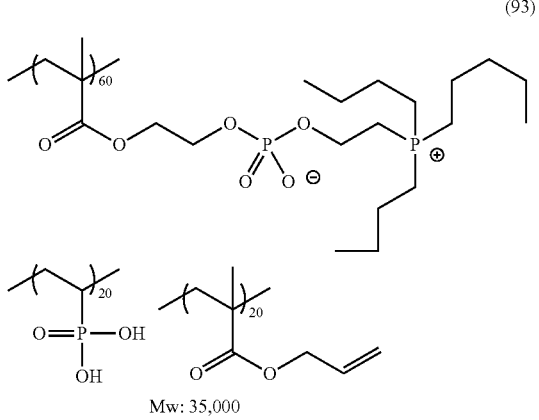

Mw: 35,000

(94)
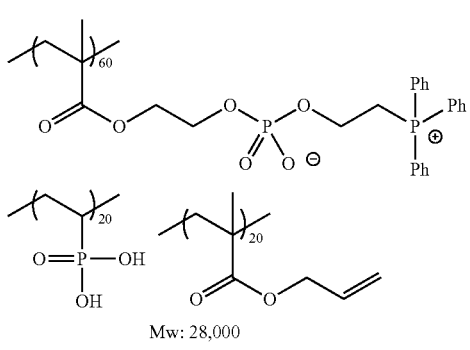

Mw: 28,000

(95)
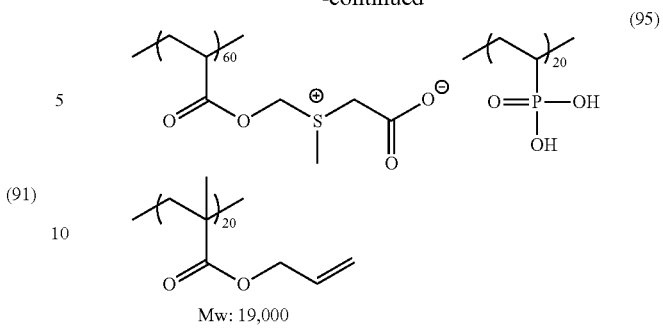

Mw: 19,000

The embodiments of the lithographic printing plate precursor according to the invention include an embodiment (first embodiment) where the photosensitive layer is the layer being in contact with the support and an embodiment (second embodiment) where the photosensitive layer is a layer different from the layer being in contact with the support.

In case of the first embodiment, the specific polymer compound is incorporated into the photosensitive layer and the content of the specific polymer compound is preferably from 0.01 to 10 by weight, more preferably from 0.1 to 5.0 by weight, most preferably from 0.1 to 3.0 by weight, per 100 parts by weight of the total solid content of the photosensitive layer.

In case of the second embodiment, the specific polymer compound is incorporated into a layer (an undercoat layer described hereinafter) being in contact with the support which is different from the photosensitive layer and the content of the specific polymer compound is preferably from 0.1 to 100 by weight, more preferably from 10 to 100 by weight, most preferably from 20 to 100 by weight, per 100 parts by weight of the total solid content of the undercoat layer. In the second embodiment it is preferred that the undercoat layer is directly provided on the support and the photosensitive layer is directly provided on the undercoat layer.

[Photosensitive Layer]

<(A) Initiator Compound>

The photosensitive layer according to the invention contains an initiator compound (hereinafter, also referred to as a polymerization initiator). In the invention, a radical polymerization initiator is preferably used.

As the initiator compound according to the invention, initiator compounds known to those skilled in the art can be used without limitation. Specifically, the initiator compound includes, for example, a trihalomethyl compound, a carbonyl compound, an organic peroxide, an axo compound, an azide compound, a metallocene compound, a hexaarylbiimidazole compound, an organic boron compound, a disulfone compound, an oxime ester compound, an onium salt compound and a iron arene complex. Among them, at least one compound selected from the hexaarylbiimidazole compound, onium salt compound, trihalomethyl compound and metallocene compound is preferable, and the hexaarylbiimidazole compound is particularly preferable. The polymerization initiators may be appropriately used in combination of two or more thereof.

The hexaarylbiimidazole compound includes, for example, lophine dimers described in JP-B-45-37377 (the term "JP-B" as used herein means an "examined Japanese patent publication") and JP-B-44-86516, specifically, 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole,
2,2'-bis(o-chlorophenyl)-4,4',5,5'-tetra(m-methoxyphenyl)biimidazole,
2,2'-bis(o,o'-dichlorophenyl)-4.4',5,5'-tetraphenylbiimidazole,
2,2'-bis(o-nitrophenyl)-4,4',5,5'-tetraphenylbiimidazole,
2,2'-bis(o-methylphenyl)-4,4',5,5'-tetraphenylbiimidazole and
2,2'-bis(o-trifluoromethylphenyl)-4,4',5,5'-tetraphenylbiimidazole.

The hexaarylbiimidazole compound is particularly preferably used together with a sensitizing dye having an absorption maximum in a wavelength range of 350 to 450 nm described hereinafter.

The onium salt preferably used in the invention includes a sulfonium salt, an iodonium salt and a diazonium salt. Particularly, a diaryliodonium salt and a triarylsulfonium salt are preferably used. The onium salt is particularly preferably used together with the infrared absorbing agent having an absorption maximum in a wavelength range of 750 to 1,400 nm.

In addition, polymerization initiators described in Paragraph Nos. [0071] to [0129] of JP-A-2007-206217 are preferably used.

The polymerization initiators are preferably used individually or in combination of two or more thereof according to the invention.

The amount of the polymerization initiator used in the photosensitive layer according to the invention is preferably from 0.01 to 20% by weight, more preferably from 0.1 to 15% by weight, still more preferably from 1.0 to 10% by weight, based on the total solid content of the photosensitive layer.

<(B) Polymerizable Compound>

The polymerizable compound for use in the photosensitive layer according to the invention is an addition-polymerizable compound having at least one ethylenically unsaturated double bond and it is selected from compounds having at least one, preferably two or more, terminal ethylenically unsaturated double bonds. The polymerizable compound has a chemical form, for example, a monomer, a prepolymer, specifically, a dimer, a trimer or an oligomer, or a mixture thereof. Examples of the monomer include unsaturated carboxylic acids (for example, acrylic acid, methacrylic acid, itaconic acid, crotonic acid, isocrotonic acid or maleic acid) and esters or amides thereof. Preferably, esters of an unsaturated carboxylic acid with a polyhydric alcohol compound and amides of an unsaturated carboxylic acid with a polyvalent amine compound are used. An addition reaction product of an unsaturated carboxylic acid ester or amide having a nucleophilic substituent, for example, a hydroxy group, an amino group or a mercapto group, with a monofunctional or polyfunctional isocyanate or epoxy compound, or a dehydration condensation reaction product of the unsaturated carboxylic acid ester or amide with a monofunctional or polyfunctional carboxylic acid is also preferably used. Moreover, an addition reaction product of an unsaturated carboxylic acid ester or amide having an electrophilic substituent, for example, an isocyanate group or an epoxy group with a monofunctional or polyfunctional alcohol, amine or thiol, or a substitution reaction product of an unsaturated carboxylic acid ester or amide having a releasable substituent, for example, a halogen atom or a tosyloxy group with a monofunctional or polyfunctional alcohol, amine or thiol is also preferably used, in addition, compounds in which the unsaturated carboxylic acid described above is replaced by an unsaturated phosphonic acid, styrene, vinyl ether or the like can also be used.

Specific examples of the monomer, which is an ester of a polyhydric alcohol compound with an unsaturated carboxylic acid, include, as an acrylic acid ester, for example, ethylene glycol diacrylate, 1,3-butanediol diacrylate, tetramethylene glycol diacrylate, propylene glycol diacrylate, trimethylolpropane triacrylate, hexanediol diacrylate, tetraethylene glycol diacrylate, pentaerythritol tetraacrylate, sorbitol triacrylate, isocyanuric acid ethylene oxide (EO) modified triacrylate and polyester acrylate oligomer. As a methacrylic acid ester, for example, tetramethylene glycol dimethacrylate, neopentyl glycol dimethacrylate, trimethylolpropane trimethacrylate, ethylene glycol dimethacrylate, pentaerythritol trimethacrylate, bis[p-(3-methacryloxy-2-hydroxypropoxy)phenyl]dimethylmethane and bis[p-(methacryloxyethoxy)phenyl]dimethylmethane are exemplified. Specific examples of the monomer, which is an amide of a polyvalent amine compound with an unsaturated carboxylic acid, include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide and xylylene bismethacrylamide.

Urethane type addition-polymerizable compounds produced using an addition reaction between an isocyanate and a hydroxy group are also preferably used and specific examples thereof include vinylurethane compounds having two or more polymerizable vinyl groups per molecule obtained by adding a vinyl monomer containing a hydroxy group represented by formula (A) shown below to a polyisocyanate compound having two or more isocyanate groups per molecule, described in JP-B-48-41708.

$$CH_2=C(R_4)COOCH_2CH(R_5)OH \quad (A)$$

wherein $R_4$ and $R_5$ each independently represents H or $CH_3$.

Also, a photo-oxidizable polymerizable compound described in JP-T-2007-506126 (the term "JP-T" as used herein means a published Japanese translation of a PCT patent application) is preferable and a polymerizable compound containing at least one urea group and/or tertiary amino group is particularly preferable. Specifically, the compound set forth below is exemplified.

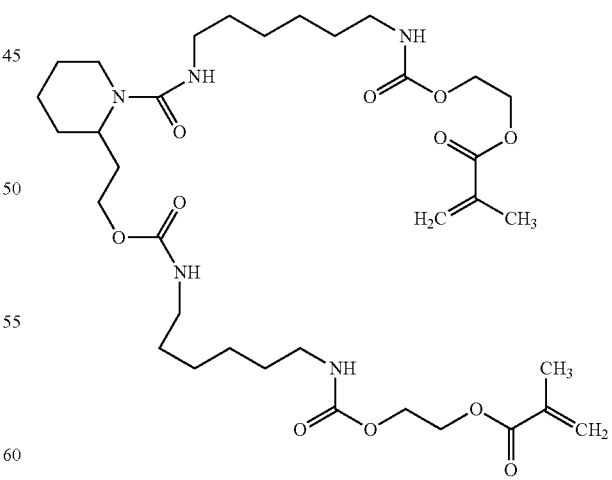

Also, urethane acrylates described in JP-A-51-37193, JP-B-2-32293 and JP-B-2-16765, and urethane compounds having an ethylene oxide skeleton described in JP-B-58-49860, JP-B-56-17654, JP-B-62-39417 and JP-B-62-39418 are preferably used.

Details of the method of using the polymerizable compound, for example, selection of the structure, individual or combination use or an amount added, can be appropriately determined in accordance with the characteristic design of the final lithographic printing plate precursor. The polymerizable compound is used preferably in a range of 5 to 75% by weight, more preferably in a range of 25 to 70% by weight, particularly preferably in a range of 30 to 60% by weight, based on the total solid content of the photosensitive layer.

<(C) Binder Polymer>

The photosensitive layer according to the invention contains a binder polymer. As the binder polymer, a polymer capable of holding the components of photosensitive layer on a support and capable of being removed by a developer is used. The binder polymer used includes a (meth)acrylic polymer, a polyurethane a polyvinyl alcohol resin, a polyvinyl butyral resin, a polyvinyl formal resin, a polyamide resin, a polyester resin and an epoxy resin. Particularly, a (meth)acrylic polymer, a vinyl copolymer, for example, a polyvinyl alcohol resin, a polyvinyl butyral resin or a polyvinyl formal resin and a polyurethane resin are preferably used.

The term "(meth)acrylic polymer" as used herein means a copolymer containing as a polymerization component, (meth)acrylic acid or a (meth)acrylic acid derivative, for example, a (meth)acrylate (including, for example, an alkyl ester, aryl ester and allyl ester), (meth)acrylamide or a (meth)acrylamide derivative. The term "polyurethane resin" as used herein means a polymer formed by a condensation reaction of a compound having two or more isocyanate groups and a compound having two or more hydroxy groups.

The term "polyvinyl butyral resin" as used herein means a polymer synthesized by a reaction (acetalization reaction) of polyvinyl alcohol obtained by partial or full saponification of polyvinyl acetate with butylaldehyde under an acidic condition and includes a polymer wherein an acid group or the like is introduced by a method of reacting the remaining hydroxy group with a compound having the acid group or the like.

One preferable example of the binder polymer according to the invention is a copolymer containing a repeating unit having an acid group. Examples of the acid group include a carboxylic acid group, a sulfonic acid group, a phosphonic acid group, a phosphoric acid group and a sulfonamido group. Particularly, a carboxylic acid group is preferable. As the repeating unit, a repeating unit derived from (meth)acrylic acid or a repeating unit represented by formula (I) shown below is preferably used.

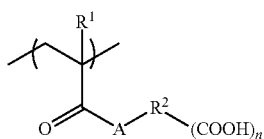

(I)

In formula (I), $R^1$ represents a hydrogen atom or a methyl group, $R^2$ represents a single bond or an n+1 valent connecting group, A represents an oxygen atom or $-NR^3-$, wherein $R^3$ represents a hydrogen atom or a monovalent hydrocarbon group having from 1 to 10 carbon atoms, and n represents an integer of 1 to 5.

The connecting group represented by $R^2$ in formula (I) is constructed from at least one of a carbon atom, a hydrogen atom, an oxygen atom, a nitrogen atom, a sulfur atom and a halogen atom and preferably contains from 1 to 80 atoms. Specific examples of the connecting group include an alkylene group, a substituted alkylene group, an arylene group and a substituted arylene group. The connecting group may have a structure wherein a plurality of such divalent groups is connected to each other via an amido bond or an ester bond. $R^2$ is preferably a single bond, an alkylene group or a substituted alkylene group, more preferably a single bond, an alkylene group having from 1 to 5 carbon atoms or a substituted alkylene group having from 1 to 5 carbon atoms, and most preferably a single bond, an alkylene group having from 1 to 3 carbon atoms or a substituted alkylene group having from 1 to 3 carbon atoms.

Examples of the substituent include a monovalent non-metallic atomic group exclusive of a hydrogen atom, for example, a halogen atom (e.g., $-F$, $-Br$, $-Cl$ or $-I$), a hydroxy group, an alkoxy group, an aryloxy group, a mercapto group, an acyl group, a carboxyl group and a conjugate base group thereof, an alkoxycarbonyl group, an aryloxycarbonyl group, a carbamoyl group, an aryl group, an alkenyl group and an alkynyl group.

$R^3$ is preferably a hydrogen atom or a hydrocarbon group having from 1 to 5 carbon atoms, more preferably a hydrogen atom or a hydrocarbon group having from 1 to 3 carbon atoms, and most preferably a hydrogen atom or a methyl group. n is preferably from 1 to 3, more preferably 1 or 2, and most preferably 1.

A ratio (% by mole) of the copolymerization component having a carboxylic acid group in the total copolymerization components of the binder polymer is preferably from 1 to 70% in view of developing property. Considering good compatibility between the developing property and printing durability, it is more preferably from 1 to 50%, and particularly preferably from 1 to 30%.

Further, a polyvinyl butyral resin having an acid group introduced, for example, as a resin represented by formula (II) shown below is also preferably used.

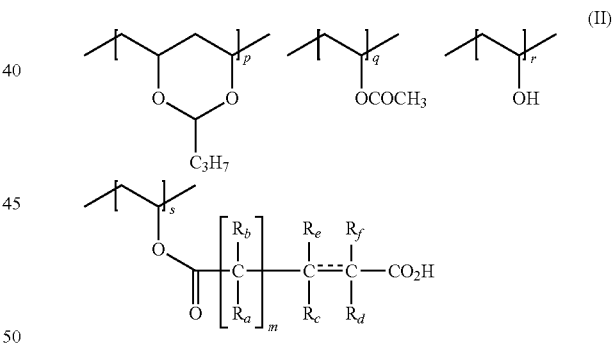

(II)

In formula (II), a ratio of each repeating unit p/q/r/s is preferably in a range from 50 to 78% by mole/from 1 to 5% by mole/from 5 to 28% by mole/from 5 to 20% by mole. $R_a$, $R_b$, $R_c$, $R_d$, $R_e$ and $R_f$ each independently represents a monovalent substituent which may have a substituent or a single bond, and m represents 0 or 1. Preferable examples of the substituent represented by any one of $R_a$, $R_b$, $R_c$, $R_d$, $R_e$ and $R_f$ include a hydrogen atom, an alkyl group which may have a substituent, a halogen atom and an aryl group which may have a substituent. More preferable examples thereof include a hydrogen atom, a straight-chain alkyl group, for example, a methyl group, an ethyl group or a propyl group, an alkyl group substituted with a carboxylic acid, a halogen atom, a phenyl group and a phenyl group substituted with a carboxylic acid. $R_c$ and $R_d$ or $R_e$ and $R_f$ may form a ring structure. The bond between the carbon atom to which $R_c$ and $R_e$ connect and the carbon atom to which $R_d$ and $R_f$ connect is a single bond, a double bond or an aromatic double bond and in the case of the double bond or aromatic double bond, $R_c$ and $R_d$, $R_e$ and $R_f$, $R_c$ and $R_f$ or $R_e$ and $R_d$ are connected with each other to from a single bond.

Preferable specific examples of the repeating unit having a carboxylic acid group are set forth below.

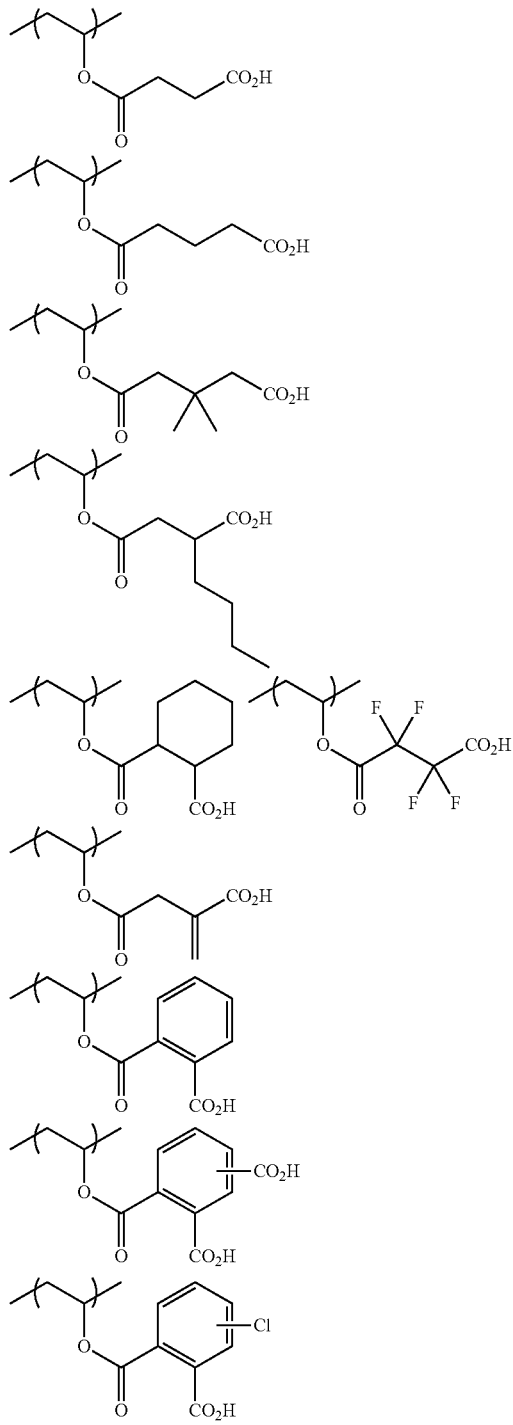

Moreover, an acid group of a polymer having an acid group which is a preferable example of the binder polymer according to the invention may be neutralized with a basic compound. Particularly, it is preferable to be neutralized with a compound having a basic nitrogen atom, for example, an amino group, an amidine group or a guanidine group. It is also preferred that the compound having a basic nitrogen atom has an ethylenically unsaturated group. Specific examples of the compound include compounds described in WO 2007/057442.

It is preferred that the binder polymer for use in the invention further contains a crosslinkable group. The term "crosslinkable group" as used herein means a group capable of crosslinking the binder polymer in the process of a radical polymerization reaction which is caused in the photosensitive layer, when the lithographic printing plate precursor is exposed to light. The crosslinkable group is not particularly restricted as long as it has such a function and includes, for example, an ethylenically unsaturated bonding group, an amino group or an epoxy group as a functional group capable of undergoing an addition polymerization reaction. Also, a functional group capable of forming a radical upon irradiation with light may be used and such a crosslinkable group includes, for example, a thiol group and a halogen atom. Among them, the ethylenically unsaturated bonding group is preferable. The ethylenically unsaturated bonding group preferably includes a styryl group, a (meth)acryloyl group and an allyl group.

In the binder polymer, for example, a free radical (a polymerization initiating radical or a propagating radical in the process of polymerization of the polymerizable compound) is added to the crosslinkable functional group to cause an addition-polymerization between the polymers directly or through a polymerization chain of the polymerizable compound, as a result, crosslinking is formed between the polymer molecules to effect curing. Alternatively, an atom (for example, a hydrogen atom on the carbon atom adjacent to the functional crosslinkable group) in the polymer is withdrawn, by a free radical to produce a polymer radical and the polymer radicals combine with each other to form crosslinking between the polymer molecules to effect curing.

The content of the crosslinkable group (content of radical-polymerizable unsaturated double bond determined by iodine titration) in the binder polymer is preferably from 0.01 to 10.0 mmol, more preferably from 0.05 to 5.0 mmol, and most preferably from 0.1 to 2.0 mmol, per g of the binder polymer.

The binder polymer for use in the invention may contain a polymerization unit of alkyl(meth)acrylate or aralkyl(meth)acrylate besides the polymerization unit having an acid group and the polymerization unit having a crosslinkable group. The alkyl group in the alkyl(meth)acrylate is preferably an alkyl group having from 1 to 5 carbon atoms and more preferably a methyl group. The aralkyl(meth)acrylate includes, for example, benzyl(meth)acrylate.

The binder polymer preferably has a weight average molecular weight of 5,000 or more, more preferably from 10,000 to 300,000, and a number average molecular weight of 1,000 or more, more preferably from 2,000 to 250,000. The polydispersity (weight average molecular weight/number average molecular weight) is preferably from 1.1 to 10.

The binder polymers may be used individually or in combination of two or more thereof. The content of the binder polymer is preferably from 5 to 75% by weight, more preferably from 10 to 70% by weight, still more preferably from 10 to 60% by weight, based on the total solid content of the photosensitive layer, from the standpoint of good strength of the image area and good image-forming property.

The total content of the polymerizable compound and the binder polymer is preferably 80% by weight or less based on the total solid content of the photosensitive layer. When it exceeds 80% by weight, decrease in the sensitivity and deterioration in the developing property may be caused sometimes. The total content is more preferably from 35 to 75% by weight.

According to the invention, by controlling a ratio of the polymerizable compound and the binder polymer contained in the photosensitive layer of the lithographic printing plate precursor, the permeability of developer into the photosensitive layer more increases and the developing property is further improved. Specifically, a weight ration of polymerizable compound/binder polymer in the photosensitive layer is preferably 1.2 or more, more preferably from 1.25 to 4.5, and most preferably from 2 to 4.

<Sensitizing Dye>

The photosensitive layer according to the invention preferably contains a sensitizing dye. The sensitizing dye can be used without particular limitation as far as it absorbs light at the image exposure to form the excited state and provides energy to the polymerization initiator described hereinbefore with electron transfer, energy transfer or heat generation thereby improving the polymerization initiation function. Particularly, a sensitizing dye having an absorption maximum in a wavelength range of 350 to 450 nm or 750 to 1,400 nm is preferably used.

Examples of the sensitizing dye having an absorption maximum in a wavelength range of 350 to 450 nm include merocyanine dyes, benzopyranes, coumarins, aromatic ketones and anthracenes.

Of the sensitizing dyes having an absorption maximum in a wavelength range of 350 to 450 nm, a dye represented by formula (IX) shown below is more preferable in view of high sensitivity.

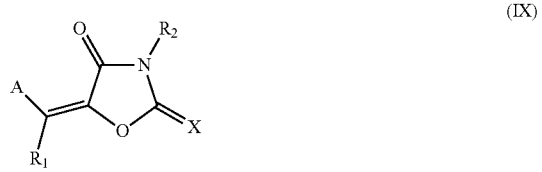

(IX)

In formula (IX), A represents an aromatic cyclic group which may have a substituent or a heterocyclic group which may have a substituent, X represents an oxygen atom, a sulfur atom or $=N(R_3)$, and $R_1$, $R_2$ and $R_3$ each independently represents a monovalent non-metallic atomic group, or A and $R_1$ or $R_2$ and $R_3$ may be combined with each other to form an aliphatic or aromatic ring.

The formula (IX) will be described in more detail below. $R_1$, $R_2$ and $R_3$ each independently represents a monovalent non-metallic atomic group, preferably a substituted or unsubstituted alkyl group, a substituted or unsubstituted alkenyl group, a substituted or unsubstituted aryl group, a substituted or unsubstituted aromatic heterocyclic residue, a substituted or unsubstituted alkoxy group, a substituted or unsubstituted alkylthio group, a hydroxy group or a halogen atom.

Now, A in formula (IX) is described below. A represents an aromatic cyclic group which may have a substituent or a heterocyclic group which may have a substituent. The aromatic cyclic group which may have a substituent and heterocyclic group which may have a substituent are same as the substituted or unsubstituted aryl group and substituted or unsubstituted aromatic heterocyclic residue described for any one of $R_1$, $R_2$ and $R_3$ in formula (IX), respectively.

Specific examples of the sensitizing dye include compounds described in Paragraph Nos. [0047] to [0053] of JP-A-2007-58170.

Further, a sensitizing dye represented by formula (V) or (VI) shown below can also be used.

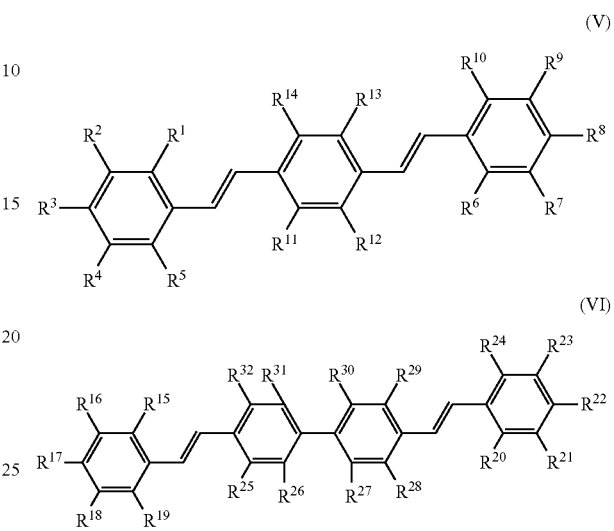

In formula (V), $R^1$ to $R^{14}$ each independently represents a hydrogen atom, an alkyl group, an alkoxy group, a cyano group or a halogen atom, provided that at least one of $R^1$ to $R^{10}$ represents an alkoxy group having 2 or more carbon atoms.

In formula (VI), $R^{15}$ to $R^{32}$ each independently represents a hydrogen atom, an alkyl group, an alkoxy group, a cyano group or a halogen atom, provided that at least one of $R^{15}$ to $R^{24}$ represents an alkoxy group having 2 or more carbon atoms.

As specific examples of the sensitizing dye described above, compounds described in EP-A-1349006 and WO 2005/029187 are preferably used.

Further, sensitizing dyes described in JP-A-2007-171406, JP-A-2007-206216, JP-A-2007-206217, JP-A-2007-225701, JP-A-2007-225702, JP-A-2007-316582 and JP-A-2007-328243 are also preferably used.

Next, the sensitizing dye having an absorption maximum in a wavelength range of 750 to 1,400 (hereinafter, also referred to as an "infrared absorbing agent") preferably used in the invention is described in detail below. The infrared absorbing agent used is preferably a dye or pigment.

As the dye, commercially available dyes and known dyes described in literatures, for example, Senryo Binran (Dye Handbook) compiled by The Society of Synthetic Organic Chemistry, Japan (1970) can be used. Specifically, the dyes includes azo dyes, metal complex azo dyes, pyrazolone azo dyes, naphthoquinone dyes, anthraquinone dyes, phthalocyanine dyes, carbonium dyes, quinoneimine dyes, methine dyes, cyanine dyes, squarylium dyes, pyrylium salts and metal thiolate complexes.

Of the dyes, cyanine dyes, squarylium dyes, pyrylium dyes, nickel thiolate complexes and indolenine cyanine dyes are particularly preferred. Further, cyanine dyes and indolenine cyanine dyes are more preferred. As particularly preferable examples of the dye, cyanine dyes represented by formula (a) shown below are exemplified.

Formula (a)

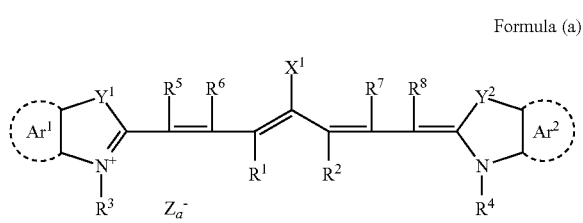

In formula (a), $X^1$ represents a hydrogen atom, a halogen atom, $-NPh_2$, $X^2-L^1$ or a group shown below. $X^2$ represents an oxygen atom, a nitrogen atom or a sulfur atom, $L^1$ represents a hydrocarbon group having from 1 to 12 carbon atoms, an aromatic cyclic group containing a hetero atom (a nitrogen atom, a sulfur atom, an oxygen atom, a halogen atom or a selenium atom) or a hydrocarbon group having from 1 to 12 carbon atoms and containing a hetero atom. $Xa^-$ has the same meaning as $Za^-$ defined hereinafter. $R^a$ represents a hydrogen atom or a substituent selected from an alkyl group, an aryl group, a substituted or unsubstituted amino group and a halogen atom.

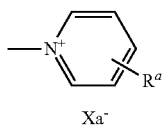

$R^1$ and $R^2$ each independently represents a hydrocarbon group having from 1 to 12 carbon atoms. In view of the preservation stability of a coating solution for photosensitive layer, it is preferred that $R^1$ and $R^2$ each represents a hydrocarbon group having two or more carbon atoms. It is also preferred that $R^1$ and $R^2$ are combined with each other to form a ring which is preferably a 5-membered or 6-membered ring.

$Ar^1$ and $Ar^2$, which may be the same or different, each represents an aromatic hydrocarbon group which may have a substituent. Preferable examples of the aromatic hydrocarbon group include a benzene ring group and a naphthalene ring group. Preferable examples of the substituent include a hydrocarbon group having 12 or less carbon atoms, a halogen atom and an alkoxy group having 12 or less carbon atoms. $Y^1$ and $Y^2$, which may be the same or different, each represents a sulfur atom or a dialkylmethylene group having 12 or less carbon atoms. $R^3$ and $R^4$, which may be the same or different, each represents a hydrocarbon group having 20 or less carbon atoms, which may have a substituent. Preferable examples of the substituent include an alkoxy group having 12 or less carbon atoms, a carboxyl group and a sulfo group. $R^5$, $R^6$, $R^7$ and $R^8$, which may be the same or different, each represents a hydrogen atom or a hydrocarbon group having 12 or less carbon atoms. In view of the availability of raw materials, a hydrogen atom is preferred. $Za^-$ represents a counter anion. However, $Za^-$ is not necessary when the cyanine dye represented by formula (a) has an anionic substituent in the structure thereof and neutralization of charge is not needed. Preferable examples of the counter ion for $Za^-$ include a halide ion, a perchlorate ion, a tetrafluoroborate ion, a hexafluorophosphate ion and a sulfonate ion, and particularly preferable examples thereof include a perchlorate ion, a hexafluorophosphate ion and an arylsulfonate ion in view of the preservation stability of a coating solution for photosensitive layer.

Specific examples of the cyanine dye represented by formula (a), which can be preferably used in the invention, include those described in Paragraph Nos. [0017] to [0019] of JP-A-2001-133969.

Further, other particularly preferable examples include specific indolenine cyanine dyes described in JP-A-2002-278057.

Examples of the pigment for use in the invention include commercially available pigments and pigments described in Colour Index (C.I.), Saishin Ganryo Binran (Handbook of the Newest Pigments) compiled by Pigment Technology Society of Japan (1977), Saishin Ganryo Oyou Gijutsu (Newest Application on Technologies for Pigments), CMC Publishing Co., Ltd. (1986) and Insatsu Ink Gijutsu (Printing Ink Technology), CMC Publishing Co., Ltd. (1984).

The amount of the sensitizing dye added is preferably from 0.05 to 30 parts by weight, more preferably from 0.1 to 20 parts by weight, most preferably from 0.2 to 10 parts by weight, per 100 parts by weight of the total solid content of the photosensitive layer.

<Other Components of Photosensitive Layer>

The photosensitive layer preferably further contains a chain transfer agent. As the chain transfer agent, for example, compounds having SH, PH, SiH or GeH in their molecules are used. The compound donates hydrogen, to a low active radical species to generate a radical or is oxidized and deprotonized to generate a radical.

In particular, a thiol compound (for example, a 2-mercaptobenzimidazole, a 2-mercaptobenzothiazole, a 2-mercaptobenzoxazole, a 3-mercaptotriazole or a 5-mercaptotetrazole) is preferably used as the chain transfer agent in the photosensitive layer.

Into the photosensitive layer, various additives can be further incorporated, if desired. Examples of the additive include a surfactant for progressing the developing property and improving the surface state of coated layer, a microcapsule for providing good compatibility between developing property and printing durability, a hydrophilic polymer for improving the developing property and dispersion stability of microcapsule, an oil-sensitizing agent for improving ink receptive property, a coloring agent or print-out agent for visually distinguishing the image area from the non-image area, a polymerization inhibitor for preventing undesirable thermal polymerization of the radical polymerizable compound during the production and preservation of the photosensitive layer, a higher fatty acid derivative for avoiding polymerization inhibition due to oxygen, a fine inorganic particle for increasing strength of the cured layer in the image area, a hydrophilic low molecular weight compound for improving the developing property, a co-sensitizer or chain transfer agent for increasing sensitivity, and a plasticizer for improving plasticity. As the additives, known compounds are used and, for example, compounds described in Paragraph Nos. [0161] to [0215] of JP-A-2007-206217 are used.

It is preferred that an unexposed area of the photosensitive layer can be removed by supplying a developer having pH of 2 to 11 after image exposure. Such a photosensitive layer can be constructed by appropriately adjusting at least one of the kinds and amounts of the respective components of the photosensitive layer.

It is also preferred that an unexposed area of the photosensitive layer can be removed by supplying at least one of printing ink and dampening water (fountain solution) on a printing machine after image exposure. Such a photosensitive layer can be constructed by appropriately adjusting at least one of the kinds and amounts of the respective components of the photosensitive layer.

<Formation of Photosensitive Layer>

The photosensitive layer according to the invention is formed by dispersing or dissolving each of the necessary constituting components described above in a solvent to prepare a coating solution and coating the solution. The solvent used include, for example, methyl ethyl ketone, ethylene glycol monomethyl ether, 1-methoxy-2-propanol, 2-methoxyethyl acetate, 1-methoxy-2-propyl acetate and γ-butyrolactone, but the invention should not be construed as being limited thereto. The solvents may be used individually or as a mixture. The solid content concentration of the coating solution is preferably from 1 to 50% by weight.

The coating amount (solid content) of the photosensitive layer on the support after the coating and drying is preferably from 0.3 to 3.0 $g/m^2$. Various methods can be used for the coating. Examples of the method include bar coater coating, spin coating, spray coating, curtain coating, dip coating, air knife coating, blade coating and roll coating.

<Protective Layer>

In the lithographic printing plate precursor according to the invention, a protective layer (oxygen-blocking layer) is preferably provided on the photosensitive layer in order to prevent diffusion and penetration of oxygen which inhibits the polymerization reaction at the time of exposure. As a hinder for the protective layer, for example, a water-soluble polymer compound relatively excellent in crystallizability is preferably used. Specifically, when polyvinyl alcohol is used as a main component, the best results can be obtained in the fundamental characteristics, for example, oxygen-blocking property and removability by development.

Polyvinyl alcohol for use in the protective layer may be partially substituted with ester, ether or acetal as long as it contains unsubstituted vinyl alcohol units for achieving the necessary oxygen-blocking property and water solubility. Also, polyvinyl alcohol may partly have other copolymer component. Polyvinyl alcohol is obtained by hydrolysis of polyvinyl acetate. As specific examples of the polyvinyl alcohol, those having a hydrolysis degree of 71 to 100% and a polymerization repeating unit number of 300 to 2,400 are exemplified. Specific examples thereof include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8 (produced by Kuraray Co., Ltd.). They can be used individually or as a mixture. According to a preferable embodiment, the content of polyvinyl alcohol in the protective layer is from 20 to 95% by weight, and more preferably from 30 to 90% by weight.

Also, known modified polyvinyl alcohol can be preferably used. Particularly, an acid-modified polyvinyl alcohol having a carboxylic acid group or a sulfonic acid group is preferably used. As a component used as a mixture with polyvinyl alcohol, polyvinyl pyrrolidone or a modified product thereof is preferable from the viewpoint of the oxygen-blocking property and removability by development. The content thereof is ordinarily from 3.5 to 80% by weight, preferably from 10 to 60% by weight, more preferably from 15 to 30% by weight, in the protective layer.

As other component of the protective layer, glycerin dipropylene glycol or the like can be added in an amount corresponding to several % by weight of the binder to provide flexibility. Further, an anionic surfactant, for example, sodium alkylsulfate or sodium alkylsulfonate, an amphoteric surfactant, for example, alkylaminocarboxylate and alkylaminodicarboxylate, or a nonionic surfactant, for example, polyoxyethylene alkyl phenyl ether can be added in an amount corresponding to several % by weight of the binder.

Further, it is also preferred to incorporate an inorganic stratiform compound described in Paragraph Nos. [0018] to [0024] of JP-A-2006-106700 into the protective layer of the lithographic printing plate precursor according to the invention for the purpose of improving the oxygen-blocking property and property for protecting the surface of photosensitive layer. Of the inorganic stratiform compounds, fluorine based swellable synthetic mica, which is a synthetic inorganic stratiform compound, is particularly useful.

The coating amount of the protective layer is preferably in a range of 0.05 to 10 $g/m^2$ in terms of the coating amount after drying. When the protective layer contains the inorganic stratiform compound, it is more preferably in a range of 0.1 to 5 $g/m^2$, and when the protective layer does not contain the inorganic stratiform compound, it is more preferably in a range of 0.5 to 5 $g/m^2$.

[Support]

The support for use in the lithographic printing plate precursor according to the invention is not particularly restricted as long as it is a dimensionally stable plate-like hydrophilic support. Particularly, an aluminum plate is preferable. In advance of the use of an aluminum plate, the aluminum plate is preferably subjected to a surface treatment, for example, roughening treatment or anodizing treatment. The roughening treatment of the surface of the aluminum plate is conducted by various methods and includes, for example, mechanical roughening treatment, electrochemical roughening treatment (roughening treatment of electrochemically dissolving the surface) and chemical roughening treatment (roughening treatment of chemically dissolving the surface selectively). With respect to the treatments, methods described in Paragraph Nos. [0241] to [0245] of JP-2007-206217 are preferably used.

The center line average roughness of support is preferably from 0.10 to 1.2 μm. In the range described above, good adhesion property to the photosensitive layer, good printing durability and good resistance to stain are achieved.

The color density of the support is preferably from 0.15 to 0.65 in terms of the reflection density value. In the range described above, good image-forming property by preventing halation at the image exposure and good aptitude for plate inspection after development are achieved.

The thickness of the support is preferably from 0.1 to 0.6 mm, more preferably from 0.15 to 0.4 mm, and still more preferably from 0.2 to 0.3 mm.

[Hydrophilizing Treatment of Support and Undercoat Layer]

As for the lithographic printing plate precursor according to the invention, in order to increase hydrophilicity of the non-image area and to prevent printing stain, it is preferred to conduct hydrophilizing treatment of the surface of support or to provide an undercoat layer between the support and the photosensitive layer.

The hydrophilizing treatment of the surface of support includes an alkali metal silicate treatment wherein the support is subjected to an immersion treatment or an electrolytic treatment in an aqueous solution, for example, of sodium silicate, a method of treating with potassium fluorozirconate and a method of treating with polyvinylphosphonic acid. An immersion treatment in an aqueous polyvinylphosphonic acid solution is preferably used.

When the lithographic printing plate precursor according to the invention has an undercoat layer as described in the second embodiment, the undercoat layer contains the specific polymer compound. The content of the specific polymer compound in the undercoat layer is described hereinbefore. The undercoat layer may further contain a compound other than the specific polymer compound. As the other compound, a silane coupling agent having an addition polymerizable ethylenic double bond reactive group described in JP-A-10-282679 and a phosphorus compound having an ethylenic double bond reactive group described in JP-A-2-304441 are preferably exemplified. As the particularly preferable compound, a compound having a polymerizable group, for example, a methacryl group or an allyl group and a support adsorbing group, for example, a sulfonic acid group, a phosphoric acid group or a phosphoric acid ester group is exemplified. A compound having a hydrophilicity-imparting group, for example, an ethylene oxide group in addition to the polymerizable group and support adsorbing group is also exemplified as a preferable compound.

The undercoat layer can be provided by a method where a solution prepared by dissolving the compound described above in water, an organic solvent, for example, methanol, ethanol or methyl ethyl ketone or a mixed solvent thereof is coating on a support and dried or a method where a support is immersed in a solution prepared by dissolving the compound described above in water, an organic solvent, for example, methanol, ethanol or methyl ethyl ketone or a mixed solvent thereof to adsorb the compound on the support, washed, for example, with water and dried. In the former method, the solution of the compound having concentration of 0.005 to 10% by weight is coated according to known various methods. Any method, for example, bar coater coating, spin coating, spray coating or curtain coating can be used. In the latter method, the concentration of the solution is ordinarily from 0.01 to 20% by weight, and preferably from 0.05 to 5% by weight, the temperature of the immersion is ordinarily from 20 to 90° C., and preferably from 25 to 50° C., and the time for the immersion is ordinarily from 0.1 second to 20 minutes, and preferably from 2 seconds to 1 minute.

The coating amount (solid content) of the undercoat layer is preferably from 0.1 to 100 mg/m$^2$, and more preferably from 1 to 30 mg/m$^2$.

[Backcoat Layer]

After applying the surface treatment to the support or forming the undercoat layer on the support, a backcoat layer can be provided on the back surface of the support, if desired.

The backcoat layer preferably includes, for example, a coating layer comprising an organic polymer compound described in JP-A-5-45885 and a coating layer comprising a metal oxide obtained by hydrolysis and polycondensation of an organic metal compound or an inorganic metal compound described in JP-A-6-35174. Among them, use of an alkoxy compound of silicon, for example, $Si(OCH_3)_4$, $Si(OC_2H_5)_4$, $Si(OC_3H_7)_4$ or $Si(OC_4H_9)_4$ is preferred since the starting material is inexpensive and easily available.

[Plate Making Method]

The lithographic printing plate precursor according to the invention is exposed imagewise and then subjected to development processing to prepare a lithographic printing plate.

The development processing includes (1) a method of developing with an alkali developer (having pH higher than 11), (2) a method of developing with a developer having pH of 2 to 11, and (3) a method of developing (on-press development) by supplying dampening water and/or ink on a printing machine. According to the invention, (2) the method of developing with a developer having pH of 2 to 11 or (3) the method of developing (on-press development) by supplying dampening water and/or ink on a printing machine is preferable.

Specifically, the lithographic printing plate precursor according to the invention is subjected to the development processing with the developer having pH of 2 to 11 to remove together a protective layer and the unexposed area of the photosensitive layer so that the resulting lithographic printing plate can be immediately mounted on a printing machine to perform printing. According to a conventional developing process using an alkali developer as the method (1), a protective layer is re-moved in a pre-water washing step, the alkali development is conducted, the alkali is removed by washing with water in a post-water washing step, gun solution treatment is conducted and drying is conducted in a drying step. According to the invention, the developer preferably contains a surfactant or a water-soluble polymer compound and the development and gum solution treatment are preferably conducted at the same time. Therefore, the post-water washing step is not particularly necessary, and after conducting the development and gum solution treatment with one solution, the drying step is preferably performed. Moreover, the pre-water washing step is also not particularly necessary and the removal of protective layer is also preferably conducted simultaneously with the development and gum solution treatment. It is preferred that after the development and gum treatment the excess developer is removed using a squeeze roller, followed by conducting drying. The development of the lithographic printing plate precursor according to the invention is performed at temperature ordinarily from 0 to 60° C., preferably from about 15 to about 40° C., using, for example, a method wherein the exposed lithographic printing plate precursor is immersed in the developer and rubbed with a brush or a method wherein the developer is splayed to the exposed lithographic printing plate precursor and the exposed lithographic printing plate precursor is rubbed with a brush.

The developer for use in the method (2) is an aqueous solution having pH of 2 to 11. It is preferably an aqueous solution containing water as a main component (containing 60% by weight or more of water). In particular, an aqueous solution containing a surfactant (for example, an anionic, nonionic, cationic or amphoteric surfactant) or an aqueous solution containing a water-soluble polymer compound is preferable. An aqueous solution containing both the surfactant and the water-soluble polymer compound is also preferable. The pH of the developer is more preferably from 5 to 10.7, still more preferably from 6 to 10.5, and most preferably from 7.5 to 10.3.

The anionic surfactant for use in the developer according to the invention is not particularly limited and include fatty acid salts, abietic acid salts, hydroxyalkanesulfonic acid salts, alkanesulfonic acid salts, dialkylsulfosuccinic acid salts, straight-chain alkylbenzenesulfonic acid salts, branched alkylbenzenesulfonic acid salts, alkylnaphthalenesulfonic acid salts, alkyldiphenylether (di)sulfonic acid salts, alkylphenoxy polyoxyethylene propylsulfonic acid salts, polyoxyethylene alkylsulfophenyl ether salts, N-methyl-N-oleoyltaurine sodium salt, N-alkylsulfosuccinic acid monoamide disodium salts, petroleum sulfonic acid salts, sulfated castor oil, sulfated beef tallow oil, sulfate ester slats of fatty acid alkyl ester, alkyl sulfate ester salts, polyoxyethylene alkyl ether sulfate ester salts, fatty acid monoglyceride sulfate ester salts, polyoxyethylene alkyl phenyl ether sulfate ester salts, polyoxyethylene styryl phenyl ether sulfate ester salts, alkyl phosphate ester salts, polyoxyethylene alkyl ether phosphate ester salts, polyoxyethylene alkyl phenyl ether phosphate ester salts, partially saponified products of styrene-maleic anhydride copolymer, partially saponified products of olefin-maleic anhydride copolymer and naphthalene sulfonate formalin condensates. Of the compounds, alkylbenzenesulfonic acid salts, alkylnaphthalenesulfonic acid salts and alkyldiphenylether (di)sulfonic acid salts are particularly preferably used.

The cationic surfactant for use in the developer according to the invention is not particularly limited and conventionally known cationic surfactants can be used. Examples of the cationic surfactant include alkylamine salts, quaternary ammonium salts, alkylimidazolinium salts, polyoxyethylene alkyl amine salts and polyethylene polyamine derivatives.

The nonionic surfactant for use in the developer according to the invention is not particularly limited and include polyethylene glycol type higher alcohol ethylene oxide adducts, alkylphenol ethylene oxide adducts, alkylnaphthol ethylene oxide adducts, phenol ethylene oxide adducts, naphthol ethylene oxide adducts, fatty acid ethylene oxide adducts, polyhydric alcohol fatty acid ester ethylene oxide adducts, higher alkylamine ethylene oxide adducts, fatty acid amide ethylene oxide adducts, ethylene oxide addacts of fat, polypropylene glycol ethylene oxide adducts, dimethylsiloxane-ethylene oxide block copolymers, dimethylsiloxane-(propylene oxide-ethylene oxide) block copolymers, fatty acid esters of polyhydric alcohol type glycerol, fatty acid esters of pentaerythritol, fatty acid esters of sorbitol and sorbitan, fatty acid esters of sucrose, alkyl ethers of polyhydric alcohols and fatty acid amides of alkanolamines. Of the compounds, those having an aromatic ring and an ethylene oxide chain are preferable and alkyl-substituted or unsubstituted phenol ethylene oxide adducts and alkyl-substituted or unsubstituted naphthol ethylene oxide adducts are more preferable.

The amphoteric surfactant for use in the developer is not particularly limited and includes, for example, amine oxide type, for example, alkyldimethylamine oxide, betaine type, for example, alkyl betaine and amino acid type, for example, sodium salt of alkylamino fatty acid. In Particular, an alkyldimethylamine oxide which may have a substituent, an alkyl carboxy betaine which may have a substituent and an alkyl sulfo betaine which may have a substituent are preferably used. Specific examples of the compound are described, for example, in Paragraph Nos. [0255] to [0278] of JP-A-2008-203359 and Paragraph Nos. [0028] to [0052] of JP-A-2008-2008-276166. Specific examples of the more preferable compound include 2-alkyl-N-carboxymethyl-N-hydroxyethyl imidazolinium betaine, alkyldiaminoethylglycine hydrochloride, lauryldimethylaminoacetic acid betaine, N-lauric acid amidopropyldimethyl betaine and N-lauric acid amidopropyldimethylamine oxide.

Two or more of the surfactants may be used in combination. The content of the surfactant in the developer is preferably from 0.01 to 20% by weight, and more preferably from 0.1 to 10% by weight.

The water-soluble polymer compound for use in the developer according to the invention includes, for example, soybean polysaccharide, modified starch, gun arabic, dextrin, a cellulose derivative (for example, carboxymethyl cellulose, carboxyethyl cellulose or methyl cellulose) or a modified product thereof pllulan, polyvinyl alcohol or a derivative thereof, polyvinyl pyrrolidone, polyacrylamide, an acrylamide copolymer, a vinyl methyl ether/maleic anhydride copolymer, a vinyl acetate/maleic anhydride copolymer and a styrene/maleic anhydride copolymer.

As the soybean polysaccharide, known soybean polysaccharide can be used. For example, as a commercial product, Soyafive (trade name, produced by Fuji Oil Co., Ltd.) is available and various grade products can be used. The soybean polysaccharide preferably used is that having viscosity in a range of 10 to 100 mPa/sec in the 10% by weight aqueous solution thereof.

As the modified starch, known modified starch can be used. The modified starch can be prepared, for example, by a method wherein starch, for example, of corn, potato, tapioca, rice or wheat is decomposed, for example, with an acid or an enzyme to an extent that the number of glucose residue per molecule is from 5 to 30 and then oxypropylene is added thereto in an alkali.

Two or more of the water-soluble polymer compounds may be used in combination. The content of the water-soluble polymer compound in the developer is preferably from 0.1 to 20% by weight, and more preferably from 0.5 to 10% by weight.

Into the developer for use in the invention, a pH buffer agent may further be incorporated.

As the pH buffer agent used in the invention, a pH buffer agent exhibiting a pH buffer function at pH of 2 to 11 is used without particular restriction. In the invention, a weak alkaline buffer agent is preferably used and includes, for example, (a) a carbonate ion and a hydrogen carbonate ion, (b) a borate ion, (c) a water-soluble amine compound and an ion of the water-soluble amine compound, and combinations thereof. Specifically, for example, (a) a combination of a carbonate ion and a hydrogen carbonate ion, (1) a borate ion, or (c) a combination of a water-soluble amine compound and an ion of the water-soluble amine compound exhibits a pH buffer function in the developer to prevent fluctuation of the pH even when the developer is used for a long period of time. As a result, for example, the deterioration of developing property resulting from the fluctuation of pH and the occurrence of development scum are restrained. The combination of a carbonate ion and a hydrogen carbonate ion is particularly preferable.

In order for a carbonate ion and a hydrogen carbonate ion to be present in the developer, a carbonate and a hydrogen carbonate may be added to the developer or a carbonate ion and a hydrogen carbonate ion may be generated by adding a carbonate or a hydrogen carbonate to the developer and then adjusting the pH. The carbonate or hydrogen carbonate used is not particularly restricted and it is preferably an alkali metal salt thereof. Examples of the alkali metal include lithium, sodium and potassium and sodium is particularly preferable. The alkali metals may be used individually or in combination of two or more thereof.

When the combination of (a) a carbonate ion and a hydrogen carbonate ion is adopted as the pH buffer agent, the total amount of the carbonate ion and hydrogen carbonate ion is preferably from 0.05 to 5 mole/l, more preferably from 0.1 to 2 mole/l, particularly preferably from 0.2 to 1 mole/l, in the developer.

The developer according to the invention may contain an organic solvent. As the organic solvent to be contained, for example, an aliphatic hydrocarbon (e.g., hexane, heptane, and Isopar E, Isopar H and Isopar G (produced by Esso Chemical Co., Ltd.)), an aromatic hydrocarbon (e.g., toluene or xylene), a halogenated hydrocarbon (methylene dichloride, ethylene dichloride, trichlene or monochlorobenzene) or a polar solvent is exemplified. Examples of the polar solvent include an alcohol (e.g., methanol, ethanol, propanol, isopropanol, 1-butanol, 1-pentanol, 1-hexanol, 1-heptanol, 1-octanol, 2-octanol, 2-ethyl-1-hexanol, 1-nonanol, 1-decanol, benzyl alcohol, ethylene glycol monomethyl ether, 2-ethyoxyethanol, diethylene glycol monoethyl ether, diethylene glycol monohexyl ether, triethylene glycol monomethyl ether, propylene glycol monoethyl ether, propylene glycol monomethyl ether, polyethylene glycol monomethyl ether, polypropylene glycol, tetraethylene glycol, ethylene glycol monobutyl ether, ethylene glycol monobenzyl ether, ethylene glycol monophenyl ether, propylene glycol monophenyl ether, methyl phenyl carbinol, n-amyl alcohol or methylamyl alcohol), a ketone (e.g., acetone, methyl ethyl ketone, ethyl butyl ketone, methyl isobutyl ketone or cyclohexanone), an ester (e.g., ethyl acetate, propyl acetate, butyl acetate, amyl acetate, benzyl acetate, methyl lactate, butyl lactate, ethylene glycol monobutyl acetate, polyethylene glycol monomethyl ether acetate, diethylene glycol acetate, diethyl phthalate or butyl levulinate) and others (e.g., triethyl, phosphate, tricresyl phosphate, N-phenylethanolamine, N-phenyldiethanolamine, N-methyldiethanolamine, N-ethyldiethanolamine, 4-(2-hydroxyethyl)morpholine, N,N-dimethylacetamide or N-methylpyrolidone).

The organic solvents contained in the developer may be appropriately used in combination of two or more thereof.

Further, when the organic solvent is insoluble in water, it may be employed by being solubilized in water using a surfactant or the like. In the case where the developer contains an organic solvent, the concentration of the organic solvent is desirably less than 40% by weight in view of safety and inflammability.

The developer for use in the invention may contain a preservative, a chelating agent, a defoaming agent, an organic acid, an inorganic acid, an inorganic salt or the like in addition the components described above. Specifically, compounds described in Paragraph Nos. [0266] to [0270] of JP-A-2007-206217 are preferably used.

The developer described above can be used as a developer and a development replenisher for the exposed lithographic printing plate precursor and it is preferably applied to an automatic processor described hereinafter. In the case of conducting the development processing using an automatic processor, the processing solution becomes fatigued in accordance with the processing amount, and hence the processing ability may be restored using a replenisher or a fresh developer.

The development processing using the developer having pH of 2 to 11 according to the invention is preferably performed by an automatic processor equipped with a supplying means for the developer and a rubbing member. An automatic processor using a rotating brush roll as the rubbing member is particularly preferred. Further, the automatic processor is preferably provided with a means for removing the excess developer, for example, a squeeze roller or a drying means, for example, a hot air apparatus, subsequently to the development processing means.

In the invention, (3) the method of developing (on-press development) by supplying dampening water and ink on a printing machine is also preferable. The method is not particularly restricted and includes a method where the lithographic printing plate precursor is exposed with laser and then mounted on a printing machine without undergoing the development processing to perform printing and a method where the lithographic printing plate precursor is mounted on a printing machine, exposed with laser on the printing machine and subjected to printing without undergoing the development processing. After the imagewise exposure of the lithographic printing plate precursor with laser, when an aqueous component and oily ink are supplied to perform printing without undergoing a development processing step, for example, a wet development processing step, in the exposed area of the photosensitive layer, the photosensitive layer cured by the exposure forms the oily ink receptive area having the oleophilic surface. On the other hand, in the unexposed area, the uncured photosensitive layer is removed by dissolution or dispersion with the aqueous component and/or oily ink supplied to reveal the hydrophilic surface in the area. As a result, the aqueous component adheres on the revealed hydrophilic surface and the oily ink adheres to the exposed area of the photosensitive layer, whereby printing is initiated.

While either the aqueous component or oily ink may be supplied at first on the surface of exposed lithographic printing plate precursor, it is preferred to supply the oily ink at first in view of preventing the aqueous component from contamination with the component of the photosensitive layer removed. For the aqueous component and oily ink, dampening water and printing ink for conventional lithographic printing are used respectively.

Thus, the lithographic printing plate precursor is subjected to the on-press development on an offset printing machine and used as it is for printing a large number of sheets.

Further, in the plate making process of preparing a lithographic printing plate from the lithographic printing plate precursor according to the invention, the lithographic printing plate precursor may be heated its entire surface before or during the exposure or between the exposure and the development, if desired. By the heating, the image-forming reaction in the photosensitive layer is accelerated and advantages, for example, improvement in the sensitivity and printing durability and stabilization of the sensitivity are achieved. For the purpose of increasing the image strength and printing durability, it is also effective to perform entire after-heating or entire exposure of the image after the development. Ordinarily, the heating before the development is preferably performed under a mild condition of 150° C. or lower. When the temperature is too high, a problem may arise sometimes in that the unexposed area is also cured. On the other hand, the heating after the development can be performed using very strong conditions. Ordinarily, the heat treatment is carried out in a temperature range of 100 to 500° C. When the temperature is too low, a sufficient effect of strengthening the image may not be obtained, whereas when it is excessively high, problems of deterioration of the support and thermal decomposition of the image area may occur sometimes.

In advance of the above-described development processing, the lithographic printing plate precursor is imagewise exposed with laser through a transparent original having a line image, a halftone dot image or the like, or imagewise exposed, for example, by scanning of laser beam based on digital data.

The wavelength of the exposure light source is preferably from 350 to 450 nm or from 750 to 1,400 nm. In case of exposing with light of 350 to 450 nm, the lithographic printing plate precursor having a photosensitive layer containing a sensitizing dye having an absorption maximum in the wavelength range is used. In case of exposing with light of 750 to 1,400 nm, the lithographic printing plate precursor containing an infrared absorbing agent which is a sensitizing dye having an absorption maximum in the wavelength range is used. As the light source of 350 to 450 nm, a semiconductor laser is preferably used. As the light source of 750 to 1,400 nm, a solid laser or semiconductor laser emitting an infrared ray is preferably used. The exposure mechanism may be any of an internal drum system, an external drum system and a flat bed system.

EXAMPLES

Synthesis Example

Synthesis examples of the specific polymer compound are described below.

Synthesis Example 1

Synthesis of Specific Polymer Compound (1)

In a 200 ml flask equipped with a condenser and a stirrer were put 33.94 g of distilled water and 9.72 g of vinylphosphonic acid and the mixture was heated to 70° C. under nitrogen stream. To the mixture was dropwise added a solution containing 19.37 g of dimethyl(carboxylatemethyl)[2-(methacryloyloxy)ethyl]aluminum (GLBT, produced by Osaka Organic Chemical Industry Ltd.), 0.488 g of Polymerization initiator V-50 (produced by Wako Pure Chemical Industries, Ltd.) and 33.94 g of distilled water over a period of 6 hours. After the completion of the dropwise addition, 0.488 g of Polymerization Initiator V-50 (produced by Wako Pure Chemical Industries, Ltd.) was added and the temperature was raised to 80° C., followed by stirring for 2 hours to obtain Specific polymer compound (1).

A weight average molecular weight of Specific polymer compound (1) thus-obtained was measured by a gel permeation chromatography (GPC) method using polyethylene glycol as a standard substance and found to be 20,000.

Synthesis Example 2

Synthesis of Specific Polymer Compound (9)

In a 200 ml flask equipped with a condenser and a stirrer were put 40.03 g of distilled water and 3.02 g of vinylphosphonic acid and the mixture was heated to 70° C. under nitrogen stream. To the mixture was dropwise added a solution containing 31.29 g of [2-(methacryloyloxy)ethyl]dimethyl-(3-sulfopropyl) ammonium (produced by Aldrich Co.), 0.38 g of Polymerization Initiator V-50 (produced by Wako Pure Chemical Industries, Ltd.) and 40.03 g of distilled water over a period of 6 hours. After the completion of the dropwise addition, 0.38 g of Polymerization Initiator V-50 (produced by Wako Pure Chemical Industries, Ltd.) was added and the temperature was raised to 80° C., followed by stirring for 2 hours to obtain Specific polymer compound (9).

A weight average molecular weight of Specific polymer compound (9) thus-obtained was measured by a gel permeation chromatography (GPC) method using polyethylene glycol as a standard substance and found to be 20,000.

Synthesis Example 3

Synthesis of Specific Polymer Compound (10)

In a 50 ml flask equipped with a condenser and a stirrer were put 11.76 g of distilled water and 2.70 g of vinylphosphonic acid and the mixture was heated to 70° C. under nitrogen stream. To the mixture was dropwise added a solution containing 7.38 g of 2-(methacryloyloxy)ethyl 2-(trimethylammonio)ethyl phosphate (produced by Tokyo Chemical Industry Co., Ltd.), 0.136 g of Polymerization Initiator V-50 (produced by Wako Pure Chemical Industries, Ltd.) and 11.76 g of distilled water over a period of 6 hours. After the completion of the dropwise addition, 0.136 g of Polymerization Initiator V-50 (produced by Wako Pure Chemical Industries, Ltd.) was added and the temperature was raised to 80° C., followed by stirring for 2 hours to obtain Specific polymer compound (10).

A weight average molecular weight of Specific polymer compound (10) thus-obtained was measured by a gel permeation chromatography (GPC) method using polyethylene glycol as a standard substance and found to be 15,000.

Specific polymer compounds (2) to (8) and (11) to (13) were synthesized in the same manner as in Synthesis Examples 1 to 3 above except for using respective monomers corresponding to the repeating units constituting the polymer compounds.

Examples 1 to 34 and Comparative Examples 1 to 4

1. Lithographic Printing Plate Precursor of Simple Processing Type (1) Preparation of Lithographic Printing Plate Precursor
[Preparation of Aluminum Support 1]

An aluminum plate (material: JIS A 1050) having a thickness of 0.3 mm was subjected to a degreasing treatment at 50° C. for 30 seconds using a 10% by weight aqueous sodium aluminate solution in order to remove rolling oil on the surface thereof and then grained the surface thereof using three nylon brushes embedded with bundles of nylon bristle having a diameter of 0.3 mm and an aqueous suspension (specific gravity: 1.1 g/cm$^3$) of pumice having a median size of 25 μm, followed by thorough washing with water. The plate was subjected to etching by immersing in a 25% by weight aqueous sodium hydroxide solution of 45° C. for 9 seconds, washed with water, then immersed in a 20% by weight aqueous nitric acid solution at 60° C. for 20 seconds, and washed with water. The etching amount of the grained surface was about 3 g/m$^2$.

Then, using an alternating current of 60 Hz, an electrochemical roughening treatment was continuously carried out on the plate. The electrolytic solution used was a 1% by weight aqueous nitric acid solution (containing 0.5% by weight of aluminum ion) and the temperature of electrolytic solution was 50° C. The electrochemical roughening treatment was conducted using an alternating current source, which provides a rectangular alternating current having a trapezoidal waveform such that the time TP necessary for the current value to reach the peak from zero was 0.8 msec and the duty ratio was 1:1, and using a carbon electrode as a counter electrode. A ferrite was used as an auxiliary anode. The current density was 30 A/dm$^2$ in terms of the peak value of the electric current and 5% of the electric current flowing from the electric source was divided to the auxiliary anode. The quantity of electricity in the nitric acid electrolysis was 175 C/dm$^2$ in terms of the quantity of electricity when the aluminum plate functioned as an anode. The plate was then washed with water by spraying.

The plate was further subjected to an electrochemical roughening treatment in the same manner as in the nitric acid electrolysis above using as an electrolytic solution, a 0.5% by weight aqueous hydrochloric acid solution (containing 0.5% by weight of aluminum ion) having temperature of 50° C. and under the condition that the quantity of electricity was 50 C/dm$^2$ in terms of the quantity of electricity when the aluminum plate functioned as an anode. The plate was then washed with water by spraying.

The plate was then subjected to an anodizing treatment using as an electrolytic solution, a 15% by weight aqueous sulfuric acid solution (containing 0.5% by weight of aluminum ion) at a current density of 15 A/dm to form a direct current anodized film of 2.5 g/m$^2$, washed with water and dried to prepare Aluminum support 1.

The center line average roughness (Ra) of the support was measured using a stylus having a diameter of 2 μm and found to be 0.51 μm.

Coating solution 1 for undercoat layer having the composition shown below was coated on Aluminum support 1 obtained above and dried at 100° C. for one minute to prepare an undercoat layer. The coating amount of the solution for undercoat layer was 10 mg/m$^2$. For the comparative examples, Comparative polymer compounds (R-1) to (R-4) shown below were used.

<Coating Solution 1 for Undercoat Layer>

| | |
|---|---|
| Specific polymer compound or Comparative polymer compound shown in Table 7 | 0.50 g |
| Water | 500.00 g |

Comparative polymer compound

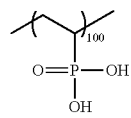
Mw: 11,000
(R-1)

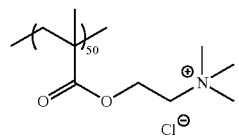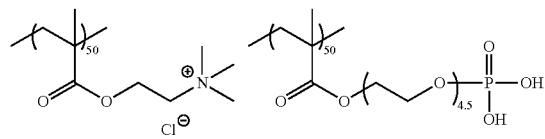
Mw: 20,000
(R-2)

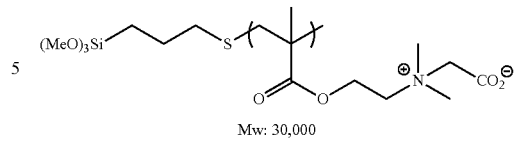
Mw: 30,000
(R-3)

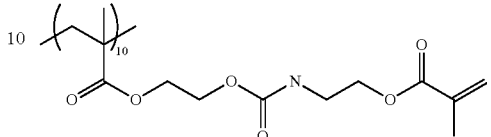

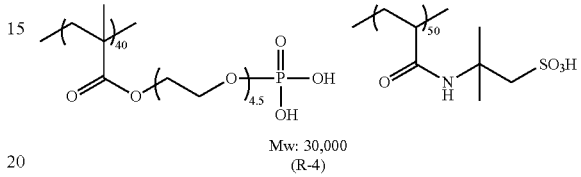
Mw: 30,000
(R-4)

Coating solution 1 for photosensitive layer having the composition shown below was coated on the undercoat layer so as to have a dry coating amount of 1.4 g/m² and dried at 100° C. for one minute to form a photosensitive layer.

<Coating Solution 1 for Photosensitive Layer>

| | |
|---|---|
| Compound containing ethylenic double bond (M-1) | 3.33 parts by weight |
| Binder Polymer (B-1) (Mw: 47,000) | 2.67 parts by weight |
| Sensitizing Dye (D-1) | 0.32 parts by weight |
| Polymerization initiator (1-1) | 0.61 parts by weight |
| Chain Transfer Agent (S-2) | 0.57 parts by weight |
| N-Nitrosophenylhydroxylamine aluminum salt | 0.020 part by weight |
| Dispersion of ε-phthalocyanine pigment [pigment: 15% by weight; dispersing agent (allyl methacrylate/methacrylic acid (80/20) copolymer (Mw: 60,000)): 10% by weight; solvent (cyclohexanone/methoxypropyl acetate/1-methoxy-2-propanol = 15% by weight/20% by weight/40% by weight)] | 0.71 parts by weight |
| Fluorine-based nonionic surfactant (Megafac F780F, produced by Dainippon Ink & Chemicals Inc.) | 0.016 part by weight |
| Methyl ethyl ketone | 47 parts by weight |
| Propylene glycol monomethyl ether | 45 parts by weight |

Mixture of the following compounds:

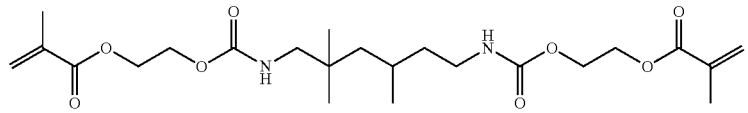 [SMILES: C=C(C)C(=O)OCCOC(=O)NCCC(C)CC(C)(C)CNC(=O)OCCOC(=O)C(=C)C]

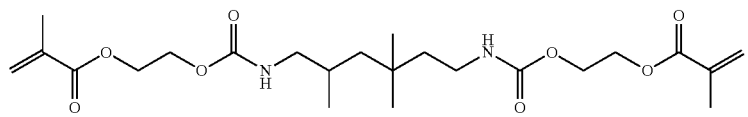

M-1

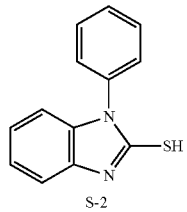

S-2

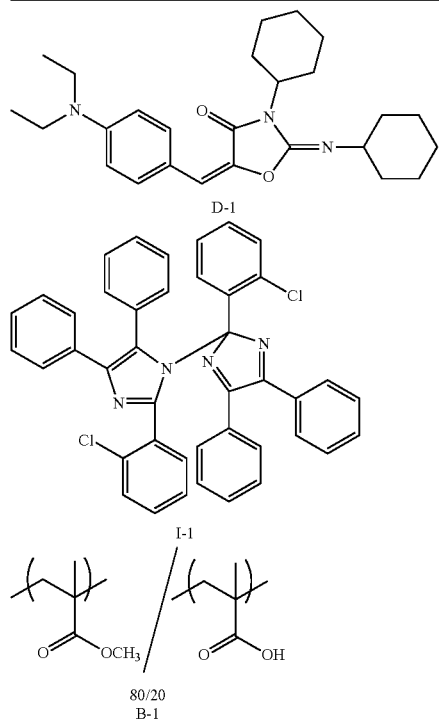

Coating solution 1 for protective layer having the composition shown below was coated on the photosensitive layer using a bar so as to have a dry coating amount of 0.50 g/m² and dried at 125° C. for 70 seconds to form a protective layer, thereby preparing a lithographic printing plate precursor.
<Coating Solution 1 for Protective Layer>

| | |
|---|---|
| Dispersion of mica shown below | 0.6 g |
| Sulfonic acid-modified polyvinyl alcohol [Goseran CKS-50, produced by Nippon Synthetic Chemical Industry Co., Ltd. (saponification degree: 99% by mole; average polymerization degree: 300; modification degree: about 0.4% by mole)] | 0.8 g |
| Surfactant (Emalex 710, produced by Nihon Emulsion Co., Ltd.) | 0.002 g |
| Water | 13. g |

(Preparation of Dispersion of Mica)

In 368 g of water was added 32 g of synthetic mica (SOMASIF ME-100, produced by CO-OP Chemical Co., Ltd.; aspect ratio: 1,000 or more) and the mixture was dispersed using a homogenizer until the average particle diameter (measured by a laser scattering method) became 0.5 μm to obtain dispersion of mica.

(2) Exposure, Development and Printing

Each of the lithographic printing plate precursors was subjected to image exposure by Violet semiconductor laser plate setter Vx9600 (having InGaN semiconductor laser (emission wavelength: 405 nm±10 nm/output: 30 mW)) produced by FUJIFILM Electronic Imaging Ltd. (FFEI). The image drawing was performed at resolution of 2,438 dpi using FM screen (TAFFETA 20, produced by Fuji Film Co. Ltd.) in a plate surface exposure amount of 0.05 mJ/cm² so as to have a halftone dot area rate of 50%.

The exposed lithographic printing plate precursor was subjected to preheating at 100° C. for 30 seconds and then subjected to development processing in an automatic development processor having a structure as shown in FIG. 1 using each developer having the composition shown below.

The automatic development processor comprises a developing unit 6 for developing a lithographic printing plate precursor (hereinafter, also referred to as a "PS plate") 4 and a drying unit 10 for drying the developed PS plate 4. An insertion slot is formed in a side plate of the automatic development processor (on the left side in FIG. 1) and the PS plate 4 inserted through the insertion slot is transported into the developing unit 6 by carrying-in rollers 16 provided inside the side plate of the automatic development processor. In a developing tank 20 of the developing unit 6, transport rollers 22, a brush roller 24 and squeeze rollers 26 are provided in order from the upstream side in the transporting direction and backup rollers 28 are disposed in appropriate positions therebetween. The PS plate 4 is immersed in the developer while being transported by the transport rollers 22 and the non-image area of PS plate 4 was removed by rotation of the brush roller 24 to conduct development processing. The PS plate 4 subjected to the development processing is transported into the drying unit 10 by the squeeze rollers (carrying-out rollers) 26.

In the drying unit 10, a guide roller 36 and a pair of skewer rollers 38 are disposed in order from the upstream side in the transporting direction. In the drying unit 10, drying means, for example, hot air supply means or heat generating means (not shown) is also provided. A discharge slot is provided in the drying unit 10 and the PS plate 4 dried by the drying means is discharged through the discharge slot, whereby the processing of PS plate by the automatic development processor is completed. The automatic development processor used in the example had one brush roller having an outer diameter of 50 mm and being implanted with fiber of polybutylene terephthalate (bristle diameter: 200 μm, bristle length: 17 mm), and the brush roller was rotated at 200 rpm (peripheral velocity at the tip of brush: 0.52 m/sec) in the same direction as the transporting direction of the lithographic printing plate precursor. The temperature of the developer was 30° C. The transportation of the lithographic printing plate precursor was conducted at transporting speed of 100 cm/min. After the development processing, the lithographic printing plate was dried in the drying unit. The drying temperature was 80° C.

The lithographic printing plate obtained was mounted on a printing machine (SOR-M, produced by Heidelberg) and printing was performed at a printing speed of 6,000 sheets per hour using dampening water (EU-3 (etching solution, produced by Fuji Film Co., Ltd.))/water/isopropyl alcohol=1/89/10 (by volume ratio)) and TRANS-G (N) black ink (produced by Dainippon Ink & Chemicals, Inc.).

(Developer)

The compositions of Developers 1 to 6 used in the examples and comparative examples are shown below. In the developers, Newcol B13 is polyoxyethylene β-naphthyl ether (average number of oxyethylene: n=13), produced by Nippon Nyukazai Co., Ltd.) and gum arabic used has a weight average molecular weight of 20000.

| Developer 1 (pH: 9.8) | |
|---|---|
| 0.2 M Aqueous boric acid solution | 25.00 parts by weight |
| 0.2 M Aqueous potassium chloride solution | 25.00 parts by weight |
| 0.1 M Aqueous sodium hydroxide solution | 40.60 parts by weight |
| Water | 9.40 parts by weight |
| Newcol B13 (produced by Nippon Nyukazai Co., Ltd.) | 5.00 parts by weight |
| Gum arabic | 2.50 parts by weight |
| Hydroxy-alkylated starch (Penon JE66, produced by Nippon Starch Chemical Co., Ltd.) | 7.00 parts by weight |
| Developer 2 (pH: 9.8) | |
| 0.2 M Aqueous glycine solution | 25.00 parts by weight |
| 0.2 M Aqueous sodium hydroxide solution | 13.60 parts by weight |
| Water | 62.4 parts by weight |
| Newcol B13 (produced by Nippon Nyukazai Co., Ltd.) | 5.00 parts by weight |
| Gum arabic | 2.50 parts by weight |
| Hydroxy-alkylated starch (Penon JE66, produced by Nippon Starch Chemical Co., Ltd.) | 7.00 parts by weight |
| Developer 3 (pH: 9.8) | |
| 0.1 M Aqueous sodium carbonate solution | 60.00 parts by weight |
| 0.1 M Aqueous sodium hydrogen carbonate solution | 40.00 parts by weight |
| Newcol B13 produced by Nippon Nyukazai Co., Ltd.) | 5.00 parts by weight |
| Gum arabic | 2.50 parts by weight |
| Hydroxy-alkylated starch (Penon JE66, produced by Nippon Starch Chemical Co., Ltd.) | 7.00 parts by weight |
| Developer 4 (pH: 9.8) | |
| 0.05 M Aqueous sodium carbonate solution | 50.00 parts by weight |
| 0.1 M Aqueous sodium hydroxide solution | 7.60 parts by weight |
| Water | 42.4 parts by weight |
| Newcol B13 (produced by Nippon Nyukazai Co., Ltd.) | 5.00 parts by weight |
| Gum arabic | 2.50 parts by weight |
| Hydroxy-alkylated starch (Penon JE66, produced by Nippon Starch Chemical Co., Ltd.) | 7.00 parts by weight |
| Developer 5 (pH: 9.8) | |
| 0.02 M Aqueous piperazine dichloride solution | 50.00 parts by weight |
| 0.02 M Aqueous glycidylglycine solution | 50.00 parts by weight |
| 1.0 M Aqueous sodium hydroxide solution | 2.59 parts by weight |
| Newcol B13 (produced by Nippon Nyukazai Co., Ltd.) | 5.00 parts by weight |
| Gum arabic | 2.50 parts by weight |
| Hydroxy-alkylated starch (Penon JE66, produced by Nippon Starch Chemical Co., Ltd.) | 7.00 parts by weight |
| Developer 6 (pH: 9.8) | |
| 0.2 M Aqueous diethanolamine solution | 25.00 parts by weight |
| 0.2 M Aqueous hydrochloric acid solution | 2.87 parts by weight |
| Water | 72.13 parts by weight |
| Newcol B13 (produced by Nippon Nyukazai Co., Ltd.) | 5.00 parts by weight |
| Gum arabic | 2.50 parts by weight |
| Hydroxy-alkylated starch (Penon JE66, produced by Nippon Starch Chemical Co., Ltd.) | 7.00 parts by weight |

(3) Evaluation

Printing durability, stain resistance, stain resistance after storage and developing property were evaluated in the following manner. The results obtained are shown in Table 7.

<Printing Durability>

As increase in the number of printing sheets, the photosensitive layer was gradually abraded to cause decrease in the ink receptivity, resulting in decrease of ink density on printing paper. With respect to the lithographic printing plate obtained by the exposure in the same exposure amount, a number of printed materials obtained until the ink density (reflection density) decreased by 0.1 from that at the initiation of printing was determined to evaluate the printing durability. The evaluation of printing durability is indicated as a relative printing durability defined as below using Comparative Example 1 as the criterion (1.0). As the value of relative printing durability increases, the printing durability is higher.

Relative printing durability=(Printing durability of subject lithographic printing plate)/(Printing durability of criterion lithographic printing plate)

<Stain Resistance>

The 20th sheet of the printed material from the initiation of printing was picked up and the density of ink adhered on the non-image area was measured to evaluate the stain resistance. The evaluation was visually conducted on a scale of 1 to 10. As the number increases, the stain resistance is better. Since it was not necessary the case that the adhesion of ink on the non-image area occurred uniform, the evaluation of stain resistance was conducted using the number of the visual observation. The number of the visual observation was used as a target for the evaluation as follows. 10: Area ratio of adhesion of ink on the non-image area was 0%. 9: Area ratio of adhesion of ink on the non-image area was 1 to 10%. 8: Area ratio of adhesion of ink on the non-image area was 111 to 20%. 7: Area ratio of adhesion of ink on the non-image area was 21 to 30%. 6: Area ratio of adhesion of ink on the non-image area was 31 to 40%. 5: Area ratio of adhesion of ink on the non-image area was 41 to 50%. 4: Area ratio of adhesion of ink on the non-image area was 51 to 60%. 3: Area ratio of adhesion of ink on the non-image area was 61 to 70%. 2: Area ratio of adhesion of ink on the non-image area was 71 to 80%. 1: Area ratio of adhesion of ink on the non-image area was 81 to 90%. 0: Area ratio of adhesion of ink on the non-image area was 91 to 100%.

<Stain Resistance after Storage>

The lithographic printing plate obtained was stored in a temperature and humidity controlled chamber set at temperature of 60° C. and relative humidity of 60% for 3 days or 4 days and then subjected to the printing in the same manner as described above. The 20th sheet of the printed material from the initiation of printing was picked up and the density of ink adhered on the non-image area was measured to evaluate the stain resistance. The evaluation was visually conducted on a scale of 1 to 10. The criteria of the visual observation were same as those described in the stain resistance described above. As the number increases, the stain resistance after storage is better.

<Developing Property>

With the lithographic printing plates obtained by performing the development while varying the transporting speed, cyan density of the non-image area was measured by a Macbeth densitometer. The transporting speed at which the cyan density of the non-image area became equivalent to cyan density of the aluminum support was determined and regarded as the developing property. The evaluation of developing property is indicated as a relative developing property defined as below using Comparative Example 1 as a criterion (1.0). As the value of relative developing property increases, the developing property is better and the performance is more preferable.

Relative developing property=(Transporting speed of subject lithographic printing plate precursor)/(Transporting speed of criterion lithographic printing plate precursor)

TABLE 7

|  | Specific Polymer Compound | Developer | Performance | | | | |
|---|---|---|---|---|---|---|---|
|  |  |  | Printing Durability | Stain Resistance | Stain Resistance after Storage | | Developing Property |
|  |  |  |  |  | 3 Days | 4 Days |  |
| Example 1 | (1) | 3 | 1.5 | 10 | 9 | 6 | 1.2 |
| Example 2 | (2) | 3 | 1.1 | 8 | 7 | 4 | 1.2 |
| Example 3 | (3) | 3 | 1.8 | 7 | 6 | 3 | 1.1 |
| Example 4 | (4) | 3 | 1.1 | 10 | 10 | 7 | 1.2 |
| Example 5 | (5) | 3 | 1.2 | 8 | 7 | 4 | 1.2 |
| Example 6 | (6) | 3 | 1.0 | 7 | 7 | 4 | 1.1 |
| Example 7 | (7) | 3 | 1.1 | 10 | 10 | 7 | 1.2 |
| Example 8 | (8) | 3 | 1.3 | 10 | 9 | 6 | 1.2 |
| Example 9 | (9) | 3 | 1.1 | 10 | 8 | 5 | 1.2 |
| Example 10 | (10) | 3 | 1.1 | 10 | 9 | 6 | 1.2 |
| Example 11 | (11) | 3 | 1.2 | 9 | 8 | 5 | 1.2 |
| Example 12 | (12) | 3 | 1.0 | 8 | 7 | 4 | 1.2 |
| Example 13 | (13) | 3 | 1.1 | 7 | 7 | 4 | 1.1 |
| Example 14 | (1) | 1 | 1.5 | 10 | 9 | 6 | 1.2 |
| Example 15 | (1) | 2 | 1.5 | 10 | 9 | 6 | 1.2 |
| Example 16 | (1) | 4 | 1.5 | 10 | 9 | 6 | 1.2 |
| Example 17 | (1) | 5 | 1.5 | 10 | 9 | 6 | 1.2 |
| Example 18 | (1) | 6 | 1.5 | 10 | 9 | 6 | 1.2 |
| Example 19 | (25) | 3 | 1.2 | 10 | 9 | 5 | 1.2 |
| Example 20 | (29) | 3 | 1.2 | 10 | 9 | 6 | 1.2 |
| Example 21 | (30) | 3 | 1.2 | 10 | 10 | 7 | 1.2 |
| Example 22 | (31) | 3 | 1.2 | 10 | 10 | 8 | 1.2 |
| Example 23 | (32) | 3 | 1.2 | 10 | 10 | 10 | 1.2 |
| Example 24 | (33) | 3 | 1.2 | 10 | 10 | 9 | 1.2 |
| Example 25 | (34) | 3 | 1.2 | 10 | 10 | 8 | 1.2 |
| Example 26 | (35) | 3 | 1.2 | 10 | 10 | 10 | 1.2 |
| Example 27 | (59) | 3 | 1.8 | 10 | 10 | 10 | 1.2 |
| Example 28 | (60) | 3 | 2.0 | 10 | 10 | 8 | 1.2 |
| Example 29 | (61) | 3 | 2.0 | 10 | 10 | 8 | 1.2 |
| Example 30 | (62) | 3 | 2.3 | 8 | 7 | 5 | 1.2 |
| Example 31 | (63) | 3 | 2.2 | 9 | 8 | 6 | 1.2 |
| Example 32 | (64) | 3 | 2.0 | 10 | 10 | 9 | 1.2 |
| Example 33 | (78) | 3 | 2.0 | 10 | 8 | 4 | 1.2 |
| Example 34 | (81) | 3 | 1.7 | 10 | 8 | 4 | 1.2 |
| Comparative Example 1 | (R-1) | 3 | 1.0 | 5 | 5 | 2 | 1.0 |
| Comparative Example 2 | (R-2) | 3 | 1.0 | 4 | 3 | 0 | 0.8 |
| Comparative Example 3 | (R-3) | 3 | 1.2 | 5 | 5 | 1 | 1.1 |
| Comparative Example 4 | (R-4) | 3 | 1.2 | 4 | 3 | 1 | 1.0 |

As is shown in Table 7, by incorporating the specific polymer compound into the undercoat layer, the stain resistance, stain resistance after storage and developing property can be improved while maintaining the excellent printing durability.

Examples 35 to 51 and Comparative Examples 5 to 8

2. Lithographic Printing Plate Precursor of Simple Processing Type 2

(1) Preparation of Lithographic Printing Plate Precursor
[Preparation of Aluminum Support 2]

An aluminum plate (material: 1050, refining: H16) having a thickness of 0.24 mm was immersed in an aqueous 5% by weight sodium hydroxide solution maintained at 65° C. to conduct a degreasing treatment for one minute, followed by washed with water. The degreased aluminum plate was immersed in an aqueous 10% by weight hydrochloric acid solution maintained at 25° C. for one minute to neutralize, followed by washed with water. Subsequently, the aluminum plate was subjected to an electrolytic surface-roughening treatment with alternating current under condition of current density of 100 A/dm$^2$ in an aqueous 0.3% by weight hydrochloric acid solution at 25° C. for 60 seconds and then subjected to a desmut treatment in an aqueous 5% by weight sodium hydroxide solution maintained at 60° C. for 10 seconds. The aluminum plate thus-treated was subjected to an anodizing treatment under condition of current density of 10 A/dm$^2$ and voltage of 15 V in an aqueous 15% by weight sulfuric acid solution at 25° C. for one minute and then subjected to a hydrophilization treatment using an aqueous 1% by weight polyvinyl phosphonic acid solution at 75° C. to prepare Aluminum support 2. The surface roughness of the support was measured and found to be 0.44 μm (Ra indication according to JIS B0601).

Coating solution 2 for undercoat layer having the composition shown below was coated on Aluminum support 2 obtained above and dried at 100° C. for one minute to form an undercoat layer. The coating amount of the undercoat layer formed was 10 mg/m$^2$.

<Coating Solution 2 for Undercoat Layer>

| | |
|---|---|
| Specific polymer compound or Comparative polymer compound shown in Table 8 | 0.50 g |
| Water | 500.00 g |

Coating solution 2 for photosensitive layer having the composition shown below was coated on the undercoat layer using a bar and dried in an oven at 90° C. for 60 seconds to form a photosensitive layer having a dry coating amount of 1.3 g/m$^2$.

<Coating Solution 2 for Photosensitive Layer>

| | |
|---|---|
| Binder Polymer (1) shown below (weight average molecular weight: 50,000) | 0.04 g |
| Binder Polymer (2) shown below (weight average molecular weight: 80,000) | 0.30 g |
| Polymerizable Compound (1) shown below (PLEX 6661-O, produced by Degussa Japan Co. Ltd.) | 0.17 g |
| Polymerizable Compound (2) shown below | 0.51 g |
| Sensitizing Dye (1) shown below | 0.03 g |
| Sensitizing Dye (2) shown below | 0.015 g |
| Sensitizing Dye (3) shown below | 0.015 g |
| Polymerization Initiator (I-1) shown above | 0.13 g |

-continued

| | |
|---|---|
| Chain Transfer Agent Mercaptobenzothiazole | 0.01 g |
| Dispersion of ε-phthalocyanine pigment (pigment: 15 parts by weight; dispersing agent (allyl methacrylate/methacrylic acid copolymer (weight average molecular weight: 60,000, copolymerization molar ratio: 83/17)): 10 parts by weight; cyclohexanone: 15 parts by weight) | 0.40 g |
| Thermal polymerization inhibitor N-nitrosophenylhydroxylamine aluminum salt | 0.01 g |
| Fluorine-Based Surfactant (1) shown below (weight average molecular weight: 10,000) | 0.001 g |
| 1-Methoxy-2-propanol | 3.5 g |
| Methyl ethyl ketone | 8.0 g |

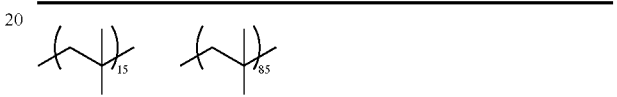

Binder Polymer (1) Acid value: 85 mg-KOH/g

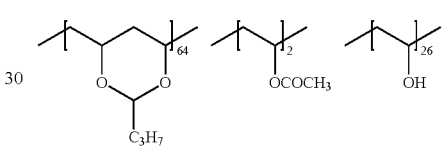

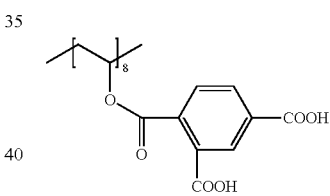

Binder Polymer (2) Acid value: 66 mg-KOH/g

A mixture of the following isomers:

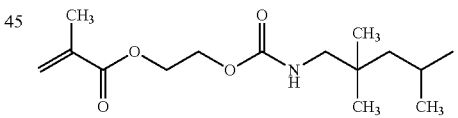

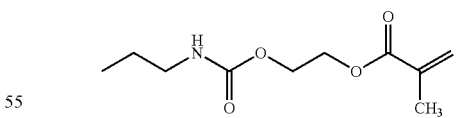

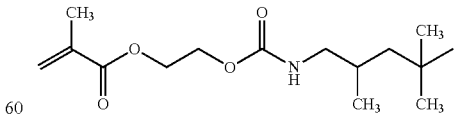

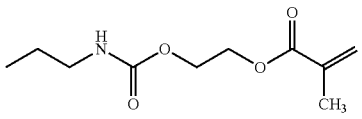

Polymerizable Compound (1)

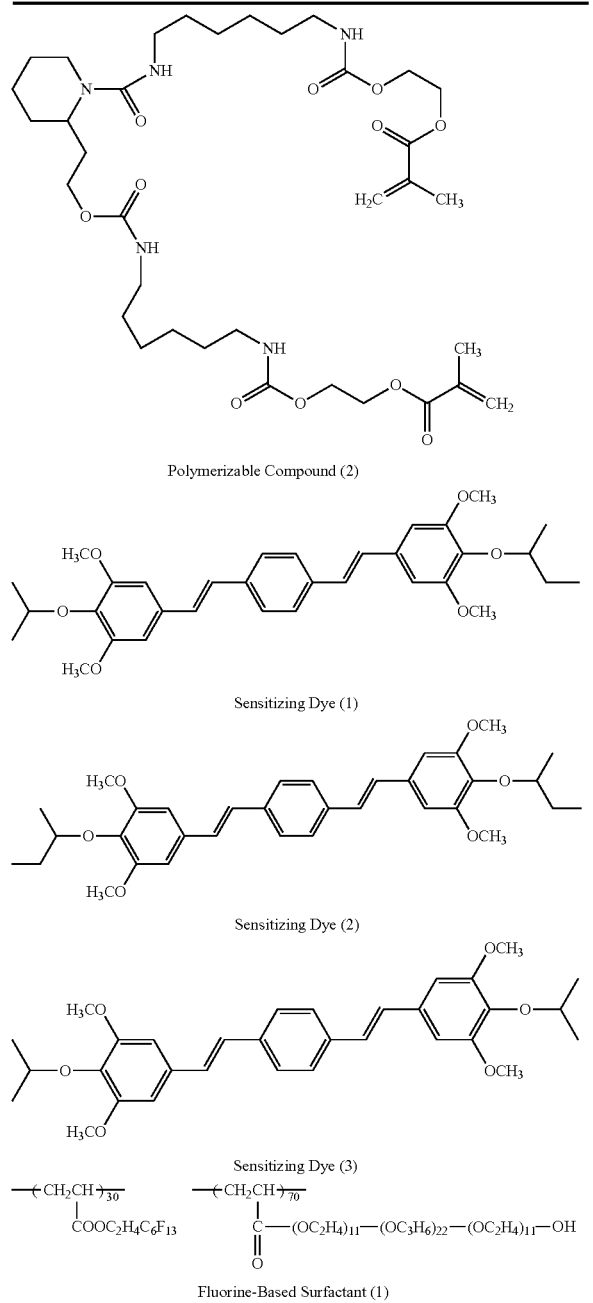

Polymerizable Compound (2)

Sensitizing Dye (1)

Sensitizing Dye (2)

Sensitizing Dye (3)

Fluorine-Based Surfactant (1)

Coating solution 2 for protective layer having the composition shown below was coated on the photosensitive layer using a bar so as to have a dry coating amount of 1.2 g/m² and dried at 125° C. for 70 seconds to from a protective layer, thereby preparing a lithographic printing plate precursor.
<Coating Solution 2 for Protective Layer>

| | |
|---|---|
| PVA-205 [partially hydrolyzed polyvinyl alcohol, produced by Kuraray Co., Ltd. (saponification degree: 86.5 to 89.5% by mole; viscosity: 4.6 to 5.4 mPa · s in a 4% by weight aqueous solution at 20° C.)] | 0.658 g |
| PVA-105 [fully hydrolyzed polyvinyl alcohol, produced by Kuraray Co., Ltd. (saponification degree: 98.0 to 99.0% by mole; viscosity: 5.2 to 6.0 mPa · s in a 4% by weight aqueous solution at 20° C.)] | 0.142 g |
| Vinyl pyrrolidone/vinyl acetate (1/1) copolymer (weight average molecular weight: 70,000) | 0.001 g |
| Surfactant (Emalex 710, produced by Nihon Emulsion Co., Ltd.) | 0.002 g |
| Water | 13 g |

(2) Exposure, Development and Printing

The lithographic printing plate precursor was subjected to image exposure by Violet semiconductor laser plate setter Vx9600 (having InGaN semiconductor laser:emission: 405 nm±10 nm/output:30 mW) produced by FUJIFILM Electronic Imaging, Ltd. As for the image, halftone dots of 50% were drawn using an FM screen (TAFFETA 20, produced by Fuji Film Co., Ltd.) in a plate surface exposure amount of 0.05 mJ/cm² and at resolution of 2,438 dpi.

The exposed lithographic printing plate precursor was subjected to preheating at 100° C. for 10 seconds and then subjected to development processing in an automatic development processor having a structure shown in FIG. 1 using Developer 7 having the composition shown below at transporting speed so as to have immersion time (developing time) in the developer of 20 seconds.

The lithographic printing plate after development was mounted on a printing machine (SOR-M, produced by Heidelberg) and printing was performed at a printing speed of 6,000 sheets per hour using dampening water (EU-3 (etching solution, produced by Fuji Film Co., Ltd.))/water/isopropyl alcohol 1/89/10 (by volume ratio)) and TRANS-G(N) black ink (produced by Dainippon Ink & Chemicals, Inc.).

| Developer 7 | |
|---|---|
| Water | 88.6 g |
| Nonionic Surfactant (W-1) shown below | 2.4 g |
| Nonionic Surfactant (W-2) shown below | 2.4 g |
| Nonionic surfactant (Emalex 710, produced by Nihon Emulsion Co., Ltd.) | 1.0 g |
| Phenoxypropanol | 1.0 g |
| Octanol | 0.6 g |
| N-(2-Hydroxyethyl)morpholine | 1.0 g |
| Triethanolamine | 0.5 g |
| Sodium gluconate | 1.0 g |
| Trisodium citrate | 0.5 g |
| Tetrasodium ethylenediaminetetraacetate | 0.05 g |
| Polystyrenesulfonic acid (Versa TL77 (30% solution) produced by Alco Chemical Inc.) | 1.0 g |
| (pH was adjusted to 7.0 by adding phosphoric acid) | |

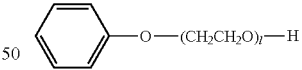

l = 13-28
Nonionic Surfactant (W-1)

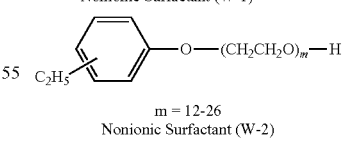

m = 12-26
Nonionic Surfactant (W-2)

(3) Evaluation

The printing durability, stain resistance, stain resistance after storage and developing property were evaluated in the same manner as in Example 1. The results obtained are shown in Table 8. The printing durability and developing property are indicated as the relative printing durability and relative developing property using Comparative Example 5 as a criterion (1.0), respectively.

TABLE 8

| | Specific Polymer Compound | Developer | Performance | | | | |
|---|---|---|---|---|---|---|---|
| | | | Printing Durability | Stain Resistance | Stain Resistance after Storage | | Developing Property |
| | | | | | 3 Days | 4 Days | |
| Example 35 | (1) | 7 | 1.6 | 9 | 8 | 5 | 1.2 |
| Example 36 | (2) | 7 | 1.2 | 7 | 6 | 3 | 1.2 |
| Example 37 | (3) | 7 | 1.9 | 6 | 5 | 2 | 1.1 |
| Example 38 | (4) | 7 | 1.2 | 9 | 9 | 5 | 1.2 |
| Example 39 | (5) | 7 | 1.3 | 7 | 6 | 3 | 1.2 |
| Example 40 | (6) | 7 | 1.1 | 6 | 6 | 3 | 1.1 |
| Example 41 | (7) | 7 | 1.2 | 9 | 8 | 5 | 1.2 |
| Example 42 | (8) | 7 | 1.4 | 9 | 8 | 5 | 1.2 |
| Example 43 | (9) | 7 | 1.2 | 9 | 7 | 4 | 1.2 |
| Example 44 | (10) | 7 | 1.2 | 9 | 8 | 5 | 1.2 |
| Example 45 | (11) | 7 | 1.2 | 8 | 7 | 4 | 1.2 |
| Example 46 | (12) | 7 | 1.0 | 7 | 6 | 3 | 1.2 |
| Example 47 | (13) | 7 | 1.1 | 6 | 6 | 3 | 1.1 |
| Example 48 | (31) | 7 | 1.3 | 10 | 9 | 6 | 1.2 |
| Example 49 | (32) | 7 | 1.3 | 10 | 9 | 8 | 1.2 |
| Example 50 | (59) | 7 | 1.9 | 10 | 9 | 7 | 1.2 |
| Example 51 | (64) | 7 | 2.3 | 10 | 9 | 6 | 1.2 |
| Comparative Example 5 | (R-1) | 7 | 1.0 | 4 | 4 | 1 | 1.0 |
| Comparative Example 6 | (R-2) | 7 | 1.0 | 3 | 3 | 0 | 0.8 |
| Comparative Example 7 | (R-3) | 7 | 1.2 | 4 | 4 | 1 | 1.1 |
| Comparative Example 8 | (R-4) | 7 | 1.1 | 3 | 3 | 1 | 1.0 |

As is shown in Table 8, by incorporating the specific polymer compound into the undercoat layer, the stain resistance, stain resistance after storage and developing property can be improved while maintaining the excellent printing durability.

Examples 52 to 68 and Comparative Examples 9 to 12

3. Lithographic Printing Plate Precursor of Simple Processing Type 3

(1) Preparation of Lithographic Printing Plate Precursor

Coating solution 3 for photosensitive layer having the composition shown below was coated on Aluminum support 1 described above so as to have a dry coating amount of 1.4 g/m² and dried at 100° C. for one minute to form a photosensitive layer. For the comparative examples, Comparative polymer compounds (R-1) to (R-4) shown above were used.

<Coating Solution 3 for Photosensitive Layer>

| | |
|---|---|
| Compound containing ethylenic double bond (M-1) shown above | 3.33 parts by weight |
| Binder Polymer (B-1) shown above (Mw: 47,000) | 2.67 parts by weight |
| Specific polymer compound or Comparative polymer compound shown in Table 9 | 0.11 parts by weight |
| Sensitizing Dye (D-1) shown above | 0.32 parts by weight |
| Polymerization Initiator (I-1) shown above | 0.61 parts by weight |
| Chain Transfer Agent (S-2) shown above | 0.57 parts by weight |
| N-Nitrosophenylhydroxylamine aluminum salt | 0.020 parts by weight |
| Dispersion of ε-phthalocyanine pigment [pigment: 15% by weight; dispersing agent (allyl methacrylate/methacrylic acid (80/20) copolymer (Mw: 60,000)): 10% by weight; solvent (cyclohexanone/methoxypropyl acetate/1-methoxy-2-propanol = 15% by weight/20% by weight/40% by weight)] | 0.71 parts by weight |
| Fluorine-based nonionic surfactant (Megafac F780F, produced by Dainippon Ink & Chemicals Inc.) | 0.016 parts by weight |
| Methyl ethyl ketone | 47 parts by weight |
| Propylene glycol monomethyl ether | 45 parts by weight |

Coating solution 1 for protective layer described above was coated on the photosensitive layer using a bar so as to have a dry coating amount of 0.50 g/m² and dried at 125° C. for 70 seconds to form a protective layer, thereby preparing a lithographic printing plate precursor.

(2) Exposure, Development and Printing

The exposure, development and printing were conducted in the same manner as in Example 1. Developer 3 shown above was used as the developer.

(3) Evaluation

The printing durability, stain resistance, stain resistance after storage and developing property were evaluated in the same manner as in Example 1. The results obtained are shown in Table 9. The printing durability and developing property are indicated as the relative printing durability and relative developing property using Comparative Example 9 as a criterion (1.0), respectively.

TABLE 9

|  | Specific Polymer Compound | Developer | Printing Durability | Stain Resistance | Stain Resistance after Storage 3 Days | Stain Resistance after Storage 4 Days | Developing Property |
|---|---|---|---|---|---|---|---|
| Example 52 | (1) | 3 | 1.6 | 9 | 9 | 6 | 1.2 |
| Example 53 | (2) | 3 | 1.2 | 7 | 7 | 4 | 1.2 |
| Example 54 | (3) | 3 | 1.9 | 6 | 6 | 3 | 1.1 |
| Example 55 | (4) | 3 | 1.2 | 9 | 10 | 7 | 1.2 |
| Example 56 | (5) | 3 | 1.3 | 7 | 7 | 4 | 1.2 |
| Example 57 | (6) | 3 | 1.1 | 6 | 7 | 4 | 1.1 |
| Example 58 | (7) | 3 | 1.2 | 9 | 9 | 6 | 1.2 |
| Example 59 | (8) | 3 | 1.4 | 9 | 9 | 6 | 1.2 |
| Example 60 | (9) | 3 | 1.2 | 9 | 8 | 5 | 1.2 |
| Example 61 | (10) | 3 | 1.2 | 9 | 9 | 6 | 1.2 |
| Example 62 | (11) | 3 | 1.2 | 8 | 8 | 5 | 1.2 |
| Example 63 | (12) | 3 | 1.0 | 7 | 7 | 4 | 1.2 |
| Example 64 | (13) | 3 | 1.1 | 6 | 7 | 4 | 1.1 |
| Example 65 | (31) | 3 | 1.3 | 10 | 10 | 7 | 1.2 |
| Example 66 | (32) | 3 | 1.3 | 10 | 10 | 9 | 1.2 |
| Example 67 | (59) | 3 | 1.9 | 10 | 10 | 8 | 1.2 |
| Example 68 | (64) | 3 | 2.3 | 10 | 10 | 7 | 1.2 |
| Comparative Example 9 | (R-1) | 3 | 1.0 | 4 | 4 | 2 | 1.0 |
| Comparative Example 10 | (R-2) | 3 | 1.0 | 3 | 3 | 0 | 0.8 |
| Comparative Example 11 | (R-3) | 3 | 1.2 | 4 | 4 | 1 | 1.1 |
| Comparative Example 12 | (R-4) | 3 | 1.1 | 3 | 3 | 1 | 1.0 |

As is shown in Table 9, by incorporating the specific polymer compound into the photosensitive layer being in contact with the support, the stain resistance, stain resistance after storage and developing property can be improved while maintaining the excellent printing durability.

Examples 69 to 97 and Comparative Examples 13 to 15

4. Lithographic Printing Plate Precursor of on-Press Development Type (1) Preparation of Lithographic Printing Plate Precursor
[Preparation of Aluminum Support 3]

In order to ensure the hydrophilicity of the non-image area, Aluminum support 1 described above was subjected to silicate treatment using a 1.5% by weight aqueous sodium silicate No. 3 solution at 70° C. for 12 seconds. The adhesion amount of Si was 6 mg/m². Subsequently, the support was washed with water to obtain Aluminum support 3. The center line average roughness (Ra) of the support was measured using a stylus having a diameter of 2 μm and found to be 0.51 μm.

Coating solution 3 for undercoat layer having the composition shown below was coated on Aluminum support 3 obtained above and dried at 100° C. for one minute to form an undercoat layer. The coating amount of the undercoat layer formed was 10 mg/m².

<Coating Solution 3 for Undercoat Layer>

| | |
|---|---|
| Specific polymer compound or Comparative polymer compound shown in Table 10 | 0.50 g |
| Water | 500.00 g |

[Formation of Photosensitive Layer]
Coating solution 4 for photosensitive layer was coated on the undercoat layer by a bar and dried in an oven at 100° C. for 60 seconds to form a photosensitive layer having a dry coating amount of 1.0 g/m². Coating solution 4 for photosensitive layer was prepared by mixing Photosensitive solution (1) shown below with Microgel solution (1) shown below just before the coating, followed by stirring.

<Photosensitive Solution (1)>

| | |
|---|---|
| Binder polymer (1) shown below | 0.162 g |
| Infrared absorbing agent (1) shown below | 0.030 g |
| Polymerizable initiator (1) shown below | 0.162 g |
| Polymerizable compound (Aronix M-215, produced by Toagosei Co., Ltd.) | 0.385 g |
| Pionin A-20 (produced by Takemoto Oil & Fat Co., Ltd.) | 0.055 g |
| Oil-sensitizing agent (1) shown below | 0.044 g |
| Fluorine-based surfactant (1) shown below | 0.008 g |
| Methyl ethyl ketone | 1.091 g |
| 1-Methoxy-2-propanol | 8.609 g |

<Microgel solution (1)>

| | |
|---|---|
| Microgel (1) shown below | 2.640 g |
| Distilled water | 2.425 g |

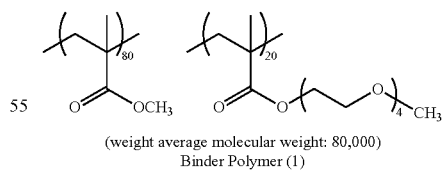

(weight average molecular weight: 80,000)
Binder Polymer (1)

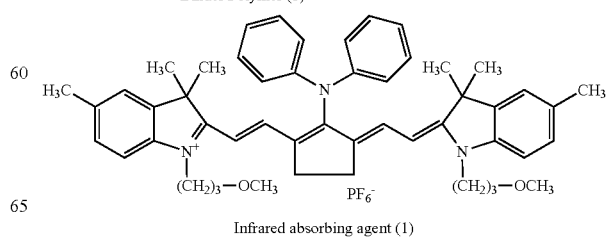

Infrared absorbing agent (1)

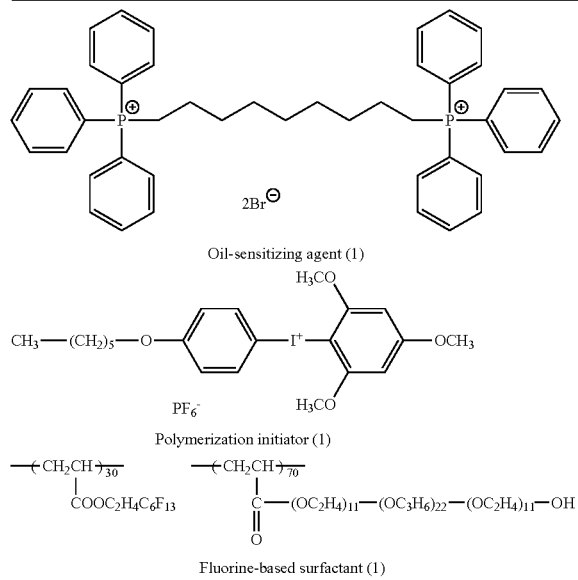

Oil-sensitizing agent (1)

Polymerization initiator (1)

Fluorine-based surfactant (1)

<Preparation of Microgel (1)>

An oil phase component was prepared by dissolving 10 g of adduct of trimethylol propane and xylene diisocyanate (Takenate D-110N, produced by Mitsui Takeda Chemical Co., Ltd.), 3.15 g of pentaerythritol triacrylate (SR444, produced by Nippon Kayaku Co., Ltd.) and 0.1 g of Pionin A-41C (produced by Takemoto Oil and Fat Co., Ltd.) in 17 g of ethyl acetate. As an aqueous phase component, 40 g of a 4% by weight aqueous solution of PVA-205 was prepared. The oil phase component and the aqueous phase component were mixed and the mixture was emulsified using a homogenizer at 12,000 rpm for 10 minutes. The resulting emulsion was added to 25 g of distilled water and stirred at room temperature for 30 minutes and then at 50° C. for 3 hours. The microgel liquid thus-obtained was diluted using distilled water so as to have the solid concentration of 15% by weight. The average particle size of the microgel was 0.2 μm.

Coating solution 3 for protective layer having the composition shown below was coated on the photosensitive layer by a bar and dried in an oven at 120° C. for 60 seconds to form a protective layer having a dry coating amount of 0.15 g/m², thereby preparing a lithographic printing plate precursor.

<Coating Solution 3 for Protective Layer>

| | |
|---|---|
| Dispersion of inorganic stratiform compound (1) shown below | 1.5 g |
| Aqueous 6% by weight solution of polyvinyl alcohol (CKS 50, sulfonic acid-modified, saponification degree: 99% by mole or more, polymerization degree: 300, produced by Nippon Synthetic Chemical Industry Co., Ltd.) | 0.55 g |
| Aqueous 6% by weight solution of polyvinyl alcohol (PVA-405, saponification degree: 81.5% by mole, polymerization degree: 500, produced by Kuraray Co., Ltd.) | 0.03 g |
| Aqueous 1% by weight solution of surfactant (Emalex 710, produced by Nihon Emulsion Co., Ltd. | 8.60 g |
| Ion-exchanged water | 6.0 g |

<Preparation of Dispersion of Inorganic Stratiform Compound (1)>

To 193.6 g of ion-exchanged water was added 6.4 g of synthetic mica (Somasif ME-100, produced by CO—OP Chemical Co., Ltd.) and the mixture was dispersed using a homogenizer until an average particle size (according to a laser scattering method) became 3 μm to prepare Dispersion of inorganic stratiform compound (1). The aspect ratio of the inorganic particle thus-dispersed was 100 or more.

(2) Evaluation

Each of the lithographic printing plate precursors thus-obtained was exposed by Luxel Platesetter T-6000III equipped with an infrared semiconductor laser, produced by Fuji Film Co., Ltd. under the conditions of a rotational number of external drum of 1,000 rpm, laser output of 70% and resolution of 2,400 dpi. The exposed image contained a solid image and a 50% halftone dot chart of a 20 μm-dot FM screen.

The exposed lithographic printing plate precursor was mounted without undergoing development processing on a plate cylinder of a printing machine (Lithrone 26, produced by Komori Corp.). Using dampening water (Ecolity-2 (produced by Fuji Film Co., Ltd.)/tap water=2/98 (volume ratio)) and Values-G (N) black ink (produced by Dainippon Ink & Chemicals, Inc.), the dampening water and ink were supplied according to the standard automatic printing start method of Lithrone 26 to perform on-press development, followed by printing on 100 sheets of Tokubishi art paper (76.5 kg) at a printing speed of 10,000 sheets per hour.

<On-Press Development Property>

A number of the printing papers required until the on-press development of the unexposed area of the photosensitive layer on the printing machine was completed to reach a state where the ink was not transferred to the printing paper in the non-image area was measured to evaluate the on-press development property. The results obtained are shown in Table 10.

<Printing Durability>

After performing the evaluation for the on-press development property, the printing was continued. As the increase in a number of printing papers, the photosensitive layer was gradually abraded to cause decrease in the ink density on the printing paper. A number of printing papers wherein a value obtained by measuring a halftone dot area rate of the 50% halftone dot of FM screen on the printing paper using a Gretag densitometer decreased by 5% from the value measured on the $100^{th}$ paper of the printing was determined to evaluate the printing durability. The evaluation of printing durability is indicated as a relative printing durability defined as below using Comparative Example 13 as the criterion (1.0). As the value of relative printing durability increases, the printing durability is higher.

Relative printing durability=(Printing durability of subject lithographic printing plate)/(Printing durability of criterion lithographic printing plate)

<Stain Resistance>

The 20th sheet of the printed material from the initiation of printing was picked up and the density of ink adhered on the non-image area was measured to evaluate the stain resistance. The evaluation was visually conducted on a scale of 1 to 10. As the number increases, the stain resistance is better. Since it was not necessary the case that the adhesion of ink on the non-image area occurred uniform, the evaluation of stain resistance was conducted using the number of the visual observation. The number of the visual observation was used as a target for the evaluation as follows. 10: Area ratio of adhesion of ink on the non-image area was 0%. 9: Area ratio of adhesion of ink on the non-image area was 1 to 10%. 8: Area ratio of adhesion of ink on the non-image area was 11 to 20%. 7: Area ratio of adhesion of ink on the non-image area was 21 to 30%. 6: Area ratio of adhesion of ink on the non-image area was 31 to 40%. 5: Area ratio of adhesion of ink on the non-image area was 41 to 50%. 4: Area ratio of adhesion of ink on the non-image area was 51 to 60%. 3: Area ratio of adhesion of ink on the non-image area was 61 to 70%. 2: Area ratio of adhesion of ink on the non-image area was 71 to 80%. 1: Area ratio of adhesion of ink on the non-image area was 81 to 90%. 0: Area ratio of adhesion of ink on the non-image area was 91 to 100%.

<Stain Resistance after Storage>

The lithographic printing plate obtained was stored in a temperature and humidity controlled chamber set at temperature of 60° C. and relative humidity of 60% for 3 days or 4 days and then subjected to the printing in the same manner as described above. The 20th sheet of the printed material from the initiation of printing was picked up and the density of ink adhered on the non-image area was measured to evaluate the stain resistance. The evaluation was visually conducted on a scale of 1 to 10. The criteria of the visual observation were same as those described in the stain resistance described above. As the number increases, the stain resistance after storage is better.

TABLE 10

|  | Specific Polymer Compound | Printing Durability | Stain Resistance | Stain Resistance after Storage | | On-Press Development Property (number of sheets) |
|---|---|---|---|---|---|---|
|  |  |  |  | 3 Days | 4 Days |  |
| Example 69 | (1) | 1.5 | 10 | 10 | 6 | 35 |
| Example 70 | (2) | 1.1 | 9 | 8 | 4 | 35 |
| Example 71 | (3) | 1.8 | 8 | 7 | 3 | 40 |
| Example 72 | (4) | 1.1 | 10 | 10 | 6 | 35 |
| Example 73 | (5) | 1.2 | 9 | 9 | 5 | 35 |
| Example 74 | (6) | 1.0 | 8 | 6 | 2 | 40 |
| Example 75 | (7) | 1.2 | 10 | 10 | 6 | 40 |
| Example 76 | (8) | 1.3 | 10 | 10 | 6 | 40 |
| Example 77 | (9) | 1.2 | 10 | 9 | 5 | 40 |
| Example 78 | (10) | 1.2 | 10 | 10 | 5 | 40 |
| Example 79 | (11) | 1.1 | 10 | 9 | 4 | 40 |
| Example 80 | (12) | 1.0 | 9 | 9 | 4 | 40 |
| Example 81 | (13) | 1.0 | 7 | 7 | 3 | 45 |
| Example 82 | (25) | 1.2 | 10 | 9 | 5 | 35 |
| Example 83 | (29) | 1.2 | 10 | 9 | 6 | 40 |
| Example 84 | (30) | 1.2 | 10 | 10 | 7 | 40 |
| Example 85 | (31) | 1.2 | 10 | 10 | 8 | 35 |
| Example 86 | (32) | 1.2 | 10 | 10 | 10 | 35 |
| Example 87 | (33) | 1.2 | 10 | 10 | 9 | 35 |
| Example 88 | (34) | 1.2 | 10 | 10 | 8 | 35 |
| Example 89 | (35) | 1.2 | 10 | 10 | 10 | 35 |
| Example 90 | (59) | 2.2 | 10 | 10 | 10 | 35 |
| Example 91 | (60) | 2.4 | 10 | 10 | 8 | 40 |
| Example 92 | (61) | 2.4 | 10 | 10 | 8 | 40 |
| Example 93 | (62) | 2.7 | 8 | 7 | 5 | 50 |
| Example 94 | (63) | 2.6 | 9 | 8 | 6 | 45 |
| Example 95 | (64) | 2.4 | 10 | 10 | 9 | 35 |
| Example 96 | (78) | 2.4 | 10 | 8 | 4 | 40 |
| Example 97 | (81) | 2.1 | 10 | 8 | 4 | 40 |
| Comparative Example 13 | (R-1) | 1.0 | 6 | 5 | 1 | 60 |
| Comparative Example 14 | (R-2) | 1.2 | 4 | 3 | 0 | 50 |
| Comparative Example 15 | (R-3) | 1.5 | 6 | 5 | 1 | 50 |

As is shown in Table 9, by incorporating the specific polymer compound into the undercoat layer, the stain resistance, stain resistance after storage and on-press development property can be improved while maintaining the excellent printing durability.

What is claimed is:

1. A lithographic printing plate precursor comprising a support and one or more layers, wherein one of the one or more layers is a photosensitive layer comprising an initiator compound, a polymerizable compound and a binder polymer, and a layer being in contact with the support of the one or more layers comprises a copolymer containing a repeating unit having a zwitterionic structure and a repeating unit having a structure capable of interacting with a surface of the support, wherein the zwitterionic structure is a structure represented by the following formula (i) or (ii):

-continued

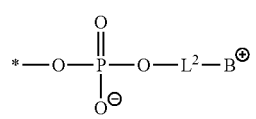

wherein $R^1$ and $R^2$ each independently represents a hydrogen atom or a substituent having from 1 to 30 carbon atoms, $L^1$ and $L^2$ each independently represents an organic connecting group, A represents a carboxylate or a sulfonate, B represents a substituent having a positive charge, and * represents a site connecting to a main chain or side chain of the copolymer;

wherein the structure capable of interacting with a surface of the support is a carboxylic acid structure, a carboxylate structure, a sulfonic acid structure, a sulfonate structure, a phosphonic acid structure, a phosphonate structure, a phosphoric acid ester structure or a phosphoric acid ester salt structure; and wherein the photosensitive layer is a layer different from the layer being in contact with the support.

2. The lithographic printing plate precursor as claimed in claim 1, wherein B represents an ammonium, a phosphonium, an iodonium or a sulfonium.

3. The lithographic printing plate precursor as claimed in claim 1, wherein the copolymer further contains a repeating unit having a radical polymerizable reactive group.

4. The lithographic printing plate precursor as claimed in claim 1, wherein the structure capable of interacting with a surface of the support is a phosphonic acid structure, a phosphonate structure, a phosphoric acid ester structure or a phosphoric acid ester salt structure.

5. The lithographic printing plate precursor as claimed in claim 1, which further comprises a protective layer so that the support, the photosensitive layer and the protective layer are provided in this order.

6. The lithographic printing plate precursor as claimed in claim 1, wherein an unexposed area of the photosensitive layer is capable of being removed with a developer having pH of 2 to 11 after image exposure.

7. The lithographic printing plate precursor as claimed in claim 1, wherein an unexposed area of the photosensitive layer is capable of being removed with at least one of printing ink and dampening water on a printing machine after image exposure.

8. A method of preparing a lithographic printing plate comprising: exposing imagewise the lithographic printing plate precursor as claimed in claim 1; and removing an unexposed area of the photosensitive layer of the exposed lithographic printing plate precursor with a developer having pH of 2 to 11.

9. A method of preparing a lithographic printing plate comprising: exposing imagewise the lithographic printing plate precursor as claimed in claim 1; and removing an unexposed area of the photosensitive layer of the exposed lithographic printing plate precursor with at least one of printing ink and dampening water on a printing machine.

10. The lithographic printing plate precursor as claimed in claim 1, wherein the zwitterionic structure is a structure represented by the following formula (i),

wherein $R^1$ and $R^2$ each independently represents a hydrogen atom or a substituent having from 1 to 30 carbon atoms, $L^1$ represents an organic connecting group, A represents a sulfonate, and * represents a site connecting to a main chain or side chain of the copolymer.

* * * * *